(12) United States Patent
Wakisaka et al.

(10) Patent No.: US 8,946,079 B2
(45) Date of Patent: Feb. 3, 2015

(54) SEMICONDUCTOR CONSTRUCT AND MANUFACTURING METHOD THEREOF AS WELL AS SEMICONDUCTOR DEVICE AND MANUFACTURING METHOD THEREOF

(71) Applicant: Tera Probe, Inc., Yokohama, Kanagawa (JP)

(72) Inventors: Shinji Wakisaka, Ome (JP); Takeshi Wakabayashi, Sayama (JP)

(73) Assignee: Tera Probe, Inc., Kanagawa (JP)

( * ) Notice: Subject to any disclaimer, the term of this patent is extended or adjusted under 35 U.S.C. 154(b) by 0 days.

(21) Appl. No.: 14/271,227

(22) Filed: May 6, 2014

(65) Prior Publication Data

US 2014/0239511 A1    Aug. 28, 2014

Related U.S. Application Data

(63) Continuation of application No. 13/960,485, filed on Aug. 6, 2013, now Pat. No. 8,754,525, which is a continuation of application No. 12/828,492, filed on Jul. 1, 2010, now Pat. No. 8,525,335.

(30) Foreign Application Priority Data

Jul. 3, 2009   (JP) .................................. 2009-158618
Jul. 3, 2009   (JP) .................................. 2009-158622
Jul. 3, 2009   (JP) .................................. 2009-158629

(51) Int. Cl.
*H01L 21/4763*   (2006.01)
*H01L 21/56*     (2006.01)
(Continued)

(52) U.S. Cl.
CPC .............. *H01L 23/50* (2013.01); *H01L 21/561* (2013.01); *H01L 21/6835* (2013.01);
(Continued)

(58) Field of Classification Search
CPC ........................ H01L 23/28; H01L 2924/0665
USPC ................. 438/396, 462, 612, 613, 642, 644; 257/621, 686, 698, 738, 774, E21.59, 257/E21.495, E21.507, E23.011, E23.021
See application file for complete search history.

(56) References Cited

U.S. PATENT DOCUMENTS 6,437,432 B2    8/2002   Ikumo et al.
6,611,419 B1    8/2003   Chakravorty
(Continued)

FOREIGN PATENT DOCUMENTS

CN     101091250 A     12/2007
JP     10-242332 A      9/1998
(Continued)

OTHER PUBLICATIONS

Japanese Office Action dated Sep. 1, 2011, issued in counterpart Japanese Application No. 2009-158622, and English translation thereof.

(Continued)

*Primary Examiner* — Dao H Nguyen
(74) *Attorney, Agent, or Firm* — Holtz, Holtz, Goodman & Chick PC

(57) ABSTRACT

A semiconductor construct includes a semiconductor substrate and connection pads provided on the semiconductor substrate. Some of the connection pads are connected to a common wiring and at least one of the remaining of the connection pads are connected to a wiring. The construct also includes a first columnar electrode provided to be connected to the common wiring and a second columnar electrode provided to be connected to a connection pad portion of the wiring.

17 Claims, 61 Drawing Sheets

(51) Int. Cl.
*H01L 23/50* (2006.01)
*H01L 21/683* (2006.01)
*H01L 23/538* (2006.01)
*H01L 23/00* (2006.01)
*H01L 23/28* (2006.01)
*H01L 23/31* (2006.01)
*H01L 23/498* (2006.01)
*H01L 23/525* (2006.01)

(52) U.S. Cl.
CPC ........... *H01L 23/5389* (2013.01); *H01L 24/19* (2013.01); *H01L 24/27* (2013.01); *H01L 24/83* (2013.01); *H01L 24/97* (2013.01); *H01L 24/29* (2013.01); *H01L 24/14* (2013.01); *H01L 23/28* (2013.01); *H01L 23/3114* (2013.01); *H01L 23/3128* (2013.01); *H01L 23/49838* (2013.01); *H01L 23/525* (2013.01); *H01L 24/28* (2013.01); *H01L 2224/04105* (2013.01); *H01L 2224/20* (2013.01); *H01L 2224/274* (2013.01); *H01L 2224/2919* (2013.01); *H01L 2224/73267* (2013.01); *H01L 2224/83191* (2013.01); *H01L 2224/83855* (2013.01); *H01L 2224/83856* (2013.01); *H01L 2224/92244* (2013.01); *H01L 2224/97* (2013.01); *H01L 2924/01013* (2013.01); *H01L 2924/01029* (2013.01); *H01L 2924/01033* (2013.01); *H01L 2924/01047* (2013.01); *H01L 2924/01078* (2013.01); *H01L 2924/07802* (2013.01); *H01L 2924/14* (2013.01); *H01L 2924/15173* (2013.01); *H01L 2924/15311* (2013.01); *H01L 2924/19043* (2013.01); *H01L 2924/01006* (2013.01); *H01L 2924/014* (2013.01); *H01L 2924/0665* (2013.01); *H01L 2224/04042* (2013.01)
USPC ........... 438/642; 438/396; 438/462; 438/612; 438/613; 438/644; 257/621; 257/686; 257/698; 257/738; 257/774; 257/E21.59; 257/E21.495; 257/E21.507; 257/E23.011; 257/E23.021

(56) References Cited

U.S. PATENT DOCUMENTS

| | | | |
|---|---|---|---|
| 7,035,081 | B2 | 4/2006 | Nagata et al. |
| 7,176,556 | B2 | 2/2007 | Okamoto et al. |
| 7,345,246 | B2 | 3/2008 | Muramatsu et al. |
| 7,489,032 | B2 | 2/2009 | Jobetto |
| 7,719,116 | B2 | 5/2010 | Wakabayashi et al. |
| 7,867,828 | B2 * | 1/2011 | Jobetto ......................... 438/126 |
| 7,969,006 | B2 | 6/2011 | Lin et al. |
| 2003/0015342 | A1 | 1/2003 | Sakamoto et al. |
| 2004/0238942 | A1 | 12/2004 | Chakravorty et al. |
| 2006/0186524 | A1 | 8/2006 | Aiba et al. |
| 2007/0042594 | A1 | 2/2007 | Wakabayashi et al. |
| 2008/0045007 | A1 * | 2/2008 | Lin et al. ...................... 438/644 |
| 2010/0246152 | A1 * | 9/2010 | Lin et al. ...................... 361/783 |
| 2011/0001238 | A1 * | 1/2011 | Wakisaka et al. ............. 257/738 |
| 2013/0127024 | A1 * | 5/2013 | Lin et al. ...................... 257/659 |

FOREIGN PATENT DOCUMENTS

| | | |
|---|---|---|
| JP | 2001-267350 A | 9/2001 |
| JP | 2006-012885 A | 1/2006 |
| JP | 2007-165579 A | 6/2007 |
| JP | 2007-281116 A | 10/2007 |
| KR | 10-0731842 B1 | 6/2007 |

OTHER PUBLICATIONS

Japanese Office Action dated Sep. 1, 2011, issued in counterpart Japanese Application No. 2009-158629, and English translation thereof.

Chinese Office Action dated Nov. 9, 2011, issued in counterpart Chinese Application No. 201010222786.3, and English translation thereof.

Korean Office Action dated Dec. 15, 2011, issued in counterpart Korean Application No. 10-2010-0063483, and English translation thereof.

* cited by examiner

SEMICONDUCTOR CONSTRUCT AND MANUFACTURING METHOD THEREOF AS WELL AS SEMICONDUCTOR DEVICE AND MANUFACTURING METHOD THEREOF

CROSS-REFERENCE TO RELATED APPLICATIONS

This is a Continuation application of U.S. application Ser. No. 13/960,485, filed Aug. 6, 2013, which is a Continuation application of U.S. application Ser. No. 12/828,492, filed Jul. 1, 2010 and issued as U.S. Pat. No. 8,525,335, which is based upon and claims the benefit of priority from prior Japanese Patent Application No. 2009-158618, filed Jul. 3, 2009; No. 2009-158622, filed Jul. 3, 2009; and No. 2009-158629, filed Jul. 3, 2009, the entire contents of all of which are incorporated herein by reference.

BACKGROUND OF THE INVENTION

1. Field of the Invention

This invention relates to a semiconductor construct.

2. Description of the Related Art

Conventional semiconductor devices include a semiconductor device having a semiconductor construct called a chip size package (CSP) that is fixedly attached to a base plate greater in size than the semiconductor construct (e.g., see Jpn. Pat. Appln. KOKAI Publication No. 2006-12885). In this case, the semiconductor construct called the CSP has a structure that includes a semiconductor substrate, wirings provided on the semiconductor substrate, columnar electrodes respectively provided on connection pads of the wirings, and a sealing film provided around the columnar electrodes.

Furthermore, the lower surface of the semiconductor substrate of the semiconductor construct is fixedly attached to the base plate. An insulating layer is provided on the base plate around the semiconductor construct. An upper insulating film is provided over the semiconductor construct and the insulating layer. Upper wirings are provided on the upper insulating film so as to be connected to the columnar electrodes of the semiconductor construct. The upper wirings, except for its connection pads, are covered with an overcoat film. Solder balls are provided on the connection pads of the upper wirings (e.g., see Jpn. Pat. Appln. KOKAI Publication No. 2006-12885).

In the meantime, the columnar electrodes are respectively provided on the connection pads of the wirings in the semiconductor construct of the above-mentioned conventional semiconductor device. Thus, the relation between the wirings and the columnar electrodes is one-to-one. This is a disadvantage when the line width of the wirings is reduced to about 20 μm or less due to an increase in the number of the wirings and columnar electrodes. In this case, when an excessively high current originating from, for example, a power supply voltage, runs through the wirings, the wirings are burned off and broken.

BRIEF SUMMARY OF THE INVENTION

According to an aspect of embodiments, a semiconductor construct includes a semiconductor substrate, connection pads provided on the semiconductor substrate, a common wiring provided in a region including a predetermined number of connection pads among the connection pads so as to be connected to the predetermined number of connection pads, a wiring provided to be connected to the remaining of the connection pads, a first columnar electrode provided to be connected to the common wiring, and a second columnar electrode provided to be connected to a connection pad portion of the wiring.

According to another aspect of embodiments, a method of manufacturing a semiconductor construct includes forming a common wiring and a wiring on a semiconductor substrate provided with connection pads, the common wiring being formed in a region including common voltage connection pads among the connection pads so as to be connected to the common voltage connection pads, the wiring being formed so as to be connected to the remaining of the connection pads, and forming a first columnar electrode on the common wiring, and forming a second columnar electrode on a connection pad portion of the wiring.

Advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

The present invention will be fully understood by the following detailed description and the accompanying drawings, which only serve to explain the invention and do not limit the scope of the invention. In the drawings.

DETAILED DESCRIPTION OF THE INVENTION

First Embodiment

Figure 1:
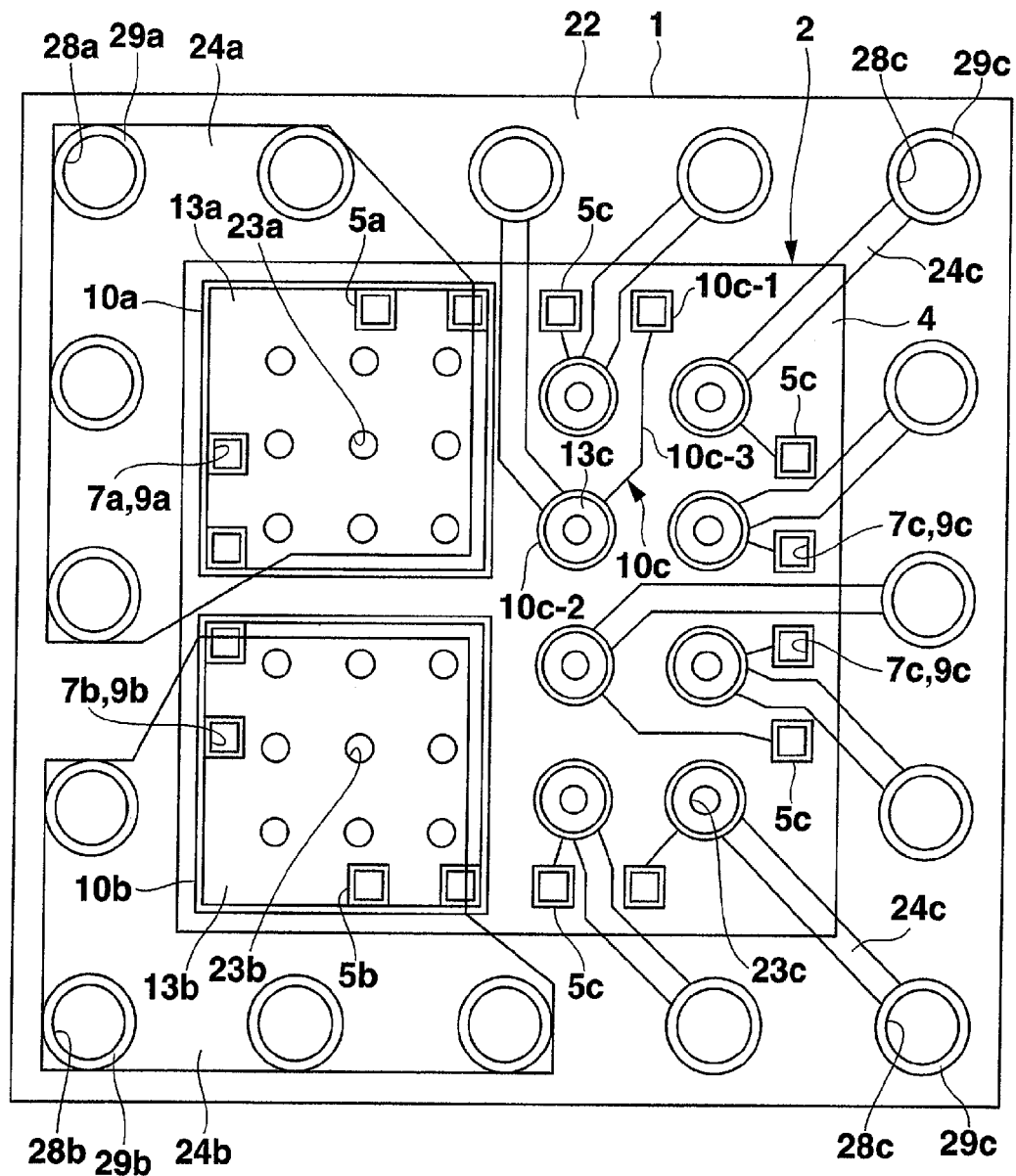
FIG. 1 is a transmitted plan view of a semiconductor device according to a first embodiment of the invention.
Figure 2:
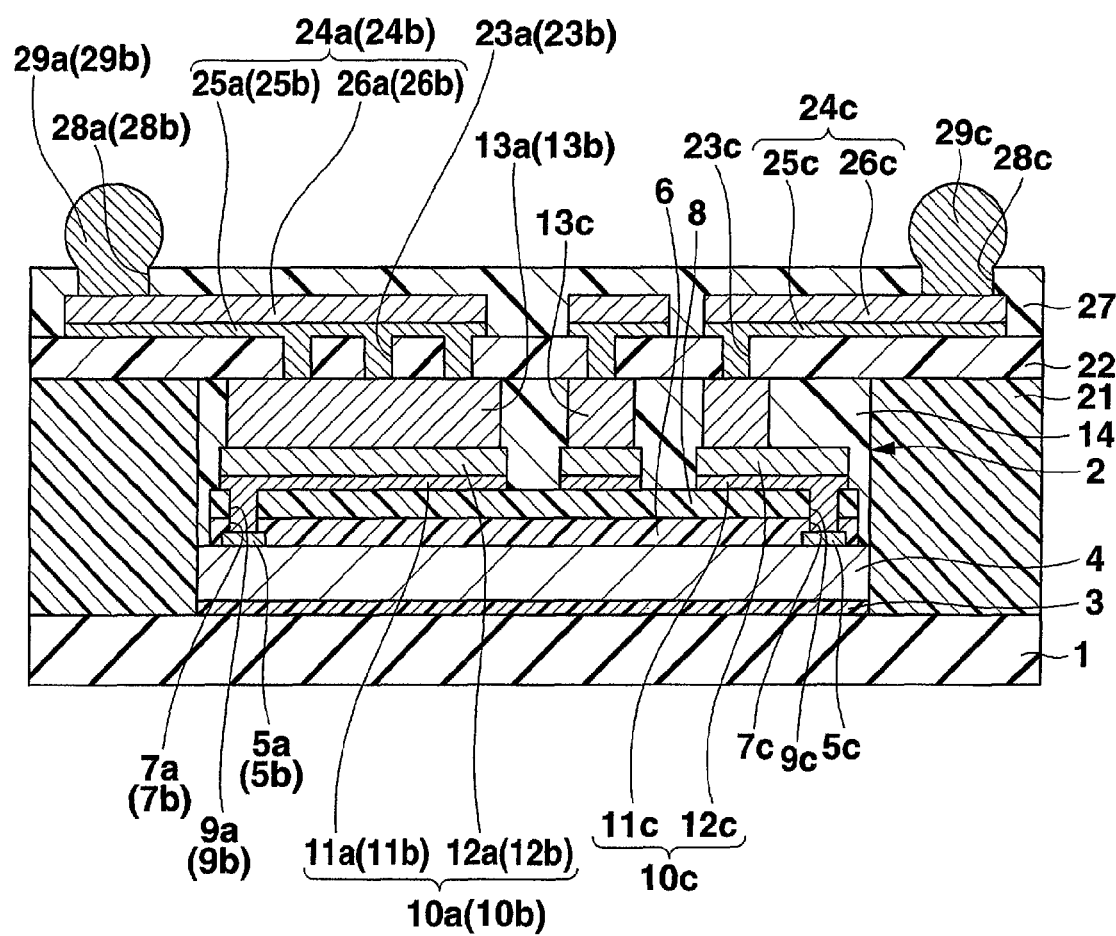
FIG. 2 is a sectional view of a proper part of the semiconductor device shown in FIG. 1.

FIG. 1 shows a transmitted plan view of a semiconductor device according to a first embodiment of the invention. FIG. 2 shows a sectional view of a proper part of the semiconductor device shown in FIG. 1. This semiconductor device includes a base plate 1. The base plate 1 has a square planar shape, and made of, for example, an epoxy resin containing glass fabric as a base material. The lower surface of a semiconductor construct 2 is bonded to the center of the upper surface of the base plate 1 through a bonding layer 3 made of a die bond material. The semiconductor construct 2 has a square planar shape, and is slightly smaller in size than the base plate 1.

The semiconductor construct 2, which is generally called a CSP, includes a silicon substrate (semiconductor substrate) 4. The lower surface of the silicon substrate 4 is bonded to the center of the upper surface of the base plate 1 through the bonding layer 3. Elements (not shown) such as a transistor, diode, resistor, and condenser that constitute an integrated circuit having a predetermined function are formed on the upper surface of the silicon substrate 4. Connection pads $5a$, $5b$, $5c$ are provided on the peripheral portion of the upper surface of the silicon substrate 4. The connection pads $5a$, $5b$, $5c$ are made of, for example, an aluminum-based metal, and connected to the elements of the integrated circuit.

Here, by way of example, the four connection pads indicated by the sign $5a$ and arranged on the upper left part of the silicon substrate 4 in FIG. 1 are for a common power supply voltage. The four connection pads indicated by the sign $5b$ and arranged on the lower left part of the silicon substrate 4 are for a common ground voltage. The four connection pads indicated by the sign $5c$ and arranged on the upper right part of the silicon substrate 4 and the four connection pads indicated by the sign $5c$ and arranged on the lower right part of the silicon substrate 4 are for a normal voltage. Here, in FIG. 2, the ground voltage connection pads $5b$ and associated parts are substantially similar to the power supply voltage connection pads $5a$ and associated parts, and are therefore indicated by signs in parentheses.

A passivation film (insulating film) 6 made of, for example, silicon oxide is provided on the upper surface of the silicon substrate 4 except for the peripheral portion of the silicon substrate 4 and the centers of the connection pads $5a$, $5b$, $5c$. The centers of the connection pads $5a$, $5b$, $5c$ are exposed through openings $7a$, $7b$, $7c$ provided in the passivation film 6. A protective film (insulating film) 8 made of, for example, a polyimide resin is provided on the upper surface of the passivation film 6. Openings $9a$, $9b$, $9c$ are provided in parts of the protective film 8 that correspond to the openings $7a$, $7b$, $7c$ of the passivation film 6.

Wirings $10a$, $10b$, $10c$ are provided on the upper surface of the protective film 8. The wirings $10a$, $10b$, $10c$ have a double-layer structure composed of foundation metal layers $11a$, $11b$, $11c$ and upper metal layers $12a$, $12b$, $12c$. The foundation metal layers $11a$, $11b$, $11c$ are made of, for example, copper and provided on the upper surface of the protective film 8. The upper metal layers $12a$, $12b$, $12c$ are made of copper and provided on the upper surfaces of the foundation metal layers 11.

In this case, as shown in FIG. 1, the wiring indicated by the sign $10a$ (common wiring) is solidly disposed on the upper left part of the silicon substrate 4 in a region that has a square planar shape and includes the four power supply voltage connection pads $5a$. The wiring $10a$ is connected to all of the four power supply voltage connection pads $5a$ via the openings $7a$, $9a$ of the passivation film 6 and the protective film 8.

The wiring indicated by the sign $10b$ (common wiring) is solidly disposed on the lower left part of the silicon substrate 4 in a region that has a square planar shape and includes the four ground voltage connection pads $5b$. The wiring $10b$ is connected to all of the four ground voltage connection pads $5b$ via the openings $7b$, $9b$ of the passivation film 6 and the protective film 8.

The wirings indicated by the sign $10c$ are disposed in the right region of the silicon substrate 4. Each wiring $10c$ has a connection portion $10c$-1 connected to the normal voltage connection pad $5c$ via the openings $7c$, $9c$ of the passivation film 6 and the protective film 8, a connection pad portion $10c$-2 having a circular planar shape, and an extension line $10c$-3 extending between the connection portion $10c$-1 and the connection pad portion $10c$-2.

Similarly to the wiring $10a$, a columnar electrode (common columnar electrode, first columnar electrode) $13a$ is solidly provided in the region of the upper surface, except for its peripheral portion, of the wiring indicated by the sign $10a$ and having a square planar shape. The columnar electrode 13a is made of copper and has a square planar shape. Similarly to the wiring 10b, a columnar electrode (common columnar electrode, first columnar electrode) 13b is solidly provided in the region of the upper surface, except for the peripheral portion, of the wiring indicated by the sign 10b and having a square planar shape. The columnar electrode 13b is made of copper and has a square planar shape. Columnar electrodes (second columnar electrodes) 13c are provided on the upper surface of the connection pad portions 10c-2 of the wirings indicated by the sign 10c. The columnar electrodes 13c are made of copper and have a circular planar shape. Here, as shown in FIG. 1, eight columnar electrodes 13c having a circular planar shape are arranged in matrix form.

A sealing film 14 made of, for example, an epoxy resin is provided around the columnar electrodes 13a, 13b, 13c on the upper surface of the protective film 8 including the wirings 10a, 10b, 10c. The columnar electrodes 13a, 13b, 13c are provided so that the upper surfaces thereof are flush with or several μm lower than the upper surface of the sealing film 14. The explanation of the structure of the semiconductor construct 2 is completed now.

An insulating layer 21 in a square frame shape is provided on the upper surface of the base plate 1 around the semiconductor construct 2. For example, the insulating layer 21 is made of a thermosetting resin such as an epoxy resin in which a reinforcer of an inorganic material such as silica fuller is dispersed. Alternatively, the insulating layer 21 is only made of a thermosetting resin such as an epoxy resin.

An upper insulating film 22 is provided on the upper surfaces of the semiconductor construct 2 and the insulating layer 21. The upper insulating film 22 is made of, for example, a base glass fabric impregnated with a thermosetting resin such as an epoxy resin. Alternatively, the upper insulating film 22 is only made of a thermosetting resin such as an epoxy resin. Openings (first openings) 23a, 23b having a circular planar shape are provided in parts of the upper insulating film 22 that correspond to predetermined nine points on the surface of the columnar electrodes 13a, 13b of the semiconductor construct 2 having a square planar shape. Openings (second openings) 23c having a circular planar shape are provided in parts of the upper insulating film 22 that correspond to the centers of the upper surfaces of the columnar electrodes 13c of the semiconductor construct 2 having a circular planar shape.

In this case, the planar shape of the openings 23a, 23b is the same as the planar shape of the opening 23c. Moreover, both the number of the openings 23a and the number of the openings 23b are nine, and are greater than the number (four) of the power supply voltage and ground voltage connection pads 5a, 5b of the semiconductor construct 2.

Upper wirings 24a, 24b, 24c are provided on the upper surface of the upper insulating film 22. The upper wirings 24a, 24b, 24c have a double-layer structure composed of foundation metal layers 25a, 25b, 25c and upper metal layers 26a, 26b, 26c. The foundation metal layers 25a, 25b, 25c are made of, for example, copper and provided on the upper surface of the upper insulating film 22. The upper metal layers 26a, 26b, 26c are made of copper and provided on the upper surfaces of the foundation metal layers 25a, 25b, 25c.

In this case, as shown in FIG. 1, the upper wiring indicated by the sign 24a (common upper wiring, first upper wiring) is solidly disposed on the upper left part of the upper insulating film 22 in a region of the upper insulating film 22 including nine openings 23a. The upper wiring 24a is connected, via all of the nine openings 23a of the upper insulating film 22, to the predetermined nine points on the surface of the columnar electrode 13a of the semiconductor construct 2 having a square planar shape.

The upper wiring indicated by the sign 24b (common upper wiring, first upper wiring) is solidly disposed on the lower left part of the upper insulating film 22 in a region of the upper insulating film 22 including nine openings 23b. The upper wiring 24b is connected, via all of the nine openings 23b of the upper insulating film 22, to the predetermined nine points on the surface of the ground voltage columnar electrode 13b of the semiconductor construct 2 having a square planar shape.

Similarly to the wiring of the semiconductor construct 2 indicated by the sign 10c, each upper wiring indicated by the sign 24c (second upper wiring) has a connection portion, a connection pad portion, and an extension line extending therebetween. The upper wiring 24c is connected, via the opening 23c of the upper insulating film 22, to the center of the upper surface of the columnar electrode 13c of the semiconductor construct 2 having a circular planar shape.

An overcoat film 27 made of, for example, a solder resist is provided on the upper surface of the upper insulating film 22 including the upper wirings 24a, 24b, 24c. Openings 28a, 28b are provided in parts of the overcoat film 27 that correspond to predetermined four points in the peripheral portions of the upper wirings 24a, 24b. An opening 28c is provided in a part of the overcoat film 27 that corresponds to the connection pad portion of the upper wiring 24c.

Solder balls 29a, 29b, 29c are provided in and above the openings 28a, 28b, 28c of the overcoat film 27 so that these solder balls are connected to the upper wirings 24a, 24b, 24c. In this case, as shown in FIG. 1, the solder balls 29a, 29b, 29c are only disposed around the semiconductor construct 2. Moreover, both the number of the solder balls 29a and the number of the solder balls 29b are four, and are the same as the number (four) of the power supply voltage and ground voltage connection pads 5a, 5b of the semiconductor construct 2.

As described above, in this semiconductor device, the power supply voltage wiring 10a and the ground voltage wiring 10b of the semiconductor construct 2 are solidly formed in a square planar shape, and each connected to all of the four connection pads 5a, 5b. This allows the power supply voltage wiring 10a and the ground voltage wiring 10b not to be burned off even if an excessively high current runs through these wirings.

Furthermore, since the power supply voltage columnar electrode 13a and the ground voltage columnar electrode 13b of the semiconductor construct 2 are solidly formed, the columnar electrodes 13a, 13b can be reduced in resistance, and current capacity can thus be improved. Moreover, since the power supply voltage upper wiring 24a and the ground voltage upper wiring 24b are solidly formed, the upper wirings 24a, 24b can be reduced in resistance, and current capacity can thus be improved.

Still further, since the number (nine) of the openings 23a, 23b provided in the upper insulating film 22 on the power supply voltage and ground voltage columnar electrodes 13a, 13b of the semiconductor construct 2 is greater than the number (four) of the power supply voltage and ground voltage connection pads 5a, 5b, the connection portions of the openings 23a, 23b can be reduced in resistance as a whole, and current capacity can thus be further improved.

Here, the sizes of the parts of this semiconductor device are mentioned. The size of the base plate 1 is 3×3 mm. The size of the semiconductor construct 2 is 2×2 mm. The line width of the extension line 10c-3 of the wiring 10c of the semiconductor construct 2 is 20 μm. The diameter of the columnar electrode 13c of the semiconductor construct 2 having a circular planar shape is 0.2 mm. The pitch of the columnar electrodes 13c is 0.4 mm. The diameter of the opening 23a, 23b, 23c of the upper insulating film 22 is 100 μm. The diameter of the solder balls 29a, 29b, 29c is 0.3 mm. The pitch of the solder balls 29a, 29b, 29c is 0.65 mm.

Now, one example of a method of manufacturing this semiconductor device is described. First, one example of a method of manufacturing the semiconductor construct 2 is described. In this case, the ground voltage connection pad 5b and associated parts are substantially similar to the power supply voltage connection pads 5a and associated parts, and are therefore not described.

Figure 3:
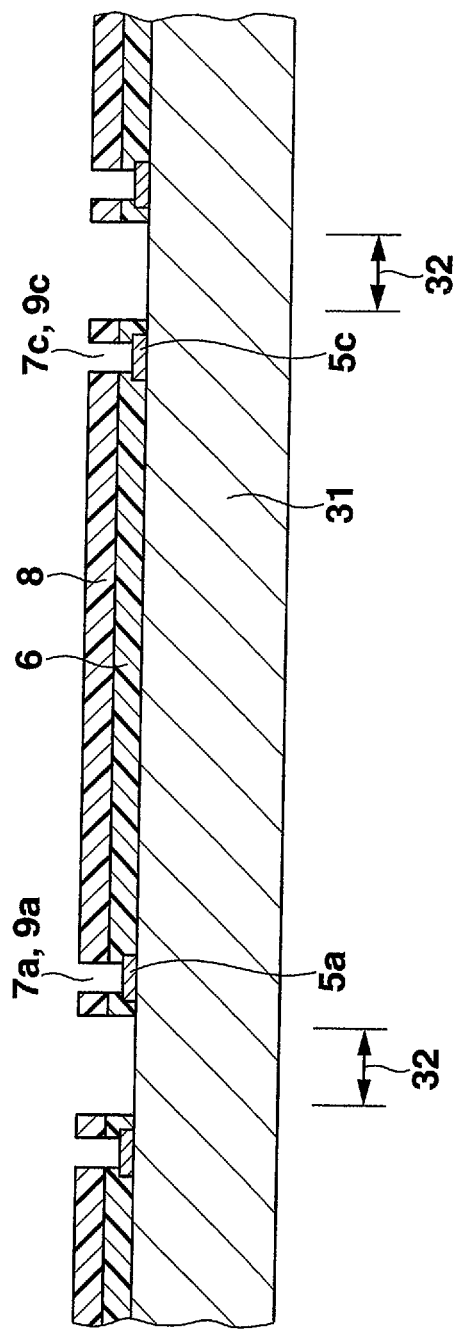
FIG. 3 is a sectional view of an initially prepared assembly in one example of a method of manufacturing the semiconductor device shown in FIG. 1 and FIG. 2.

First, as shown in FIG. 3, an assembly is prepared. In this assembly, connection pads 5a, 5c, a passivation film 6 and a protective film 8 are formed on the upper surface of a silicon substrate in a wafer state (hereinafter referred to as a semiconductor wafer 31). Further, the centers of the connection pads 5a, 5c are exposed through openings 7a, 7c of the passivation film 6 and through openings 9a, 9c of the protective film 8.

In this case, the thickness of the semiconductor wafer 31 is greater than the thickness of a silicon substrate 4 shown in FIG. 2. In FIG. 3, zones indicated by the sign 32 are dicing streets. The parts of the passivation film 6 and the protective film 8 corresponding to the dicing street 32 and both its sides are removed.

Figure 4:
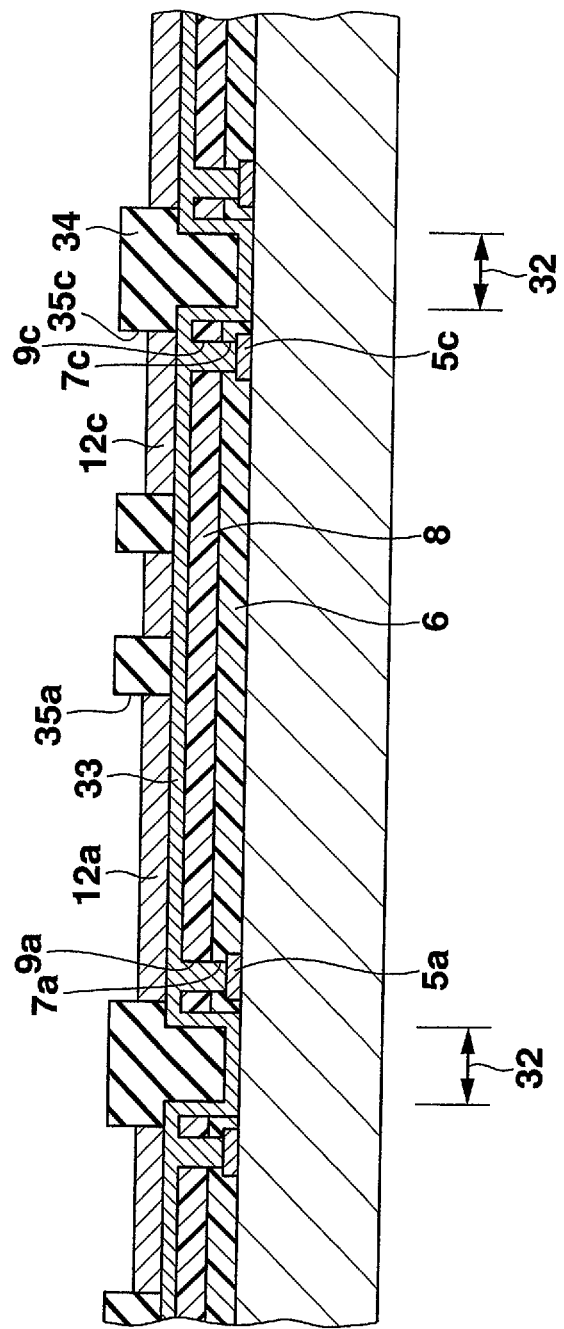
FIG. 4 is a sectional view of a step following FIG. 3.

Then, as shown in FIG. 4, a foundation metal layer 33 is formed on the entire upper surface of the protective film 8 including the upper surfaces of the connection pads 5a, 5c exposed through openings 7a, 7c of the passivation film 6 and through openings 9a, 9c of the protective film 8. In this case, the foundation metal layer 33 may only be a copper layer formed by electroless plating, may only be a copper layer formed by sputtering, or may be a copper layer formed by sputtering on a thin film layer of, for example, titanium formed by sputtering.

Then, a plating resist film 34 made of a positive liquid resist is patterned and formed on the upper surface of the foundation metal layer 33. In this case, openings 35a, 35c are formed in parts of the plating resist film 34 corresponding to regions where upper metal layers 12a, 12c are to be formed. Further, electrolytic plating with copper is carried out using the foundation metal layer 33 as a plating current path, thereby forming the upper metal layers 12a, 12c on the upper surface of the foundation metal layer 33 within the openings 35a, 35c in the plating resist film 34. Subsequently, the plating resist film 34 is released.

Figure 5:
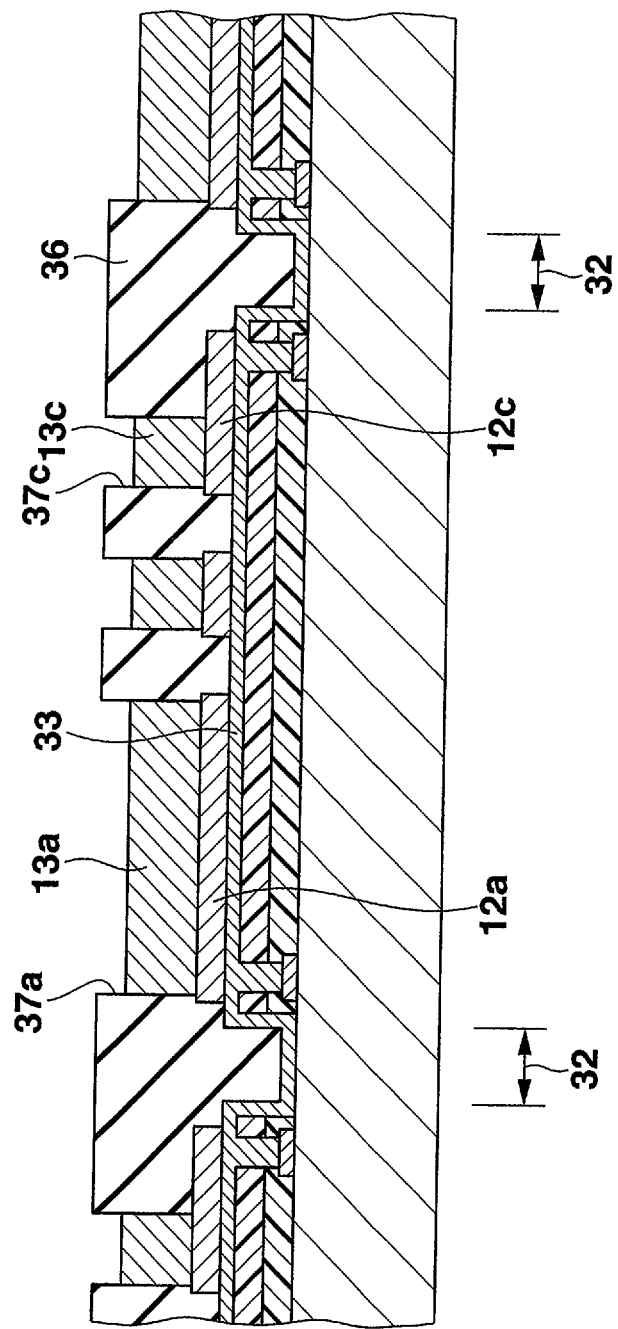
FIG. 5 is a sectional view of a step following FIG. 4.

Then, as shown in FIG. 5, a plating resist film 36 made of a negative dry film resist is patterned and formed on the upper surface of the foundation metal layer 33. In this case, openings 37a, 37c are formed in parts of the plating resist film 36 corresponding to parts of the upper metal layer 12a except for its peripheral portion (a region where a columnar electrode 13a is to be formed) and corresponding to the connection pad portion of the upper metal layer 12c (a region where a columnar electrode 13c is to be formed).

Then, electrolytic plating with copper is carried out using the foundation metal layer 33 as a plating current path. As a result, the columnar electrode 13a is formed on the upper surface of the upper metal layer 12a within the openings 37a in the plating resist film 36. Moreover, the columnar electrode 13c is formed on the upper surface of the connection pad portion of the upper metal layer 12c within the openings 37c in the plating resist film 36. Subsequently, the plating resist film 36 is released.

Figure 6:
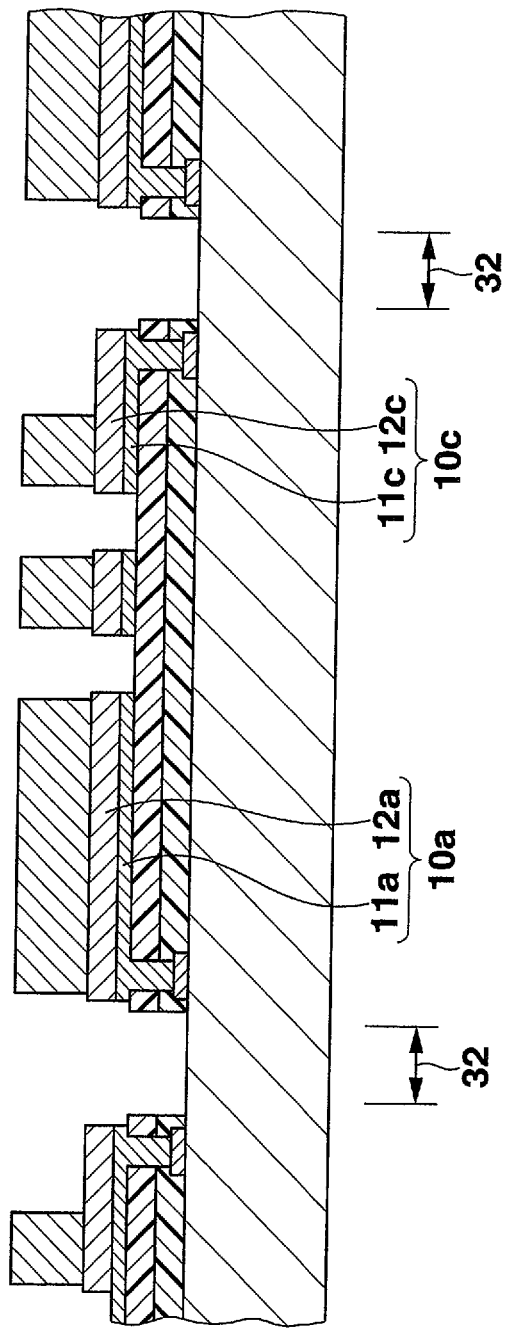
FIG. 6 is a sectional view of a step following FIG. 5.

Then, using the upper metal layers 12a, 12c as masks, the foundation metal layer 33 located in parts other than parts under the upper metal layers 12a, 12c is etched and removed. Thus, as shown in FIG. 6, foundation metal layers 11a, 11c remain under the upper metal layers 12a, 12c alone. In this state, wirings 10a, 10c having a double-layer structure are formed by the upper metal layers 12a, 12c and the foundation metal layers 11a, 11c remaining thereunder.

Figure 7:
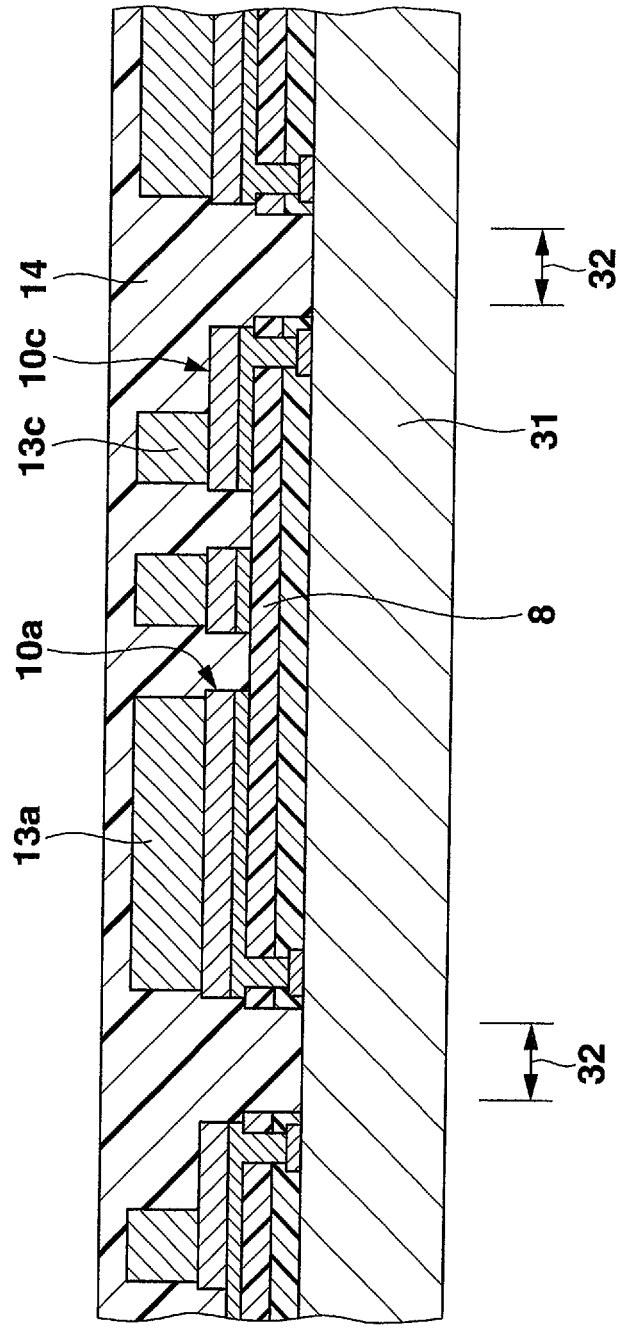
FIG. 7 is a sectional view of a step following FIG. 6.

Then, as shown in FIG. 7, a sealing film 14 made of, for example, an epoxy resin is formed by, for example, a spin coat method on the upper surface of the semiconductor wafer 31 corresponding to the dicing street 32 and both its sides and on the upper surface of the protective film 8 including the wirings 10a, 10c and the columnar electrodes 13a, 13c so that the thickness of this sealing film 14 is slightly greater than the height of the columnar electrodes 13a, 13c. Thus, in this state, the upper surfaces of the columnar electrodes 13a, 13c are covered with the sealing film 14.

Figure 8:
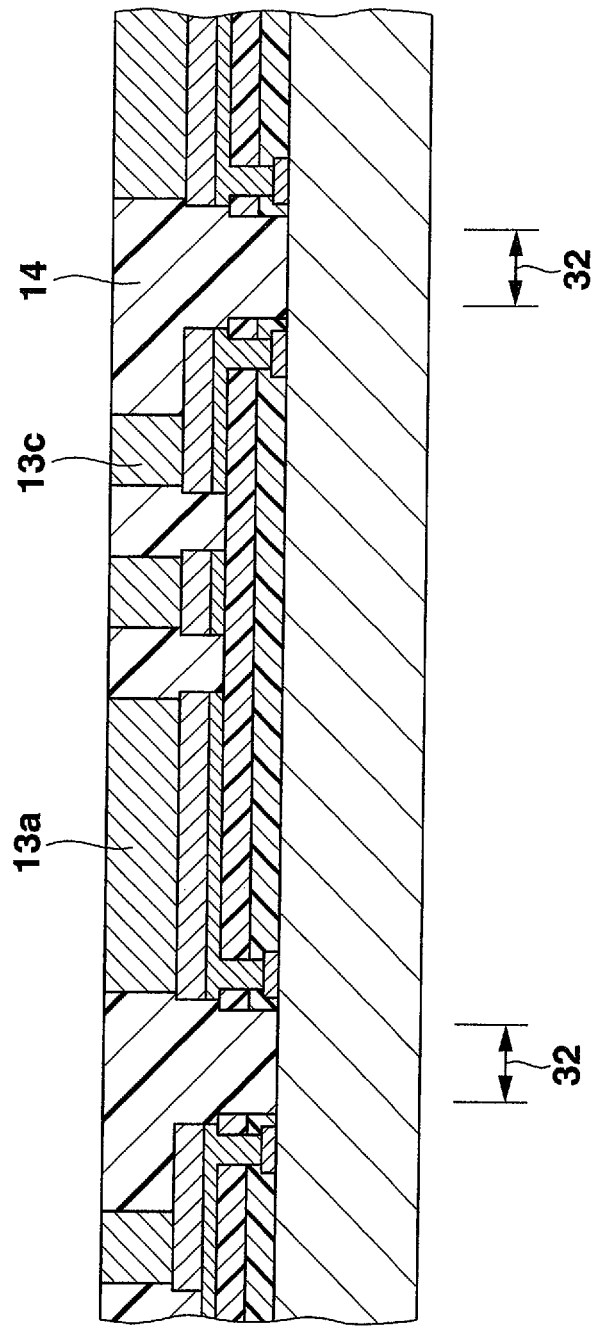
FIG. 8 is a sectional view of a step following FIG. 7.
Figure 9:
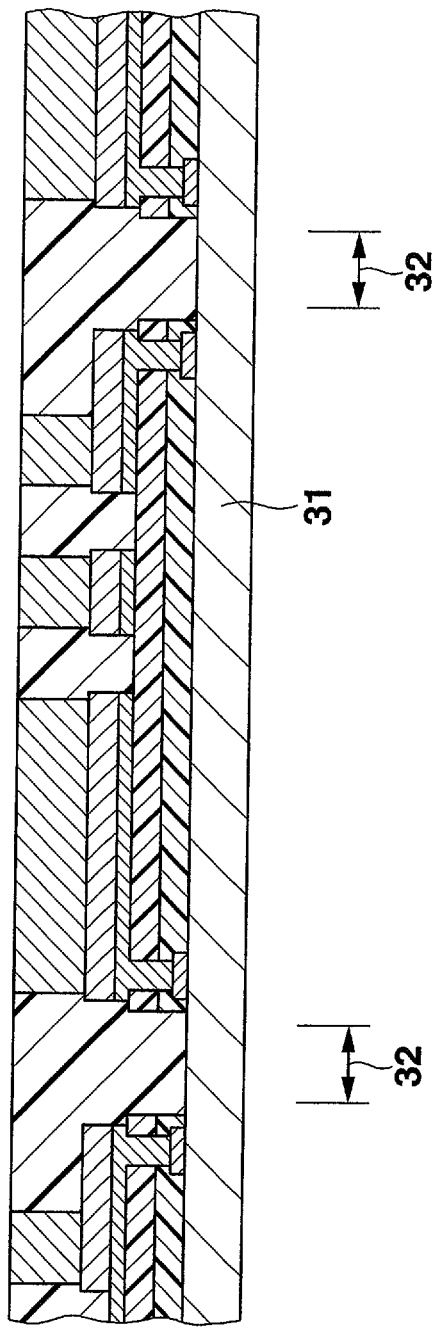
FIG. 9 is a sectional view of a step following FIG. 8.

Then, the upper side of the sealing film 14 is properly ground to expose the upper surfaces of the columnar electrodes 13a, 13c as shown in FIG. 8, and the upper surface of the sealing film 14 including the exposed upper surfaces of the columnar electrodes 13a, 13c is planarized. Further, as shown in FIG. 9, the lower side of the semiconductor wafer 31 is properly ground to reduce the thickness of the semiconductor wafer 31.

Figure 10:
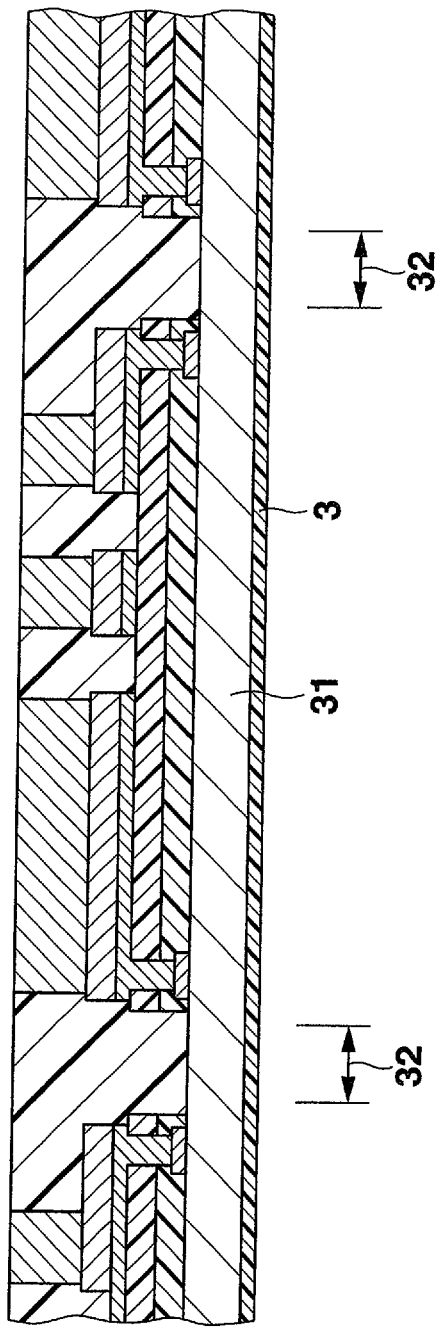
FIG. 10 is a sectional view of a step following FIG. 9.

Then, as shown in FIG. 10, a bonding layer 3 is bonded to the lower surface of the semiconductor wafer 31. The bonding layer 3 is made of a die bond material such as an epoxy resin, and is fixedly attached in a semi-cured state by heating and pressurization to the lower surface of the semiconductor wafer 31. Further, as shown in FIG. 11, the sealing film 14, the semiconductor wafer 31 and the bonding layer 3 are cut along the dicing streets 32, thereby obtaining semiconductor constructs 2 having the bonding layers 3 on the lower surface.

Figure 11:
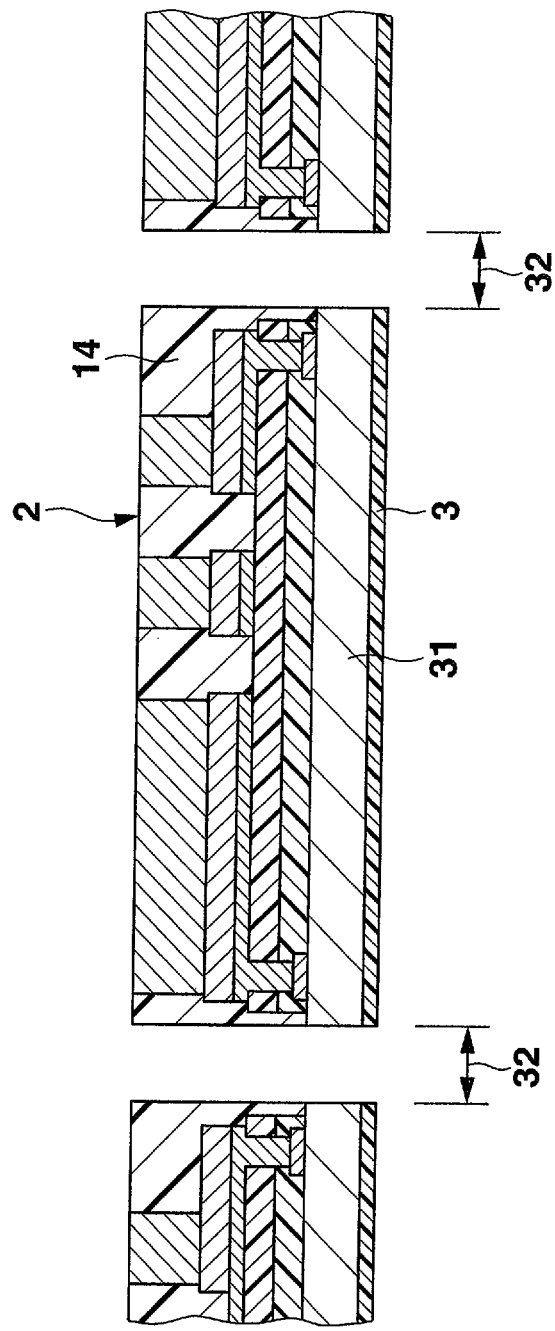
FIG. 11 is a sectional view of a step following FIG. 10.

Now, one example of how to manufacture the semiconductor device shown in FIG. 2 using the semiconductor construct 2 shown in FIG. 11 is described. In this case as well, parts associated with the ground voltage connection pad 5b are substantially similar to parts associated with the power supply voltage connection pads 5a, and are therefore not described.

Figure 12:
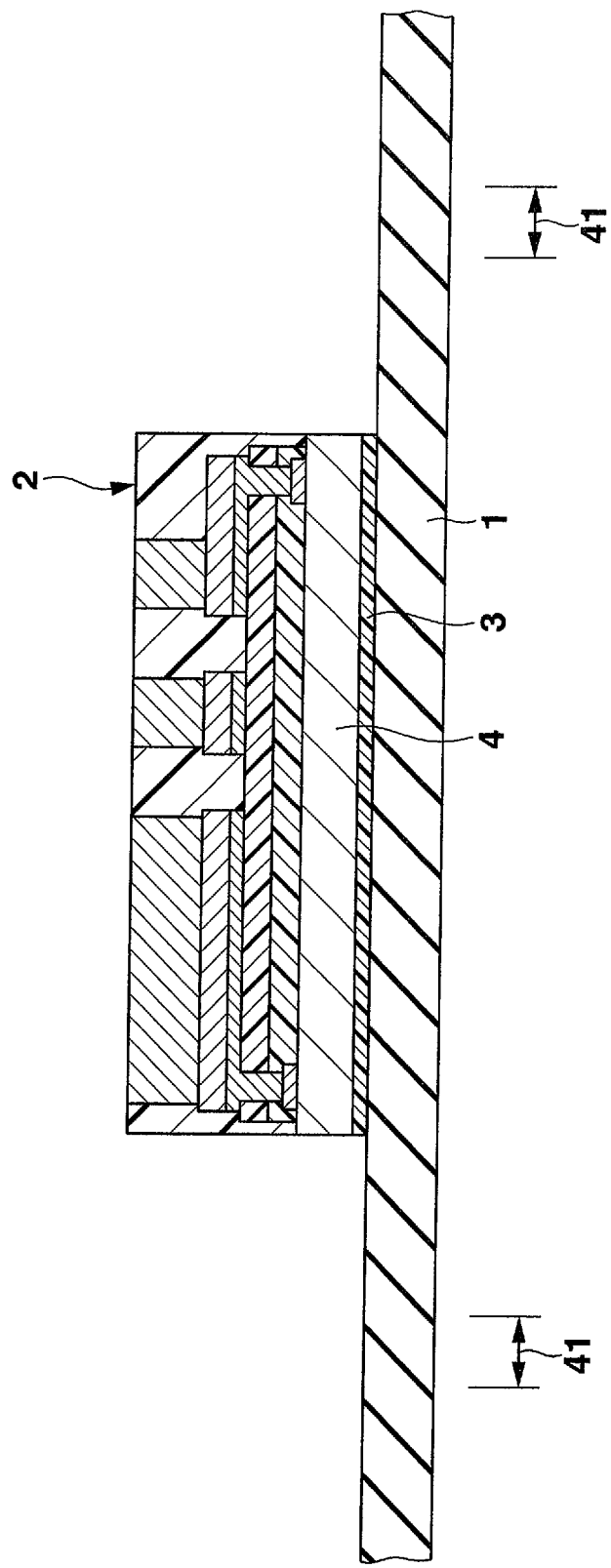
FIG. 12 is a sectional view of a step following FIG. 11.

First, as shown in FIG. 12, a base plate 1 is prepared. This base plate 1 is made of, for example, an epoxy resin containing glass fabric as a base material, and has an area that allows the completed semiconductor devices shown in FIG. 2 to be formed thereon. For example, the base plate 1 has, but not exclusively, a square planar shape. In addition, zones indicated by the sign 41 in FIG. 12 correspond to cut lines for division.

Then, the bonding layers 3 fixedly attached to the lower surfaces of the silicon substrates 4 of the semiconductor constructs 2 are bonded to semiconductor construct placement regions on the upper surface of the base plate 1 to leave space in between. In this bonding, the bonding layers 3 are fully cured by heating and pressurization.

Figure 13:
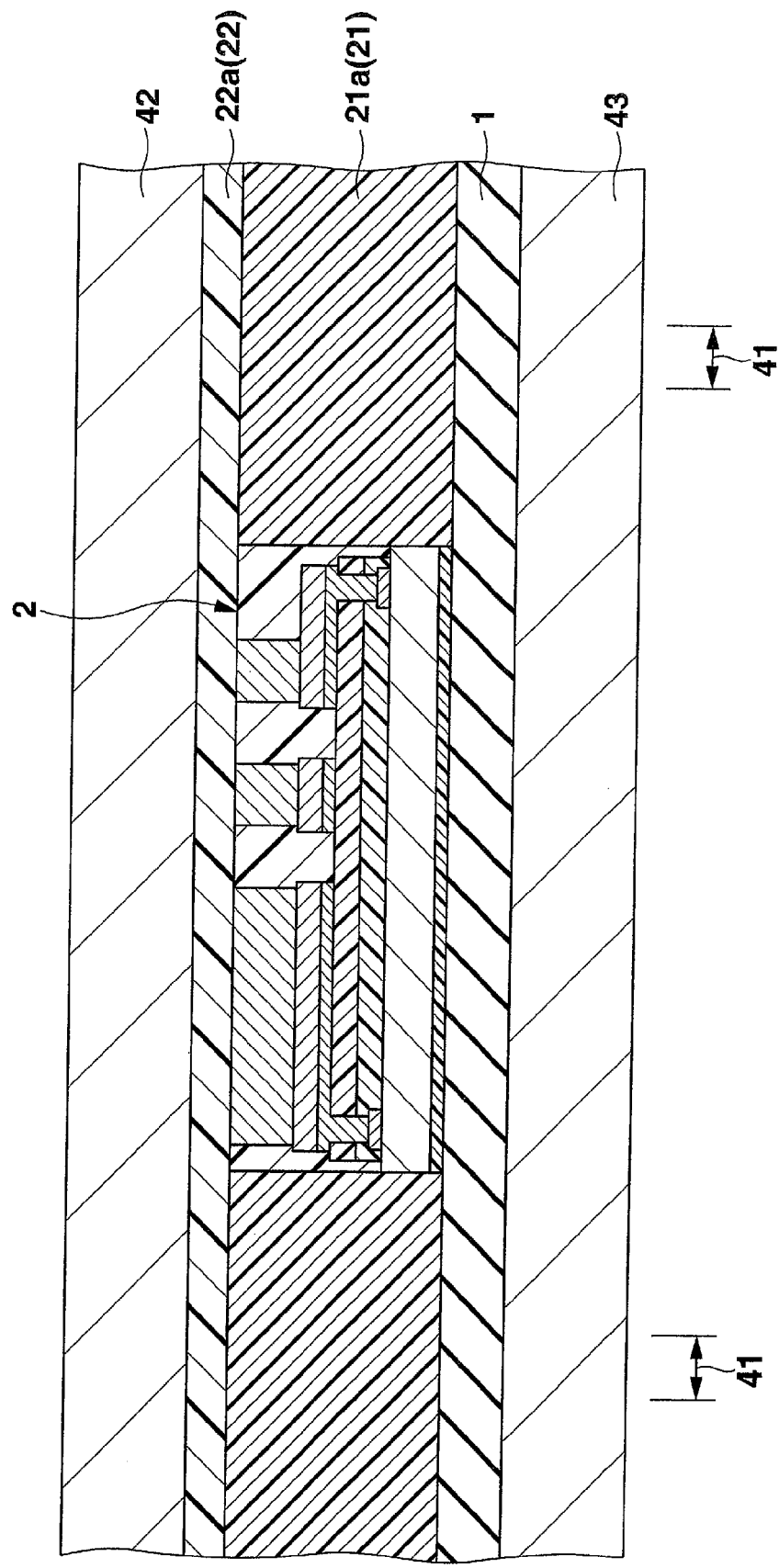
FIG. 13 is a sectional view of a step following FIG. 12.

Then, as shown in FIG. 13, a lattice-shaped insulating layer formation sheet 21a is positioned by, for example, pins and thus disposed on the upper surface of the base plate 1 around the semiconductor construct 2. The lattice-shaped insulating layer formation sheet 21a is prepared by dispersing a reinforcer in a thermosetting resin such as an epoxy resin, semicuring the thermosetting resin into a sheet form, and forming square holes in the sheet by, for example, punching.

Then, an upper insulating film formation sheet 22a is disposed on the upper surfaces of the semiconductor construct 2 and the insulating layer formation sheet 21a. The upper insulating film formation sheet 22a is prepared by impregnating, for example, glass fabric with a thermosetting resin such as an epoxy resin, and semi-curing the thermosetting resin into a sheet form.

Then, the insulating layer formation sheet 21a and the upper insulating film formation sheet 22a are heated and pressurized from the top and bottom using a pair of heating/pressurization plates 42, 43. By subsequent cooling, an insulating layer 21 in a square frame shape is formed on the upper surface of the base plate 1 around the semiconductor construct 2, and an upper insulating film 22 is formed on the upper surfaces of the semiconductor construct 2 and the insulating layer 21. In this case, the upper surface of the upper insulating film 22 is pressed by the lower surface of the upper heating/pressurization plate 42, and is therefore a flat surface.

Figure 14:
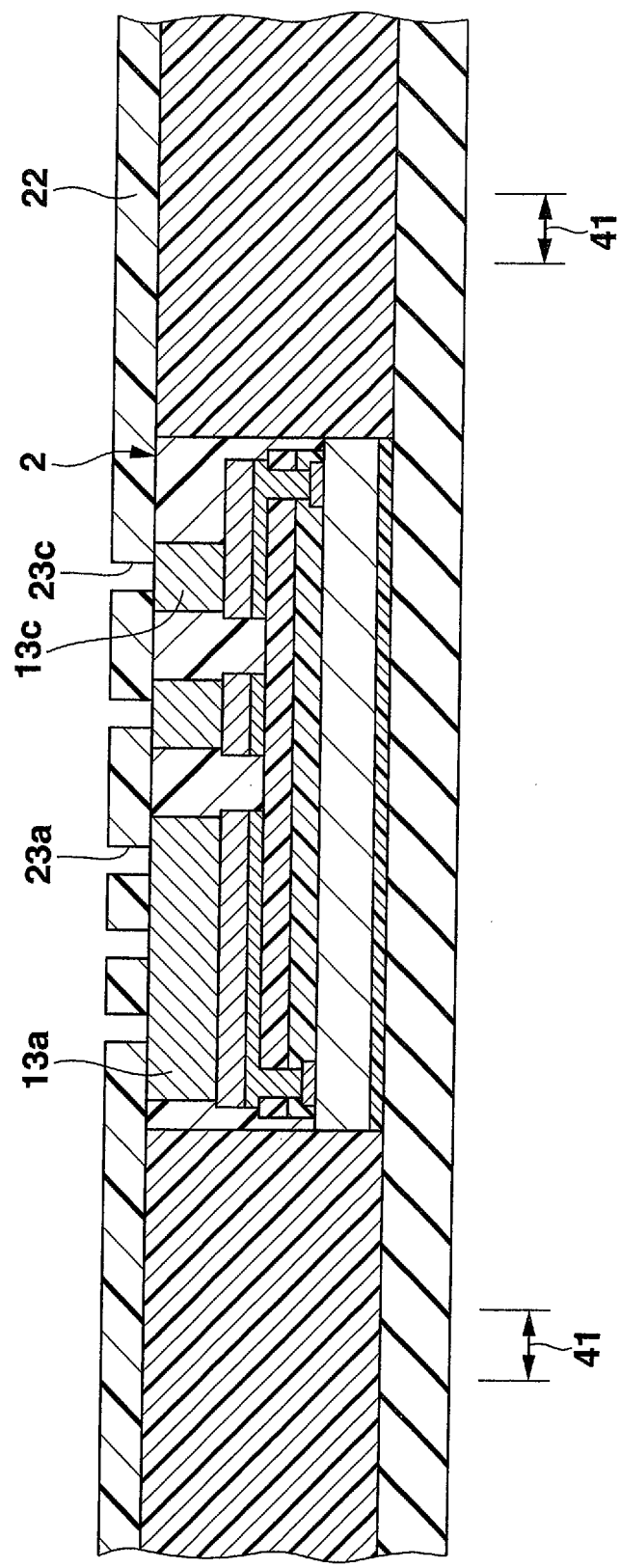
FIG. 14 is a sectional view of a step following FIG. 13.

Then, as shown in FIG. 14, by laser processing to radiate a laser beam, openings 23a are formed in parts of the upper insulating film 22 that correspond to predetermined nine points on the upper surface of the columnar electrode 13a of the semiconductor construct 2. Also, an opening 23c is formed in a part of the upper insulating film 22 that corresponds to the center of the upper surface of the columnar electrode 13c of the semiconductor construct 2.

Figure 15:
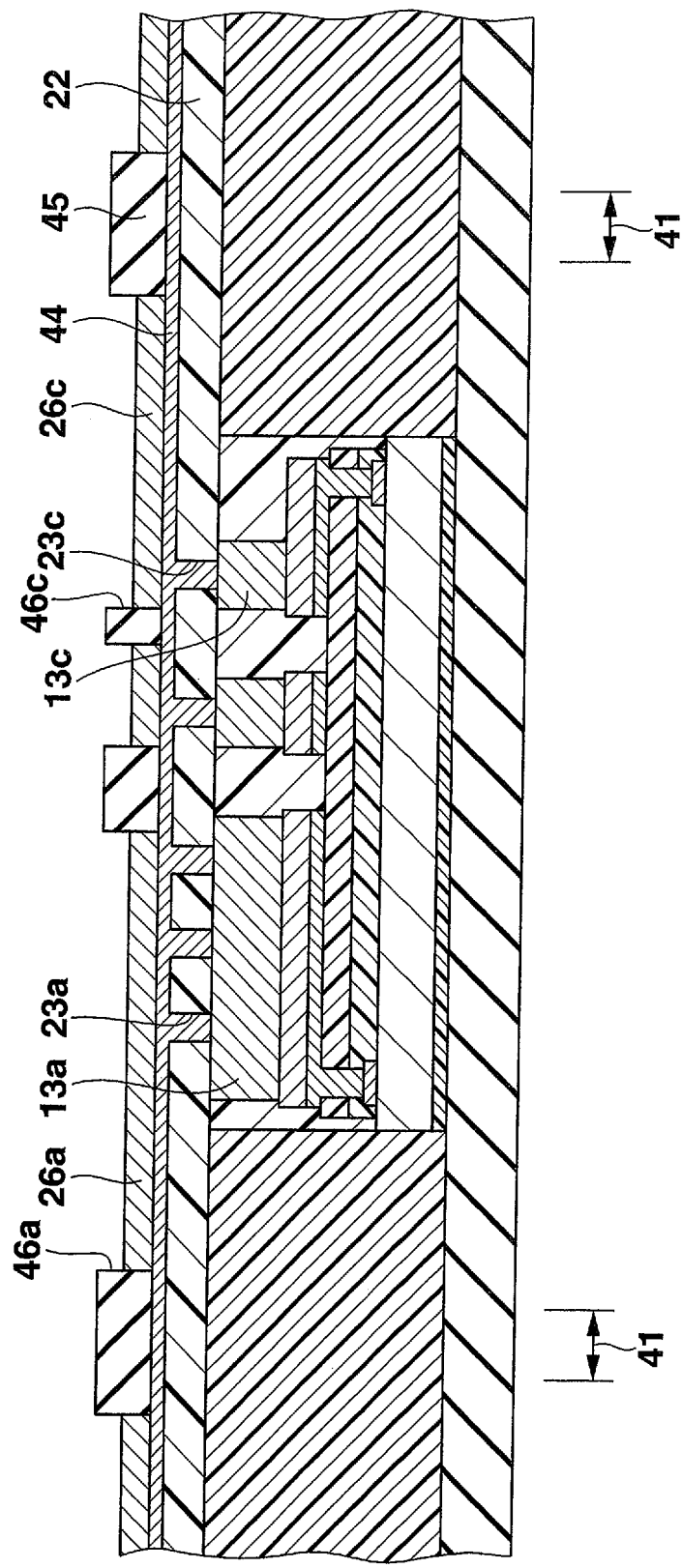
FIG. 15 is a sectional view of a step following FIG. 14.

Then, as shown in FIG. 15, a foundation metal layer 44 is formed on the entire upper surface of the upper insulating film 22 including the upper surfaces of the columnar electrodes 13a, 13c of the semiconductor construct 2 that are exposed through the openings 23a, 23c of the upper insulating film 22. In this case as well, the foundation metal layer 44 may only be a copper layer formed by electroless plating, may only be a copper layer formed by sputtering, or may be a copper layer formed by sputtering on a thin film layer of, for example, titanium formed by sputtering.

Then, a plating resist film 45 is patterned and formed on the upper surface of the foundation metal layer 44. In this case, openings 46a, 46c are formed in parts of the plating resist film 45 corresponding to regions where upper metal layers 26a, 26c are to be formed. Further, electrolytic plating with copper is carried out using the foundation metal layer 44 as a plating current path, thereby forming the upper metal layers 26a, 26c on the upper surface of the foundation metal layer 44 within the openings 46a, 46c in the plating resist film 45.

Figure 16:
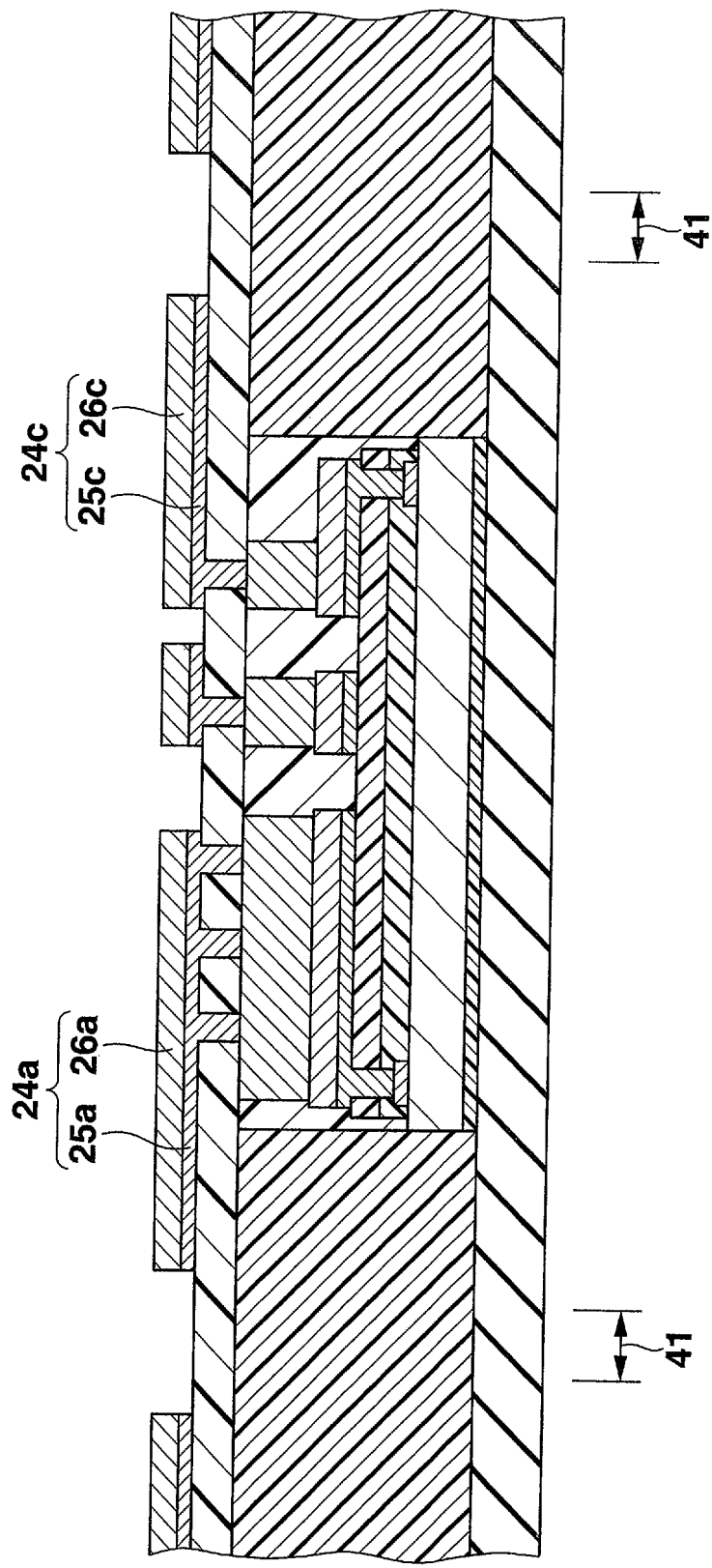
FIG. 16 is a sectional view of a step following FIG. 15.

Then, the plating resist film 45 is released. Further, using the upper metal layers 26a, 26c as masks, the foundation metal layer 44 located in parts other than parts under the upper metal layers 26a, 26c is etched and removed. Thus, as shown in FIG. 16, foundation metal layers 25a, 25c remain under the upper metal layers 26a, 26c alone. In this state, upper wirings 24a, 24b are formed by the upper metal layers 26a, 26c and the foundation metal layers 25a, 25c remaining thereunder.

Figure 17:
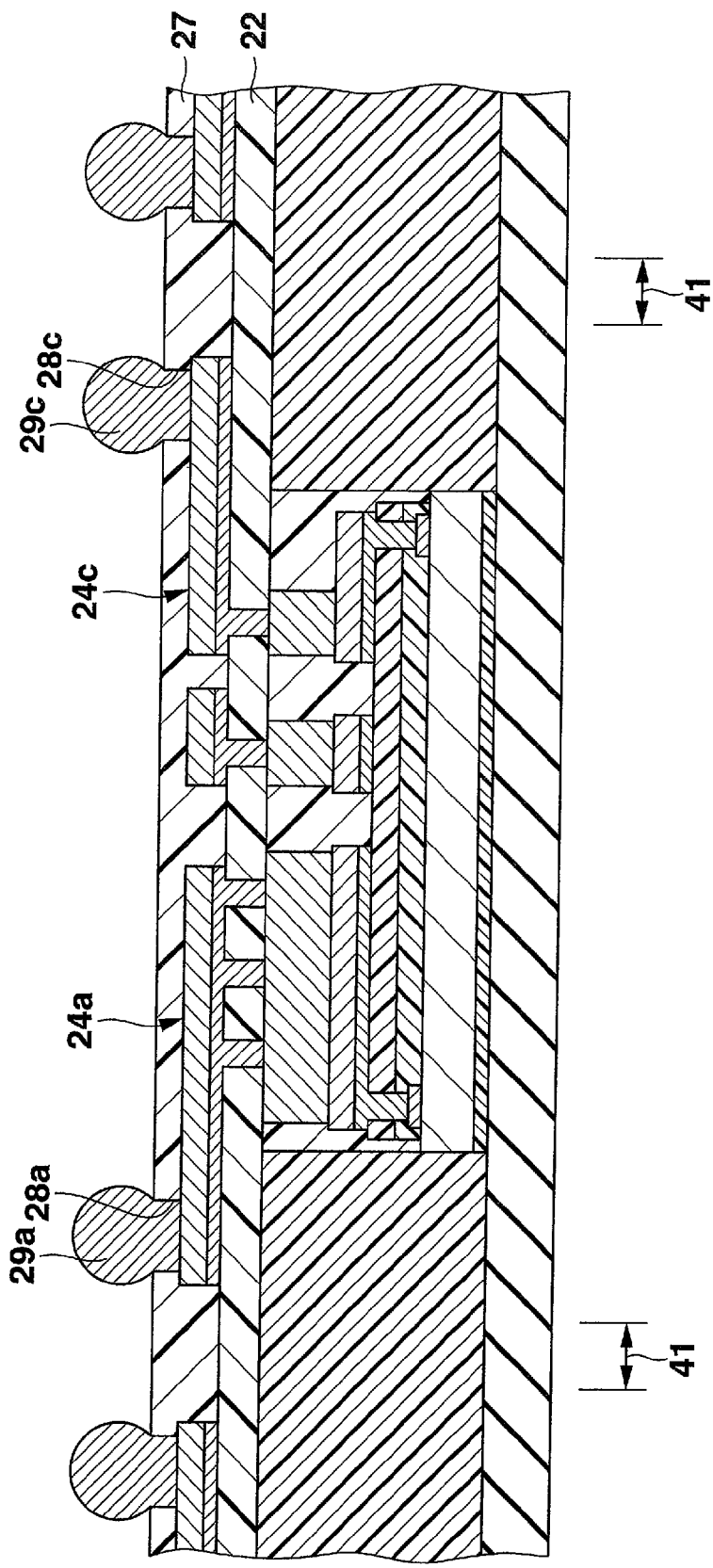
FIG. 17 is a sectional view of a step following FIG. 16.

Then, as shown in FIG. 17, an overcoat film 27 made of, for example, a solder resist is formed by, for example, a screen printing method or spin coat method on the upper surface of the upper insulating film 22 including the upper wirings 24a, 24c. In this case, openings 28a, 28b are formed in parts of the overcoat film 27 that correspond to predetermined four points of the upper surface of the upper wiring 24a and to the connection pad portion of the upper wiring 24c.

Figure 18:
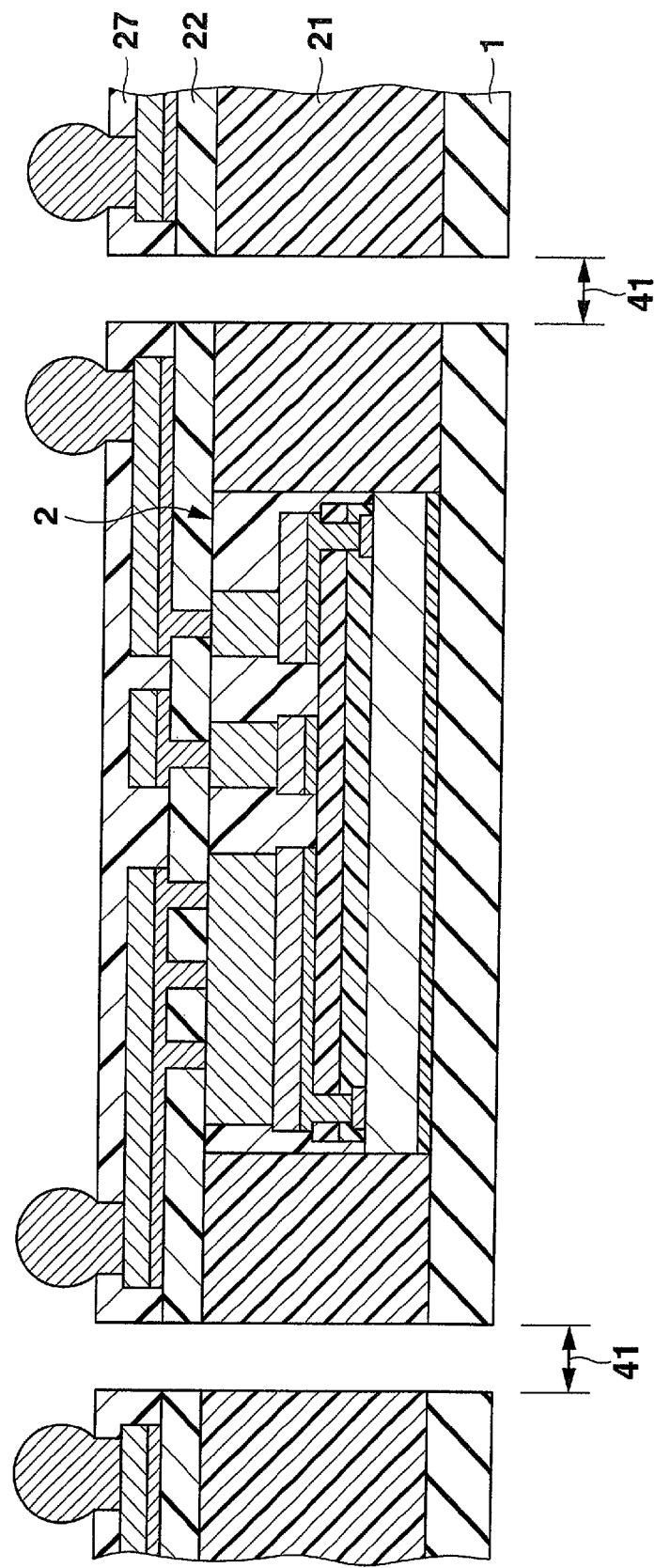
FIG. 18 is a sectional view of a step following FIG. 17.

Then, solder balls 29a, 29c are formed in and above the openings 28a, 28c of the overcoat film 27 so that these solder balls are connected to the predetermined four points of the upper surface of the upper wiring 24a and to the connection pad portion of the upper wiring 24c. Further, as shown in FIG. 18, the overcoat film 27, the upper insulating film 22, the insulating layer 21 and the base plate 1 are cut along the cut lines 41 between adjacent semiconductor constructs 2, thereby obtaining semiconductor devices shown in FIG. 2.

Second Embodiment

Figure 19:
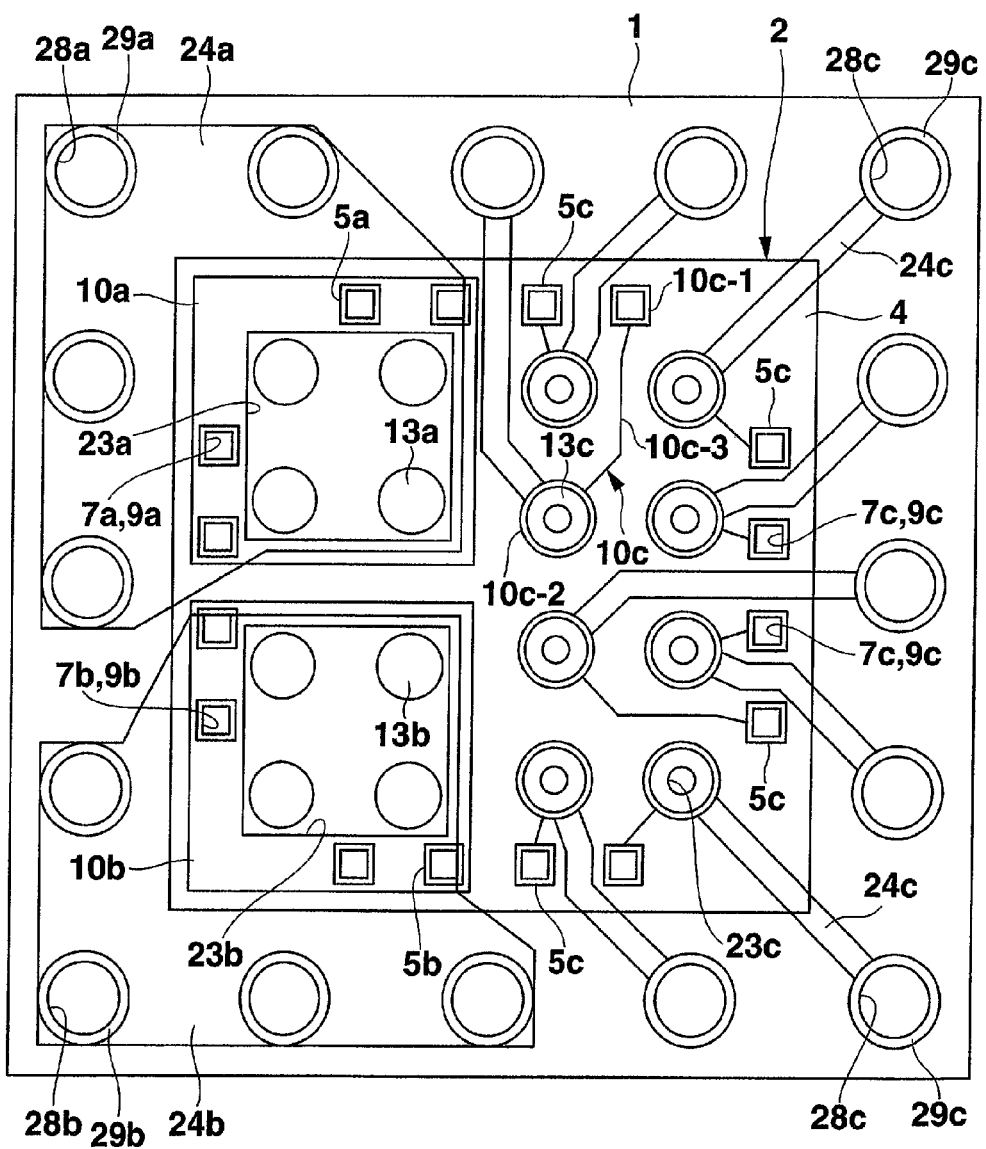
FIG. 19 is a transmitted plan view of a semiconductor device according to a second embodiment of the invention.
Figure 20:
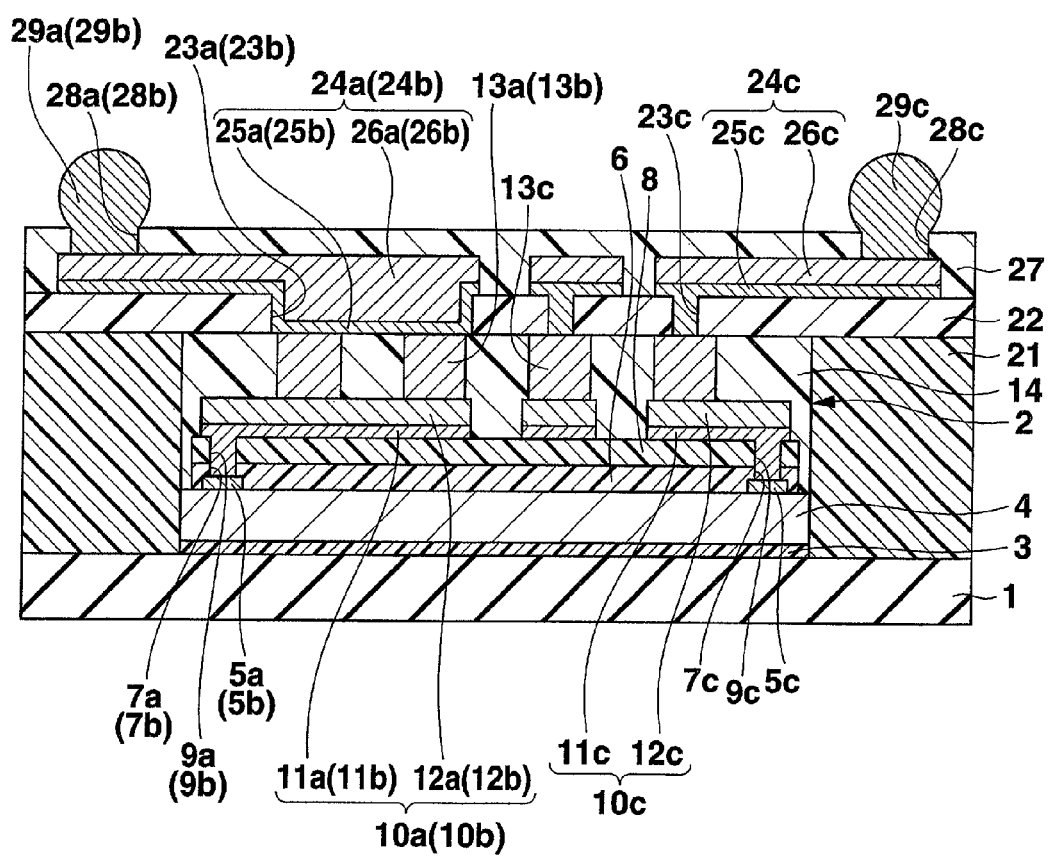
FIG. 20 is a sectional view of a proper part of the semiconductor device shown in FIG. 19.

FIG. 19 shows a transmitted plan view of a semiconductor device according to a second embodiment of the invention. FIG. 20 shows a sectional view of a proper part of the semiconductor device shown in FIG. 19. This semiconductor device includes a base plate 1. The base plate 1 has a square planar shape, and made of, for example, an epoxy resin containing glass fabric as a base material. The lower surface of a semiconductor construct 2 is bonded to the center of the upper surface of the base plate 1 through a bonding layer 3 made of a die bond material. The semiconductor construct 2 has a square planar shape, and is slightly smaller in size than the base plate 1.

The semiconductor construct 2, which is generally called a CSP, includes a silicon substrate (semiconductor substrate) 4. The lower surface of the silicon substrate 4 is bonded to the center of the upper surface of the base plate 1 through the bonding layer 3. Elements (not shown) such as a transistor, diode, resistor, and condenser that constitute an integrated circuit having a predetermined function are formed on the upper surface of the silicon substrate 4. Connection pads 5a, 5b, 5c are provided on the peripheral portion of the upper surface of the silicon substrate 4. The connection pads 5a, 5b, 5c are made of, for example, an aluminum-based metal, and connected to the elements of the integrated circuit.

Here, by way of example, the four connection pads indicated by the sign 5a and arranged on the upper left part of the silicon substrate 4 in FIG. 19 are for a common power supply voltage. The four connection pads indicated by the sign 5b and arranged on the lower left part of the silicon substrate 4 are for a common ground voltage. The four connection pads indicated by the sign 5c and arranged on the upper right part of the silicon substrate 4 and the four connection pads indicated by the sign 5c and arranged on the lower right part of the silicon substrate 4 are for a normal voltage. Here, in FIG. 20, the ground voltage connection pads 5b and associated parts are substantially similar to the power supply voltage connection pads 5a and associated parts, and are therefore indicated by signs in parentheses.

A passivation film (insulating film) 6 made of, for example, silicon oxide is provided on the upper surface of the silicon substrate 4 except for the peripheral portion of the silicon substrate 4 and the centers of the connection pads 5a, 5b, 5c. The centers of the connection pads 5a, 5b, 5c are exposed through openings 7a, 7b, 7c provided in the passivation film 6. A protective film (insulating film) 8 made of, for example, a polyimide resin is provided on the upper surface of the passivation film 6. Openings 9a, 9b, 9c are provided in parts of the protective film 8 that correspond to the openings 7a, 7b, 7c of the passivation film 6.

Wirings 10a, 10b, 10c are provided on the upper surface of the protective film 8. The wirings 10a, 10b, 10c have a double-layer structure composed of foundation metal layers 11a, 11b, 11c and upper metal layers 12a, 12b, 12c. The foundation metal layers 11a, 11b, 11c are made of, for example, copper and provided on the upper surface of the protective film 8. The upper metal layers 12a, 12b, 12c are made of copper and provided on the upper surfaces of the foundation metal layers 11.

In this case, as shown in FIG. 19, the wiring indicated by the sign 10a (common wiring) is solidly disposed on the upper left part of the silicon substrate 4 in a region that has a square planar shape and includes the four power supply voltage connection pads 5a. The wiring 10a is connected to all of the four power supply voltage connection pads 5a via the openings 7a, 9a of the passivation film 6 and the protective film 8.

The wiring indicated by the sign 10b (common wiring) is solidly disposed on the lower left part of the silicon substrate 4 in a region that has a square planar shape and includes the four ground voltage connection pads 5b. The wiring 10b is connected to all of the four ground voltage connection pads 5b via the openings 7b, 9b of the passivation film 6 and the protective film 8.

The wirings indicated by the sign 10c are disposed in the right region of the silicon substrate 4. Each wiring 10c has a connection portion 10c-1 connected to the normal voltage connection pad 5c via the openings 7c, 9c of the passivation film 6 and the protective film 8, a connection pad portion 10c-2 having a circular planar shape, and an extension line 10c-3 extending between the connection portion 10c-1 and the connection pad portion 10c-2.

Columnar electrodes (common columnar electrodes, first columnar electrodes) 13a are provided at predetermined four points on the upper surface of the wiring indicated by the sign 10a and having a square planar shape. The columnar electrodes 13a are made of copper and have a circular planar shape. Columnar electrodes (common columnar electrodes, first columnar electrodes) 13b are provided at predetermined four points on the upper surface of the wiring indicated by the sign 10b and having a square planar shape. The columnar electrodes 13b are made of copper and have a circular planar shape. Columnar electrodes (second columnar electrodes) 13c are provided on the upper surface of the connection pad portions 10c-2 of the wirings indicated by the sign 10c. The columnar electrodes 13c are made of copper and have a circular planar shape.

Here, the number of the columnar electrodes 13a and the number of the columnar electrodes 13b are the same as the number of the power supply voltage connection pads 5a and the number of the ground voltage connection pads 5b, respectively. Moreover, the columnar electrodes 13a, 13b have the same shape as the columnar electrodes 13c. In addition, as shown in FIG. 19, a total of 16 columnar electrodes 13a, 13b, 13c are arranged in matrix form.

A sealing film 14 made of, for example, an epoxy resin is provided around the columnar electrodes 13a, 13b, 13c on the upper surface of the protective film 8 including the wirings 10a, 10b, 10c. The columnar electrodes 13a, 13b, 13c are provided so that the upper surfaces thereof are flush with or several μm lower than the upper surface of the sealing film 14. The explanation of the structure of the semiconductor construct 2 is completed now.

An insulating layer 21 in a square frame shape is provided on the upper surface of the base plate 1 around the semiconductor construct 2. For example, the insulating layer 21 is made of a thermosetting resin such as an epoxy resin in which a reinforcer of an inorganic material such as silica fuller is dispersed. Alternatively, the insulating layer 21 is only made of a thermosetting resin such as an epoxy resin.

An upper insulating film 22 is provided on the upper surfaces of the semiconductor construct 2 and the insulating layer 21. The upper insulating film 22 is made of, for example, a base glass fabric impregnated with a thermosetting resin such as an epoxy resin. Alternatively, the upper insulating film 22 is only made of a thermosetting resin such as an epoxy resin.

Openings (first openings) 23a, 23b having a square planar shape are provided in parts of the upper insulating film 22 that correspond to regions that have a square planar shape and include four columnar electrodes 13a, 13b of the semiconductor construct 2. An opening (second opening) 23c having a circular planar shape is provided in a part of the upper insulating film 22 that corresponds to the center of the upper surface of the columnar electrode 13c of the semiconductor construct 2.

Upper wirings 24a, 24b, 24c are provided on the upper surface of the upper insulating film 22. The upper wirings 24a, 24b, 24c have a double-layer structure composed of foundation metal layers 25a, 25b, 25c and upper metal layers 26a, 26b, 26c. The foundation metal layers 25a, 25b, 25c are made of, for example, copper and provided on the upper surface of the upper insulating film 22. The upper metal layers 26a, 26b, 26c are made of copper and provided on the upper surfaces of the foundation metal layers 25a, 25b, 25c.

In this case, as shown in FIG. 19, the upper wiring indicated by the sign 24a (common upper wiring, first upper wiring) is solidly disposed on the upper left part of the upper insulating film 22 in a region of the upper insulating film 22 including an opening 23a having a square planar shape. The upper wiring 24a is connected, via one opening 23a of the upper insulating film 22 having a square planar shape, to the upper surfaces of all the four power supply voltage columnar electrodes 13a of the semiconductor construct 2. Here, within the opening 23a of the upper insulating film 22, the upper wiring 24a is provided on the upper surfaces of the four columnar electrodes 13a of the semiconductor construct 2 and on the upper surface of the sealing film 14 therearound.

The upper wiring indicated by the sign 24b (common upper wiring, first upper wiring) is solidly disposed on the lower left part of the upper insulating film 22 in a region of the upper insulating film 22 including the opening 23b having a square planar shape. The upper wiring 24b is connected, via one opening 23b of the upper insulating film 22 having a square planar shape, to the upper surfaces of all the four ground voltage columnar electrodes 13b of the semiconductor construct 2. In this case as well, within the opening 23b of the upper insulating film 22, the upper wiring 24b is provided on the upper surfaces of the four columnar electrodes 13b of the semiconductor construct 2 and on the upper surface of the sealing film 14 therearound.

Similarly to the wiring of the semiconductor construct 2 indicated by the sign 10c, each upper wiring indicated by the sign 24c (second upper wiring) has a connection portion, a connection pad portion, and an extension line extending therebetween. The upper wiring 24c is connected to the center of the upper surface of the columnar electrode 13c of the semiconductor construct 2 via the opening 23c of the upper insulating film 22 having a circular planar shape. Here, as shown in FIG. 20, the upper surfaces of the upper wirings 24a, 24b, 24c are flush.

An overcoat film 27 made of, for example, a solder resist is provided on the upper surface of the upper insulating film 22 including the upper wirings 24a, 24b, 24c. Openings 28a, 28b are provided in parts of the overcoat film 27 that correspond to predetermined four points of the peripheral portion of the upper wirings 24a, 24b. An opening 28c is provided in a part of the overcoat film 27 that corresponds to the connection pad portion of the upper wiring 24c.

Solder balls 29a, 29b, 29c are provided in and above the openings 28a, 28b, 28c of the overcoat film 27 so that these solder balls are connected to the upper wirings 24a, 24b, 24c. In this case, as shown in FIG. 19, the solder balls 29a, 29b, 29c are only disposed around the semiconductor construct 2. Moreover, both the number of the solder balls 29a and the number of the solder balls 29b are four, and are the same as the number (four) of the power supply voltage and ground voltage connection pads 5a, 5b of the semiconductor construct 2.

As described above, in this semiconductor device, the power supply voltage wiring 10a and the ground voltage wiring 10b of the semiconductor construct 2 are solidly formed in a square planar shape, and each connected to all of the four connection pads 5a, 5b. This allows the power supply voltage wiring 10a and the ground voltage wiring 10b not to be burned off even if an excessively high current runs through these wirings.

Furthermore, since one opening 23a, 23b having a square planar shape is provided in each of the parts of the upper insulating film 22 that correspond to the four power supply voltage columnar electrodes 13a and the four ground voltage columnar electrodes 13b of the semiconductor construct 2. The solidly-formed upper wirings 24a, 24b are provided on the upper insulating film 22 so that these upper wirings are connected to all the four columnar electrodes 13a and all the four columnar electrodes 13b of the semiconductor construct 2 via the opening 23a, 23b of the upper insulating film 22, the parts corresponding to the opening 23a, 23b of the upper insulating film 22 can be reduced in resistance, and current capacity can thus be improved.

Here, the sizes of the parts of this semiconductor device are mentioned. The size of the base plate 1 is 3×3 mm. The size of the semiconductor construct 2 is 2×2 mm. The line width of the extension line 10c-3 of the wiring 10c of the semiconductor construct 2 is 20 μm. The diameter of the columnar electrode 13a, 13b, 13c of the semiconductor construct 2 is 0.2 mm. The pitch of the columnar electrode 13a, 13b, 13c is 0.4 mm. The diameter of the opening 23c of the upper insulating film 22 having a circular planar shape is 100 μm. The diameter of the solder balls 29a, 29b, 29c is 0.3 mm. The pitch of the solder balls 29a, 29b, 29c is 0.65 mm.

Now, one example of a method of manufacturing this semiconductor device is described. First, one example of a method of manufacturing the semiconductor construct 2 is described. In this case, the ground voltage connection pad 5b and associated parts are substantially similar to the power supply voltage connection pads 5a and associated parts, and are therefore not described.

Figure 21:
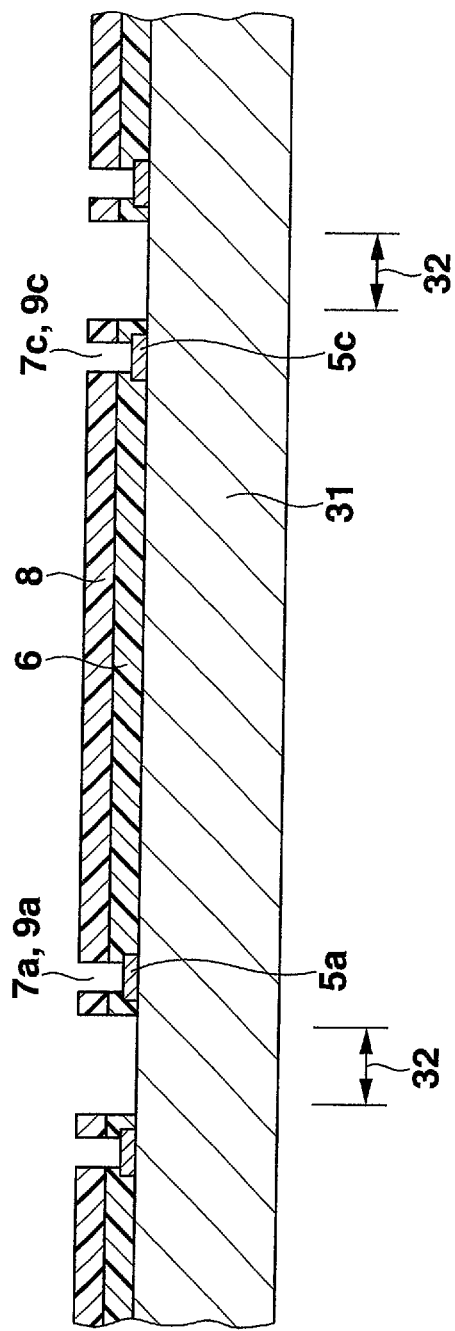
FIG. 21 is a sectional view of an initially prepared assembly in one example of a method of manufacturing the semiconductor device shown in FIG. 19 and FIG. 20.

First, as shown in FIG. 21, an assembly is prepared. In this assembly, connection pads 5a, 5c, a passivation film 6 and a protective film 8 are formed on the upper surface of a silicon substrate in a wafer state (hereinafter referred to as a semiconductor wafer 31). Further, the centers of the connection pads 5a, 5c are exposed through openings 7a, 7c of the passivation film 6 and through openings 9a, 9c of the protective film 8.

In this case, the thickness of the semiconductor wafer 31 is greater than the thickness of a silicon substrate 4 shown in FIG. 20. In FIG. 21, zones indicated by the sign 32 are dicing streets. The parts of the passivation film 6 and the protective film 8 corresponding to the dicing street 32 and both its sides are removed.

Figure 22:
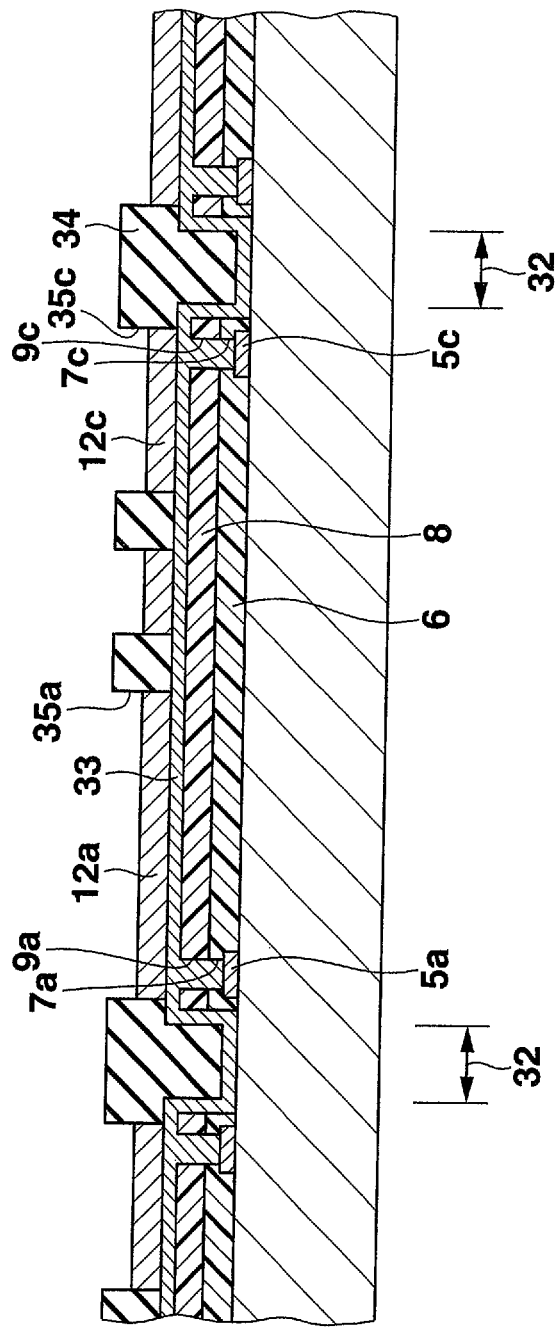
FIG. 22 is a sectional view of a step following FIG. 21.

Then, as shown in FIG. 22, a foundation metal layer 33 is formed on the entire upper surface of the protective film 8 including the upper surfaces of the connection pads 5a, 5c exposed through openings 7a, 7c of the passivation film 6 and through openings 9a, 9c of the protective film 8. In this case, the foundation metal layer 33 may only be a copper layer formed by electroless plating, may only be a copper layer formed by sputtering, or may be a copper layer formed by sputtering on a thin film layer of, for example, titanium formed by sputtering.

Then, a plating resist film 34 made of a positive liquid resist is patterned and formed on the upper surface of the foundation metal layer 33. In this case, openings 35a, 35c are formed in parts of the plating resist film 34 corresponding to regions where upper metal layers 12a, 12c are to be formed. Further, electrolytic plating with copper is carried out using the foundation metal layer 33 as a plating current path, thereby forming the upper metal layers 12a, 12c on the upper surface of the foundation metal layer 33 within the openings 35a, 35c in the plating resist film 34. Subsequently, the plating resist film 34 is released.

Figure 23:
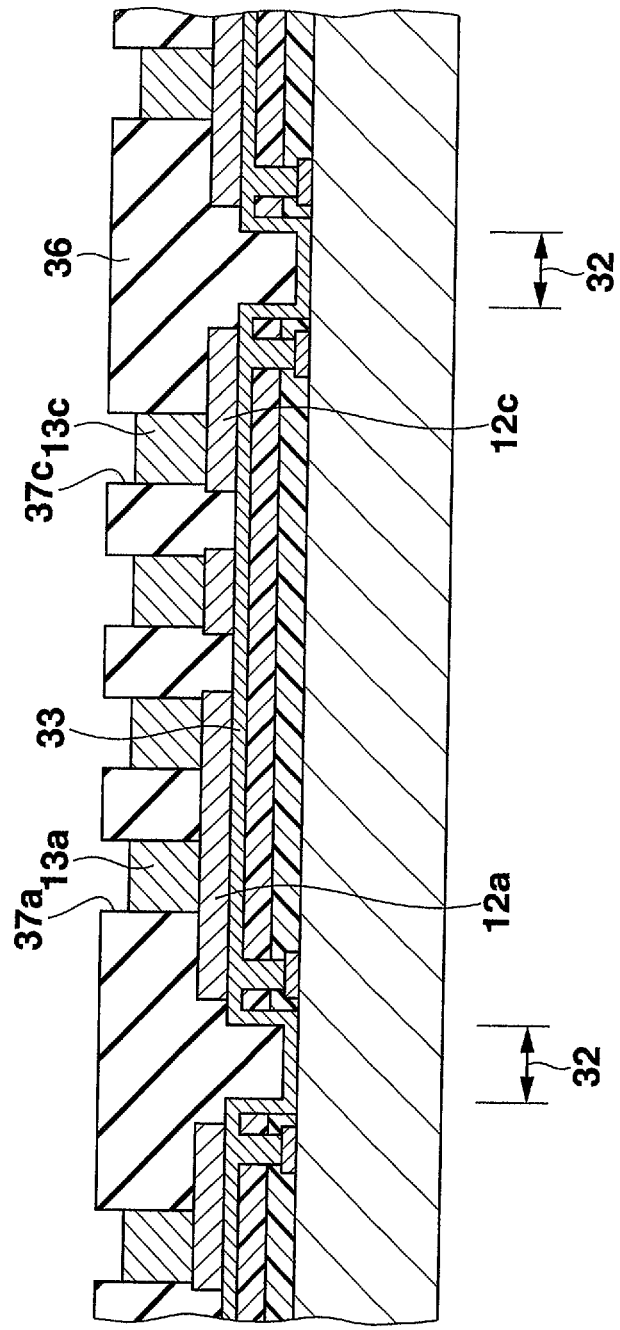
FIG. 23 is a sectional view of a step following FIG. 22.

Then, as shown in FIG. 23, a plating resist film 36 made of a negative dry film resist is patterned and formed on the upper surface of the foundation metal layer 33. In this case, openings 37a, 37c are formed in parts of the plating resist film 36 corresponding to predetermined four points of the upper metal layer 12a (a region where a columnar electrode 13a is to be formed) and corresponding to the connection pad portion of the upper metal layer 12c (a region where a columnar electrode 13c is to be formed).

Then, electrolytic plating with copper is carried out using the foundation metal layer 33 as a plating current path. As a result, the columnar electrode 13a is formed on the upper surface of the upper metal layer 12a within the openings 37a in the plating resist film 36. Moreover, the columnar electrode 13c is formed on the upper surface of the connection pad portion of the upper metal layer 12c within the openings 37c in the plating resist film 36. Subsequently, the plating resist film 36 is released.

Figure 24:
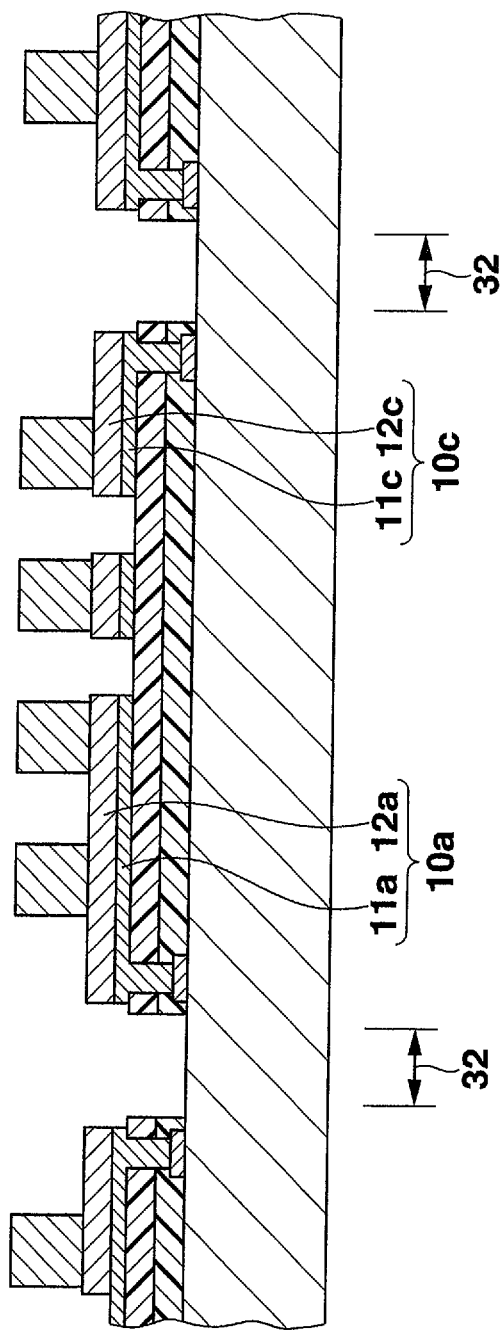
FIG. 24 is a sectional view of a step following FIG. 23.

Then, using the upper metal layers 12a, 12c as masks, the foundation metal layer 33 located in parts other than parts under the upper metal layers 12a, 12c is etched and removed. Thus, as shown in FIG. 24, foundation metal layers 11a, 11c remain under the upper metal layers 12a, 12c alone. In this state, wirings 10a, 10c having a double-layer structure are formed by the upper metal layers 12a, 12c and the foundation metal layers 11a, 11c remaining thereunder.

Figure 25:
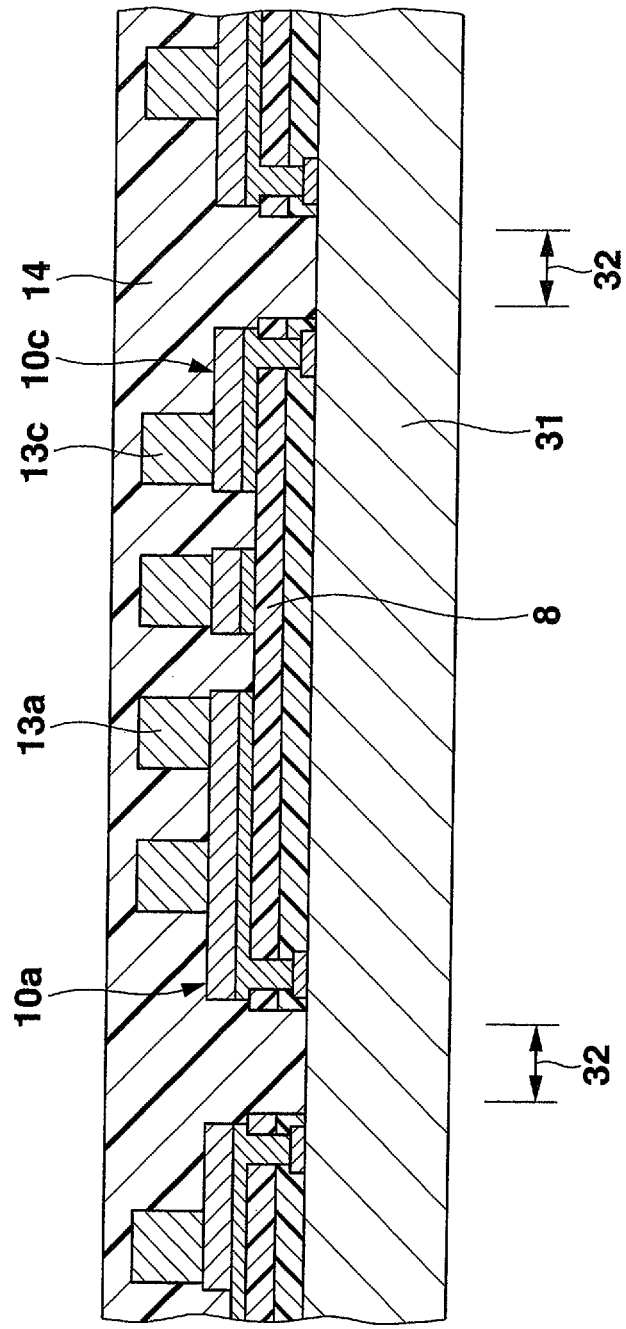
FIG. 25 is a sectional view of a step following FIG. 24.

Then, as shown in FIG. 25, a sealing film 14 made of, for example, an epoxy resin is formed by, for example, the spin coat method on the upper surface of the semiconductor wafer 31 corresponding to the dicing street 32 and both its sides and on the upper surface of the protective film 8 including the wirings 10a, 10c and the columnar electrodes 13a, 13c so that the thickness of this sealing film 14 is slightly greater than the height of the columnar electrodes 13a, 13c. Thus, in this state, the upper surfaces of the columnar electrodes 13a, 13c are covered with the sealing film 14.

Figure 26:
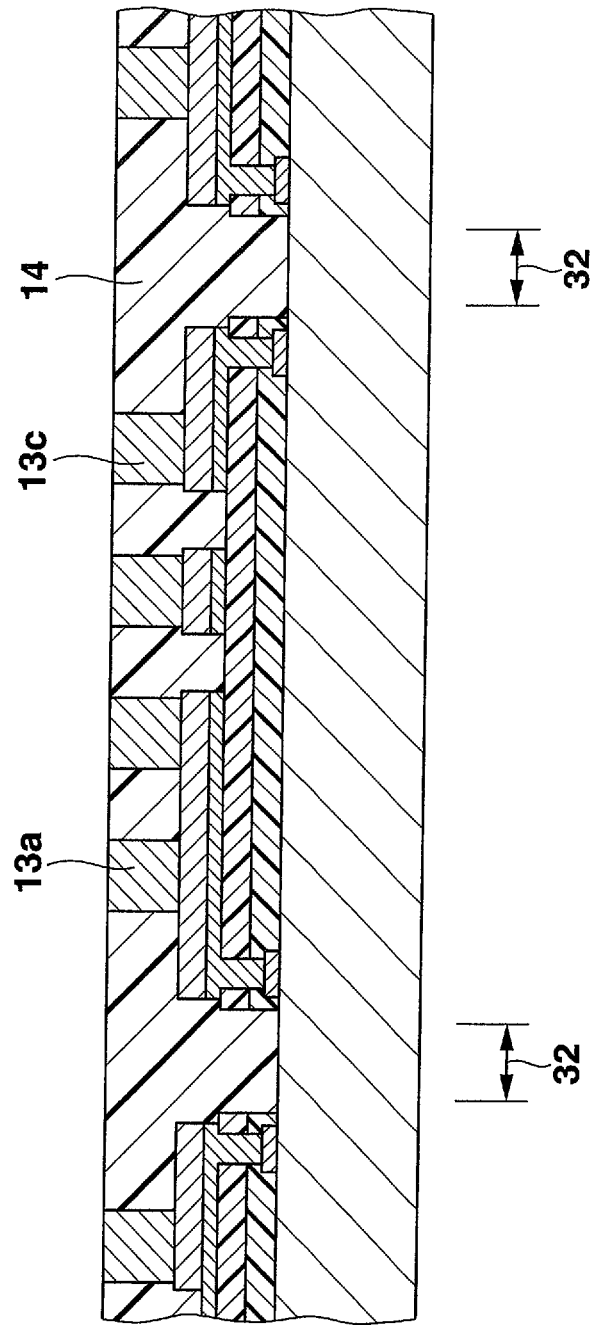
FIG. 26 is a sectional view of a step following FIG. 25.
Figure 27:
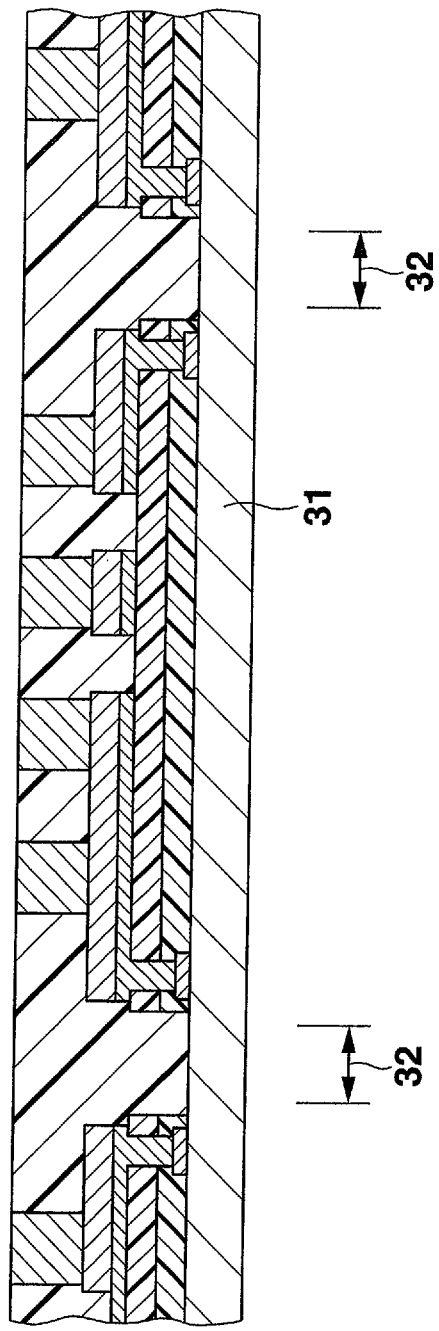
FIG. 27 is a sectional view of a step following FIG. 26.

Then, the upper side of the sealing film 14 is properly ground to expose the upper surfaces of the columnar electrodes 13a, 13c as shown in FIG. 26, and the upper surface of the sealing film 14 including the exposed upper surfaces of the columnar electrodes 13a, 13c is planarized. Further, as shown in FIG. 27, the lower side of the semiconductor wafer 31 is properly ground to reduce the thickness of the semiconductor wafer 31.

Figure 28:
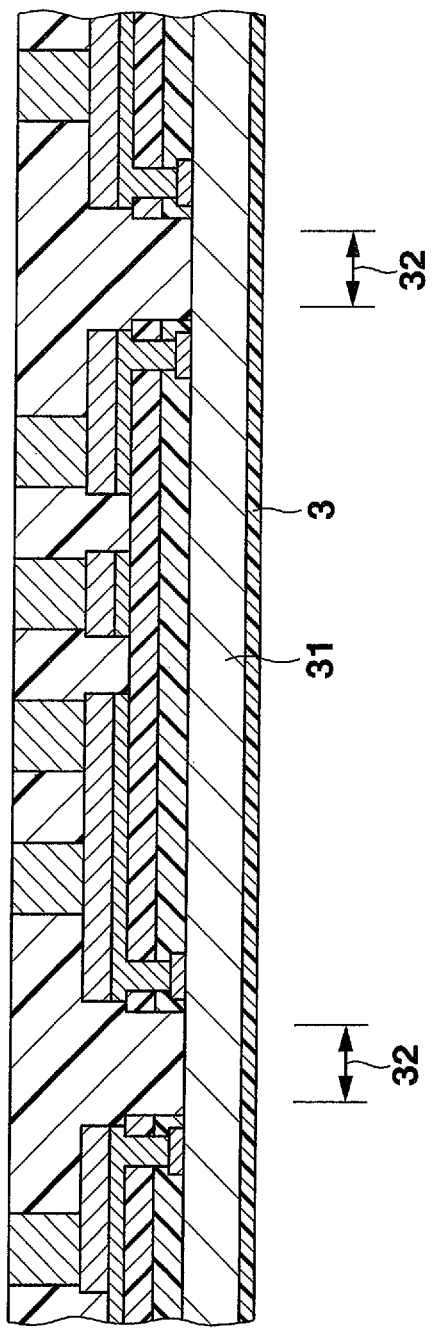
FIG. 28 is a sectional view of a step following FIG. 27.

Then, as shown in FIG. 28, a bonding layer 3 is bonded to the lower surface of the semiconductor wafer 31. The bonding layer 3 is made of a die bond material such as an epoxy resin, and is fixedly attached in a semi-cured state by heating and pressurization to the lower surface of the semiconductor wafer 31. Further, as shown in FIG. 29, the sealing film 14, the semiconductor wafer 31 and the bonding layer 3 are cut along the dicing streets 32, thereby obtaining semiconductor constructs 2 having the bonding layers 3 on the lower surface.

Figure 29:
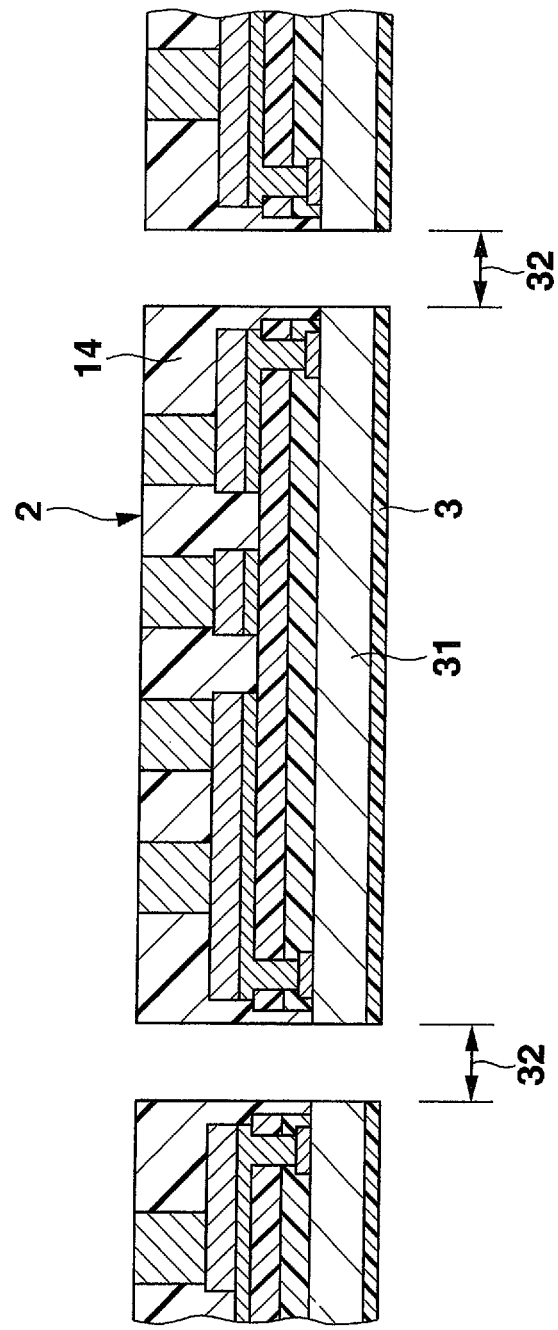
FIG. 29 is a sectional view of a step following FIG. 28.

Now, one example of how to manufacture the semiconductor device shown in FIG. 20 using the semiconductor construct 2 shown in FIG. 29 is described. In this case as well, parts associated with the ground voltage connection pad 5b are substantially similar to parts associated with the power supply voltage connection pads 5a, and are therefore not described.

Figure 30:
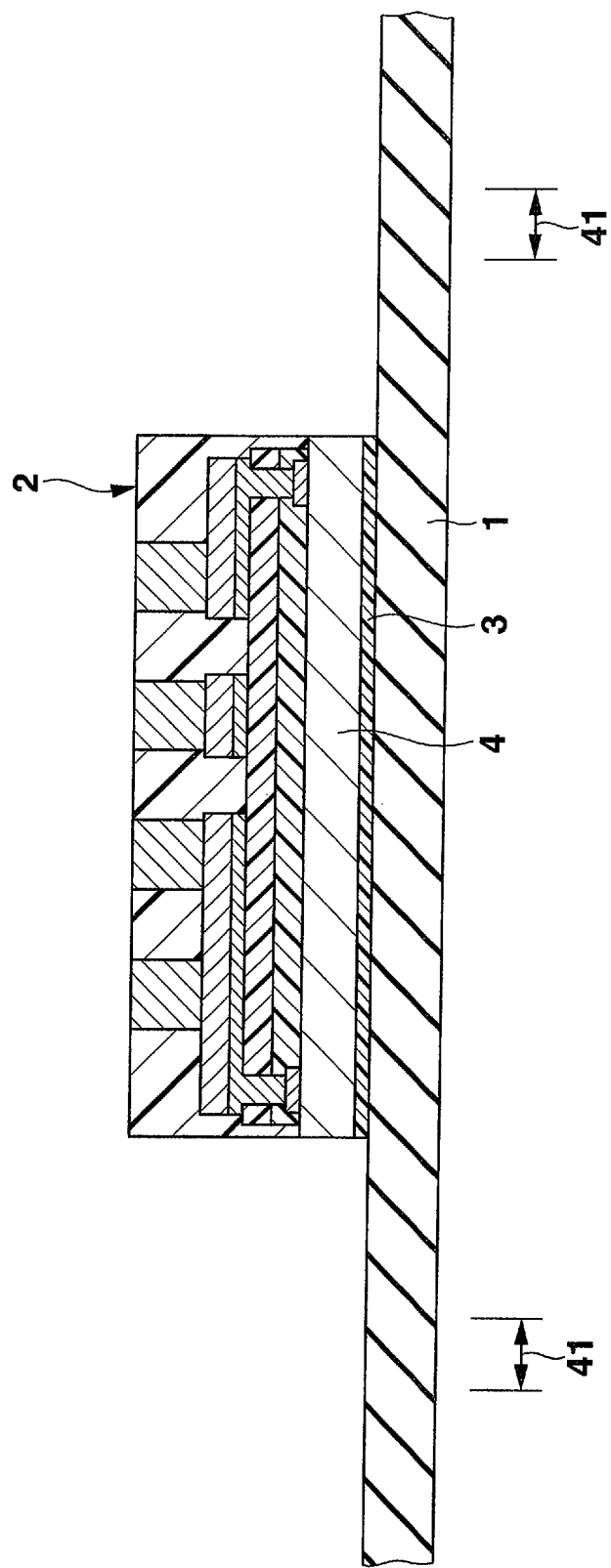
FIG. 30 is a sectional view of a step following FIG. 29.

First, as shown in FIG. 30, a base plate 1 is prepared. This base plate 1 is made of, for example, an epoxy resin containing glass fabric as a base material, and has an area that allows the completed semiconductor devices shown in FIG. 20 to be formed thereon. For example, the base plate 1 has, but not exclusively, a square planar shape. In addition, zones indicated by the sign 41 in FIG. 30 correspond to cut lines for division.

Then, the bonding layers 3 fixedly attached to the lower surfaces of the silicon substrates 4 of the semiconductor constructs 2 are bonded to semiconductor construct placement regions on the upper surface of the base plate 1 to leave space in between. In this bonding, the bonding layers 3 are fully cured by heating and pressurization.

Figure 31:
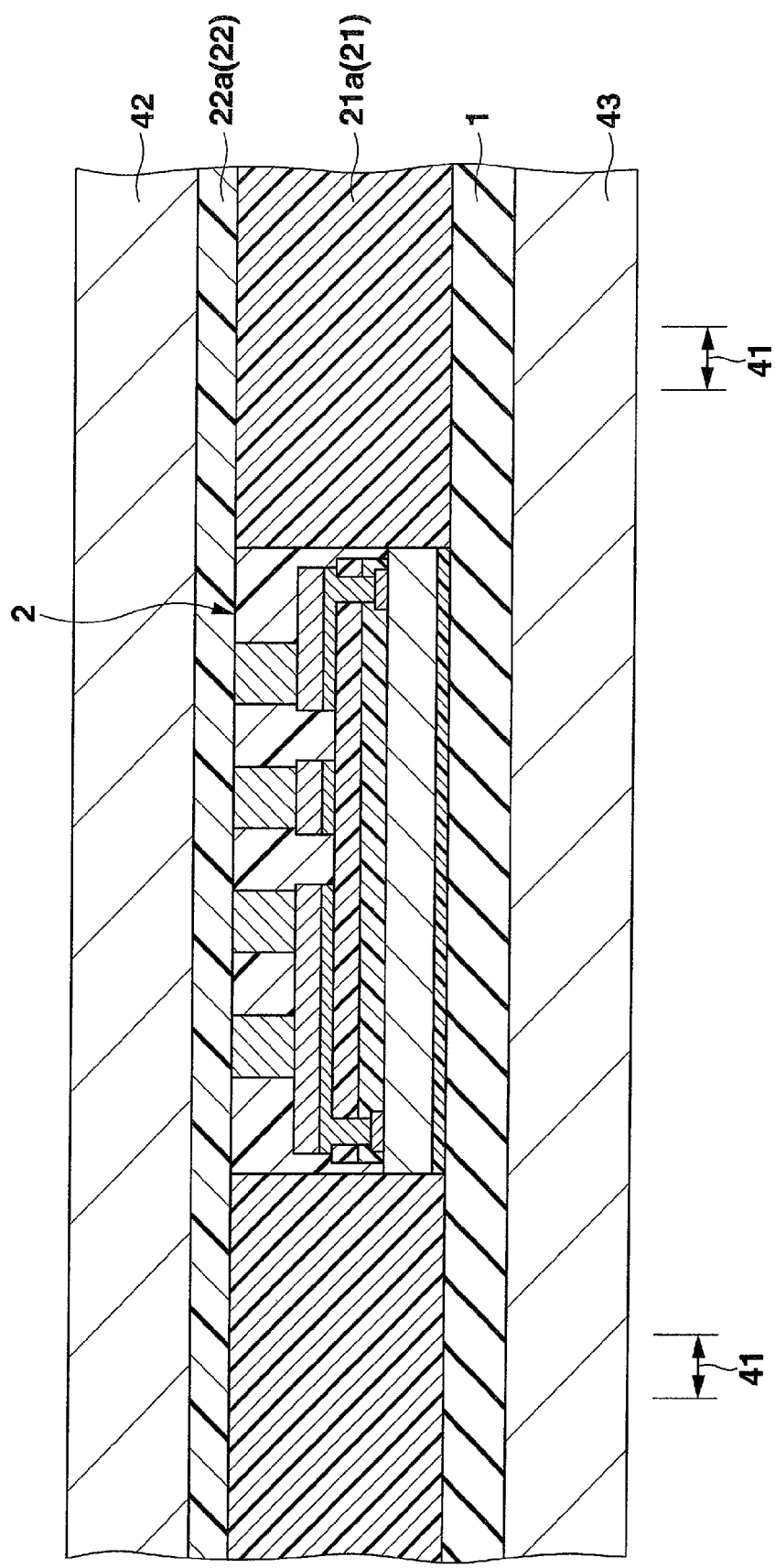
FIG. 31 is a sectional view of a step following FIG. 30.

Then, as shown in FIG. 31, a lattice-shaped insulating layer formation sheet 21a is positioned by, for example, pins and thus disposed on the upper surface of the base plate 1 around the semiconductor construct 2. The lattice-shaped insulating layer formation sheet 21a is prepared by dispersing a reinforcer in a thermosetting resin such as an epoxy resin, semi-curing the thermosetting resin into a sheet form, and forming square holes in the sheet by, for example, punching.

Then, an upper insulating film formation sheet 22a is disposed on the upper surfaces of the semiconductor construct 2 and the insulating layer formation sheet 21a. The upper insulating film formation sheet 22a is prepared by impregnating, for example, glass fabric with a thermosetting resin such as an epoxy resin, and semi-curing the thermosetting resin into a sheet form.

Then, the insulating layer formation sheet 21a and the upper insulating film formation sheet 22a are heated and pressurized from the top and bottom using a pair of heating/pressurization plates 42, 43. By subsequent cooling, an insulating layer 21 in a square frame shape is formed on the upper surface of the base plate 1 around the semiconductor construct 2, and an upper insulating film 22 is formed on the upper surfaces of the semiconductor construct 2 and the insulating layer 21. In this case, the upper surface of the upper insulating film 22 is pressed by the lower surface of the upper heating/pressurization plate 42, and is therefore a flat surface.

Figure 32:
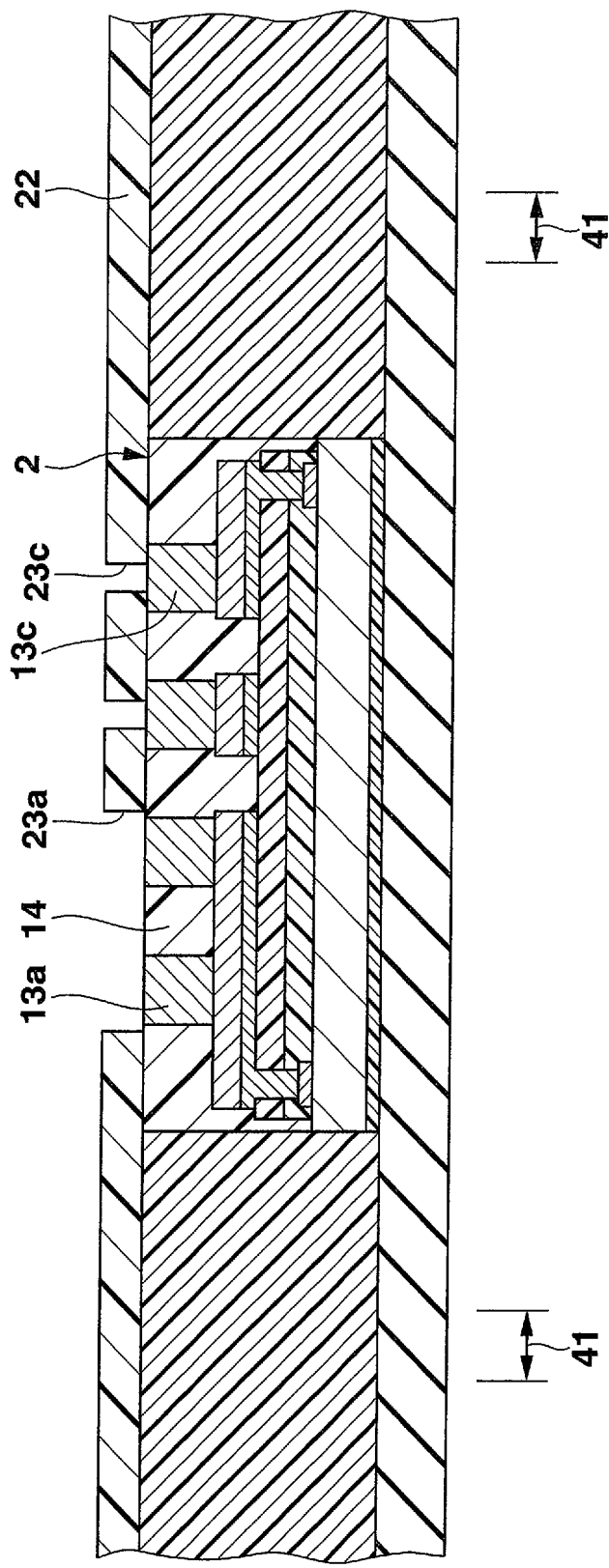
FIG. 32 is a sectional view of a step following FIG. 31.

Then, as shown in FIG. 32, by laser processing to radiate a laser beam, an opening 23a having a square planar shape is formed in a part of the upper insulating film 22 that corresponds to a region of the semiconductor construct 2 having a square planar shape and including the four columnar electrodes 13a. Also, an opening 23c having a circular planar shape is formed in a part of the upper insulating film 22 that corresponds to the center of the upper surface of the columnar electrode 13c of the semiconductor construct 2.

In this state, the upper surface of the sealing film 14 around the columnar electrodes 13a is exposed through the opening 23a having a square planar shape.

Figure 33:
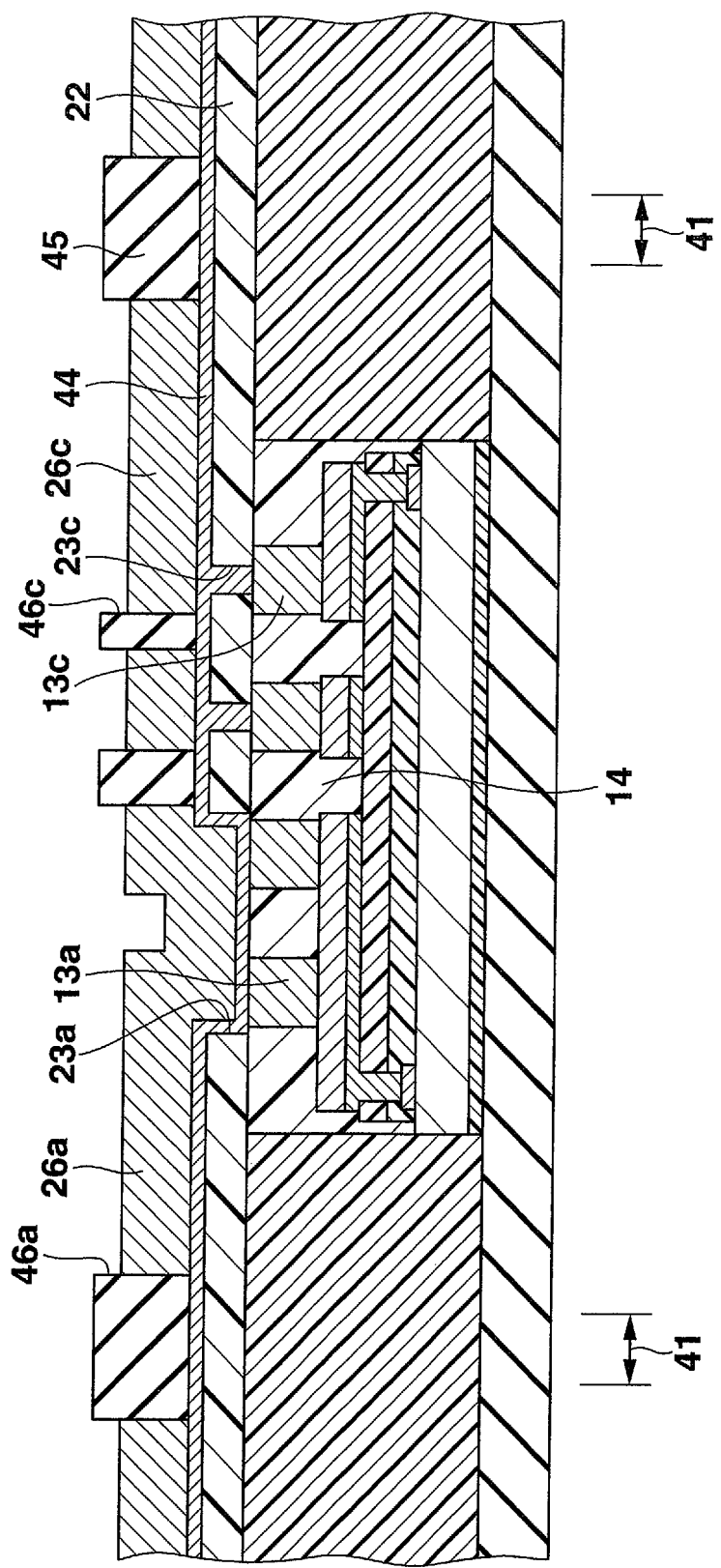
FIG. 33 is a sectional view of a step following FIG. 32.

Then, as shown in FIG. 33, a foundation metal layer 44 is formed on the entire upper surface of the upper insulating film 22 including the upper surfaces of the columnar electrodes 13a and the sealing film 14 of the semiconductor construct 2 that are exposed through the opening 23a of the upper insulating film 22 and including the upper surface of the columnar electrode 13c of the semiconductor construct 2 exposed through the opening 23c of the upper insulating film 22. In this case as well, the foundation metal layer 44 may only be a copper layer formed by electroless plating, may only be a copper layer formed by sputtering, or may be a copper layer formed by sputtering on a thin film layer of, for example, titanium formed by sputtering.

Then, a plating resist film 45 is patterned and formed on the upper surface of the foundation metal layer 44. In this case, openings 46a, 46c are formed in parts of the plating resist film 45 corresponding to regions where upper metal layers 26a, 26c are to be formed. Further, electrolytic plating with copper is carried out using the foundation metal layer 44 as a plating current path, thereby forming the upper metal layers 26a, 26c on the upper surface of the foundation metal layer 44 within the openings 46a, 46c in the plating resist film 45.

Figure 34:
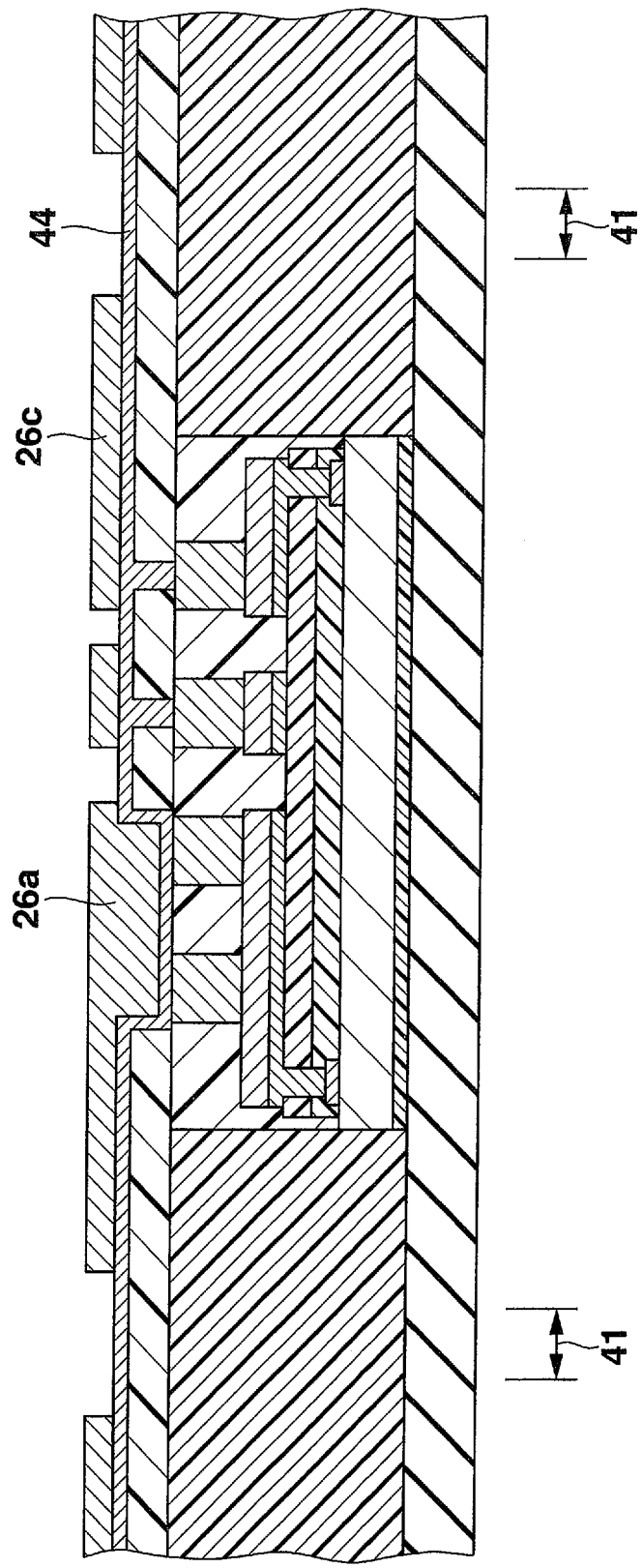
FIG. 34 is a sectional view of a step following FIG. 33.

In this case, since the copper plating is isotropically formed on the upper surface of the foundation metal layer 44, the thinnest portion of the upper metal layer 26a formed on the upper surface of the foundation metal layer 44 within the opening 23a of the upper insulating film 22 is set at a thickness equal to or greater than the thickness of the upper metal layer 26a shown in FIG. 20. Then, the plating resist film 45 is released. Further, the upper side of the upper metal layers 26a, 26c is properly ground so that the upper surfaces of the upper metal layers 26a, 26c may be flush, as shown in FIG. 34.

Figure 35:
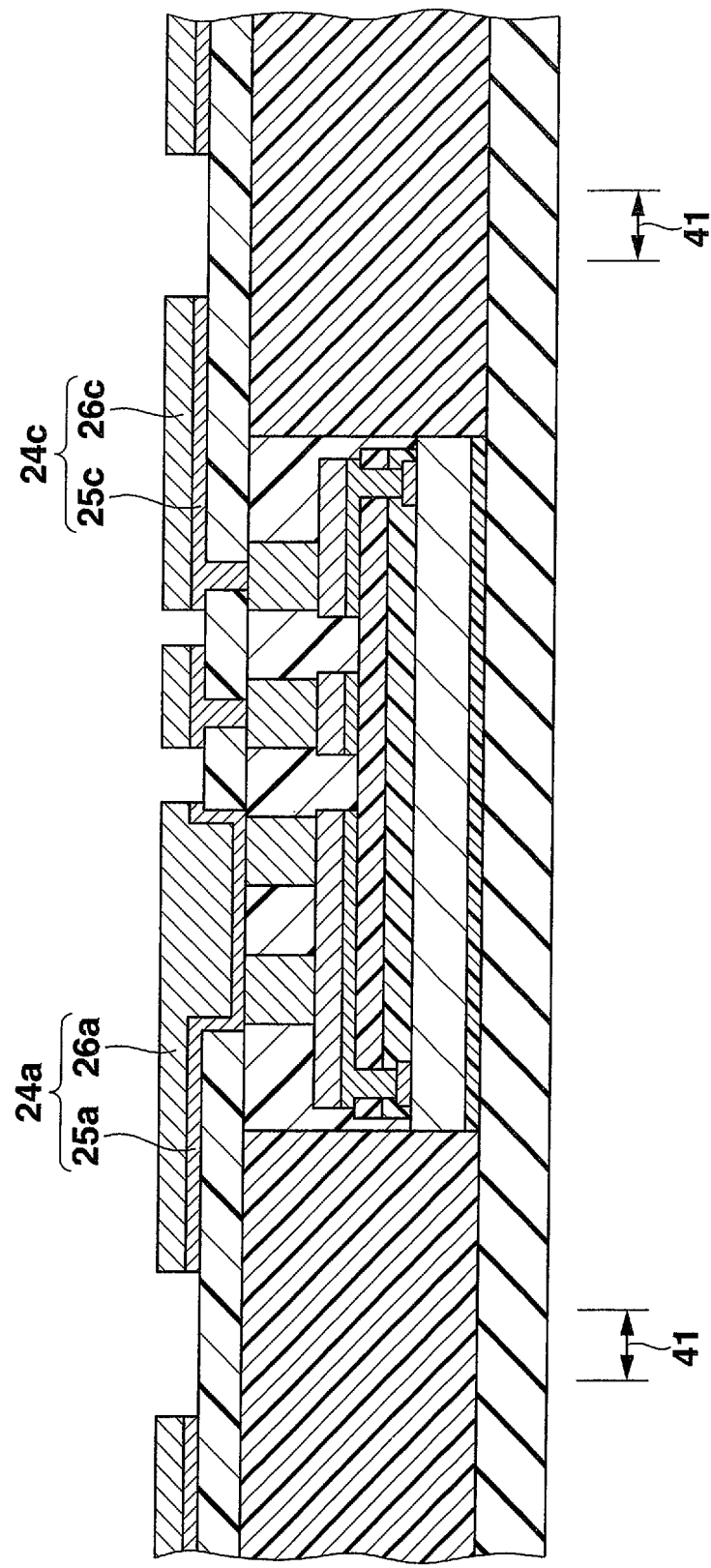
FIG. 35 is a sectional view of a step following FIG. 34.

Then, using the upper metal layers 26a, 26c as masks, the foundation metal layer 44 located in parts other than parts under the upper metal layers 26a, 26c is etched and removed. Thus, as shown in FIG. 35, foundation metal layers 25a, 25c remain under the upper metal layers 26a, 26c alone. In this state, upper wirings 24a, 24c are formed by the upper metal layers 26a, 26c and the foundation metal layers 25a, 25c remaining thereunder.

Figure 36:
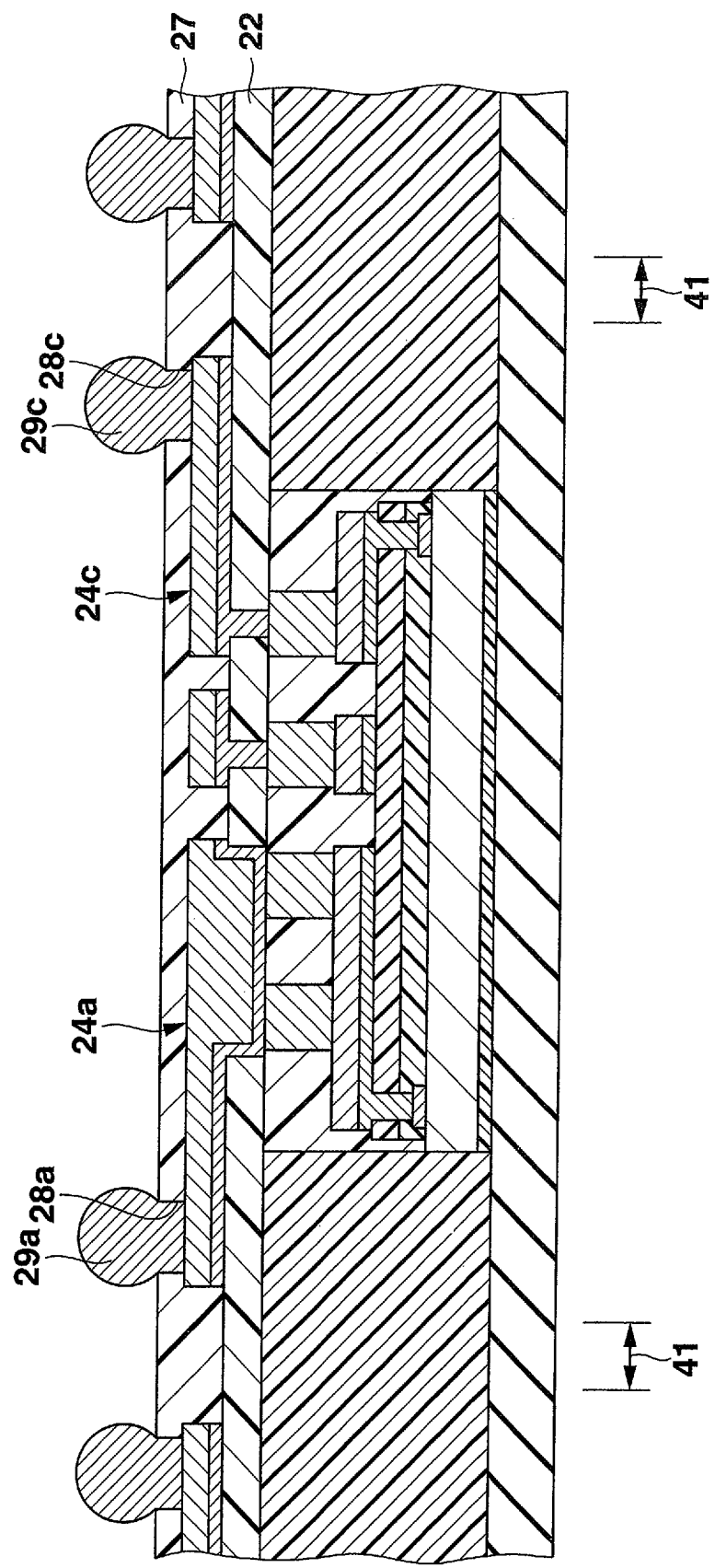
FIG. 36 is a sectional view of a step following FIG. 35.

Then, as shown in FIG. 36, an overcoat film 27 made of, for example, a solder resist is formed by, for example, the screen printing method or spin coat method on the upper surface of the upper insulating film 22 including the upper wirings 24a, 24c. In this case, openings 28a, 28b are formed in parts of the overcoat film 27 that correspond to predetermined four points of the upper surface of the upper wiring 24a and to the connection pad portion of the upper wiring 24c.

Figure 37:
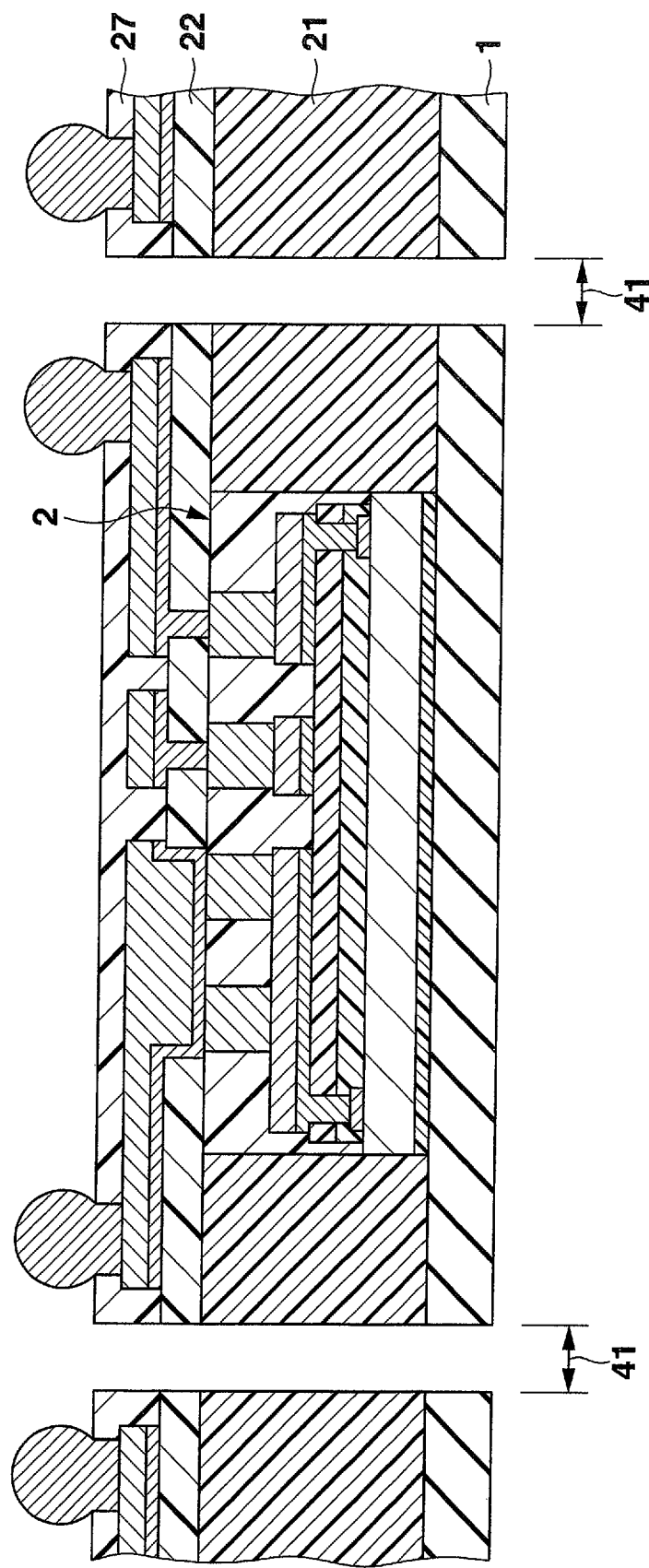
FIG. 37 is a sectional view of a step following FIG. 36.

Then, solder balls 29a, 29c are formed in and above the openings 28a, 28c of the overcoat film 27 so that these solder balls are connected to the predetermined four points of the upper surface of the upper wiring 24a and to the connection pad portion of the upper wiring 24c. Further, as shown in FIG. 37, the overcoat film 27, the upper insulating film 22, the insulating layer 21 and the base plate 1 are cut along the cut lines 41 between adjacent semiconductor constructs 2, thereby obtaining semiconductor devices shown in FIG. 20.

Third Embodiment

Figure 38:
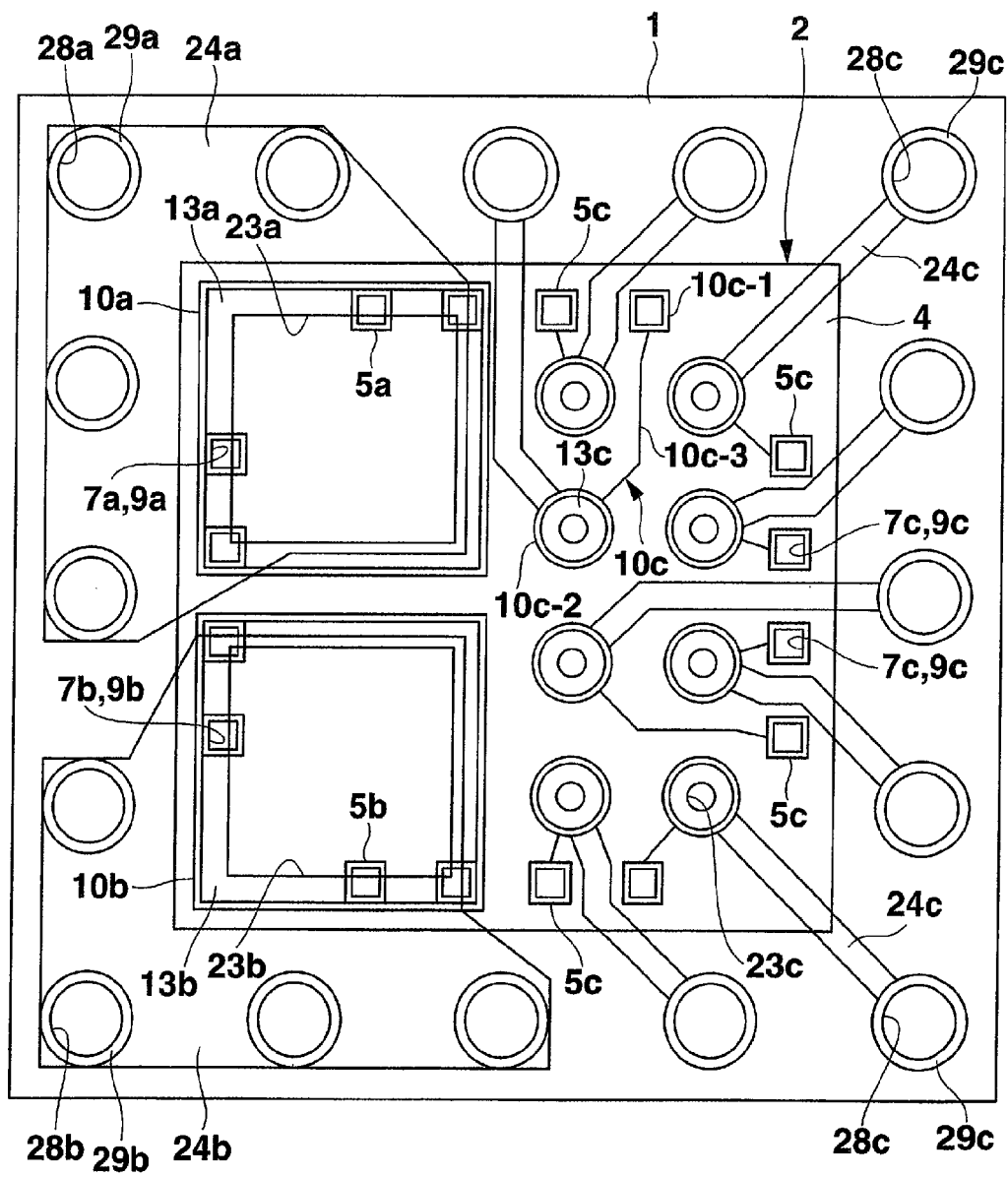
FIG. 38 is a transmitted plan view of a semiconductor device according to a third embodiment of the invention.
Figure 39:
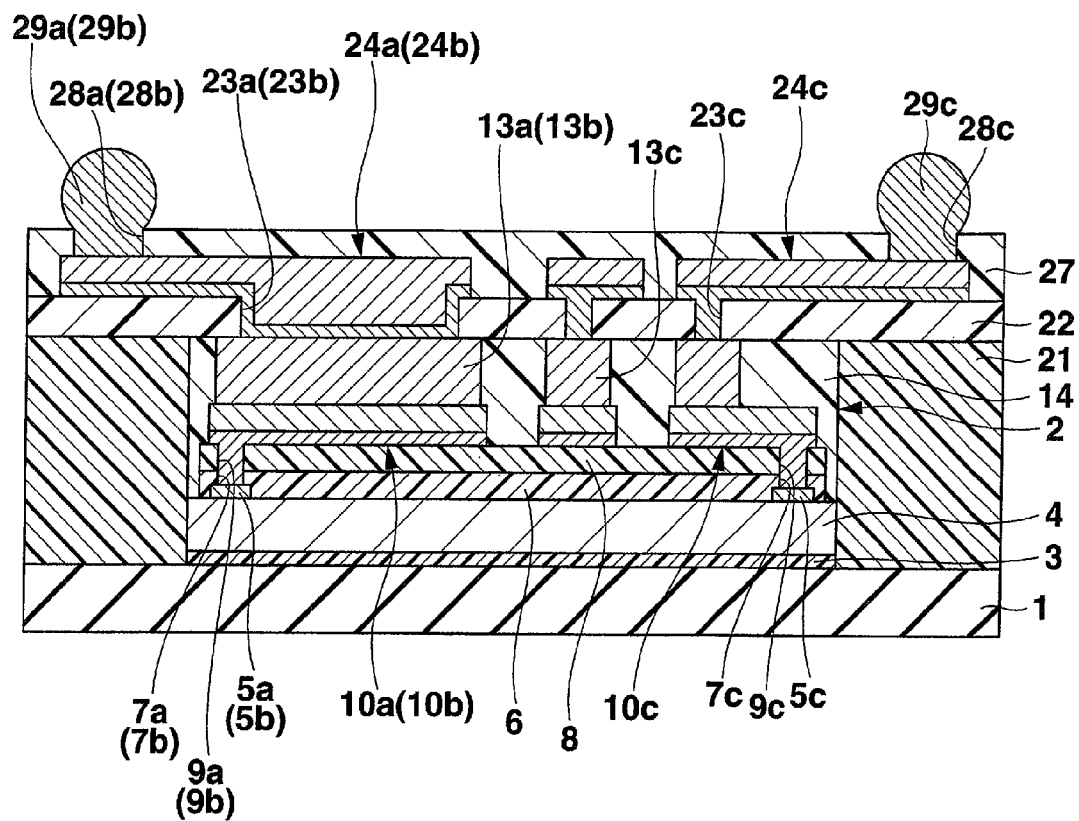
FIG. 39 is a sectional view of a proper part of the semiconductor device shown in FIG. 38.

FIG. 38 shows a transmitted plan view of a semiconductor device according to a third embodiment of the invention. FIG. 39 shows a sectional view of a proper part of the semiconductor device shown in FIG. 38. This semiconductor device is different from the semiconductor device shown in FIG. 19 and FIG. 20 in that, in a semiconductor construct 2, columnar electrodes 13a, 13b having a square planar shape are solidly provided, in similar fashion to power supply voltage and ground voltage wirings that are indicated by the signs 10a, 10b and have a square planar shape, in regions of the upper surfaces of the wirings 10a, 10b except for the peripheral portions thereof.

In this case, openings 23a, 23b of an upper insulating film 22 are provided in parts corresponding to the upper surfaces of the columnar electrodes 13a, 13b except for the peripheral portions thereof. Further, upper wirings 24a, 24b are connected, via the openings 23a, 23b of the upper insulating film 22, to the upper surfaces of the columnar electrodes 13a, 13b except for the peripheral portions thereof.

As described above, since the power supply voltage columnar electrode 13a and the ground voltage columnar electrode 13 of the semiconductor construct 2 are solidly formed in this semiconductor device, the columnar electrodes 13a, 13b can be reduced in resistance, and current capacity can thus be further improved.

Fourth Embodiment

Figure 40:
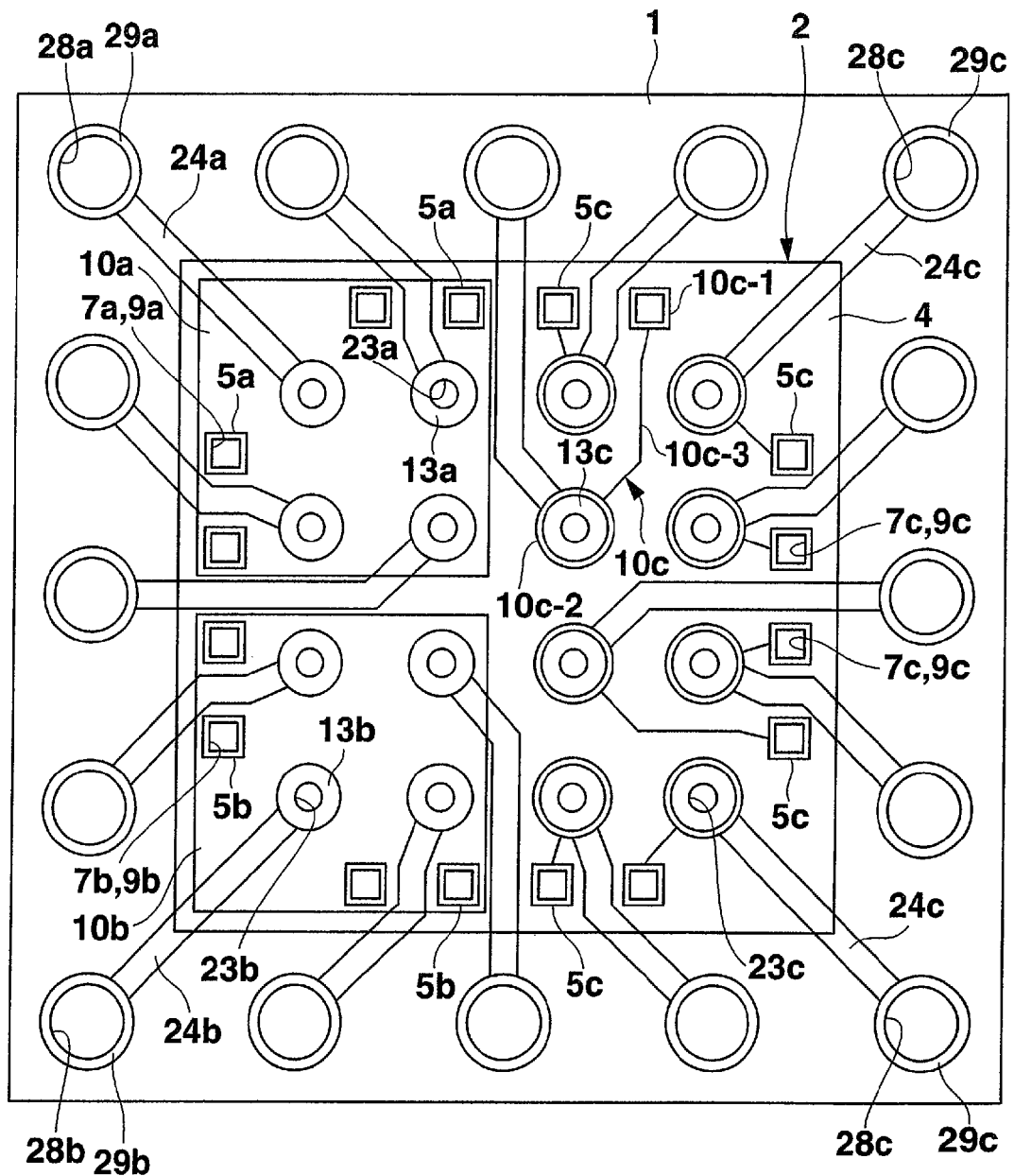
FIG. 40 is a transmitted plan view of a semiconductor device according to a fourth embodiment of the invention.
Figure 41:
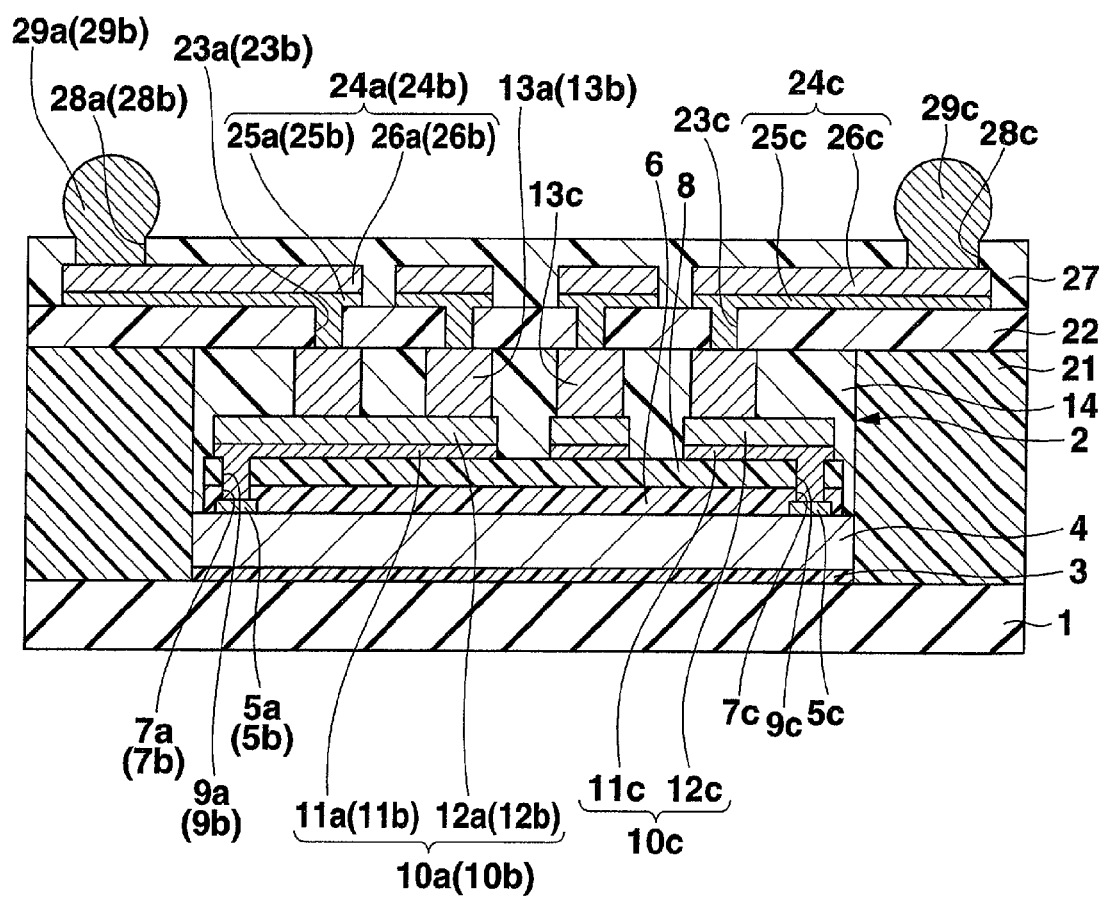
FIG. 41 is a sectional view of a proper part of the semiconductor device shown in FIG. 40.

FIG. 40 shows a transmitted plan view of a semiconductor device according to a fourth embodiment of the invention. FIG. 41 is a sectional view of a proper part of the semiconductor device shown in FIG. 41. This semiconductor device includes a base plate 1. The base plate 1 has a square planar shape, and made of, for example, an epoxy resin containing glass fabric as a base material. The lower surface of a semiconductor construct 2 is bonded to the center of the upper surface of the base plate 1 through a bonding layer 3 made of a die bond material. The semiconductor construct 2 has a square planar shape, and is slightly smaller in size than the base plate 1.

The semiconductor construct 2, which is generally called a CSP, includes a silicon substrate (semiconductor substrate) 4. The lower surface of the silicon substrate 4 is bonded to the center of the upper surface of the base plate 1 through the bonding layer 3. Elements (not shown) such as a transistor, diode, resistor, and condenser that constitute an integrated circuit having a predetermined function are formed on the upper surface of the silicon substrate 4. Connection pads 5a, 5b, 5c are provided on the peripheral portion of the upper surface of the silicon substrate 4. The connection pads 5a, 5b, 5c are made of, for example, an aluminum-based metal, and connected to the elements of the integrated circuit.

Here, by way of example, the four connection pads indicated by the sign 5a and arranged on the upper left part of the silicon substrate 4 in FIG. 40 are for a common power supply voltage. The four connection pads indicated by the sign 5b and arranged on the lower left part of the silicon substrate 4 are for a common ground voltage. The four connection pads indicated by the sign 5c and arranged on the upper right part of the silicon substrate 4 and the four connection pads indicated by the sign 5c and arranged on the lower right part of the silicon substrate 4 are for a normal voltage. Here, in FIG. 41, the ground voltage connection pads 5b and associated parts are substantially similar to the power supply voltage connection pads 5a and associated parts, and are therefore indicated by signs in parentheses.

A passivation film (insulating film) 6 made of, for example, silicon oxide is provided on the upper surface of the silicon substrate 4 except for the peripheral portion of the silicon substrate 4 and the centers of the connection pads 5a, 5b, 5c. The centers of the connection pads 5a, 5b, 5c are exposed through openings 7a, 7b, 7c provided in the passivation film 6. A protective film (insulating film) 8 made of, for example, a polyimide resin is provided on the upper surface of the passivation film 6. Openings 9a, 9b, 9c are provided in parts of the protective film 8 that correspond to the openings 7a, 7b, 7c of the passivation film 6.

Wirings 10a, 10b, 10c are provided on the upper surface of the protective film 8. The wirings 10a, 10b, 10c have a double-layer structure composed of foundation metal layers 11a, 11b, 11c and upper metal layers 12a, 12b, 12c. The foundation metal layers 11a, 11b, 11c are made of, for example, copper and provided on the upper surface of the protective film 8. The upper metal layers 12a, 12b, 12c are made of copper and provided on the upper surfaces of the foundation metal layers 11.

In this case, as shown in FIG. 40, the wiring indicated by the sign 10a (common wiring) is solidly disposed on the upper left part of the silicon substrate 4 in a region that has a square planar shape and includes the four power supply voltage connection pads 5a. The wiring 10a is connected to all of the four power supply voltage connection pads 5a via the openings 7a, 9a of the passivation film 6 and the protective film 8.

The wiring indicated by the sign 10b (common wiring) is solidly disposed on the lower left part of the silicon substrate 4 in a region that has a square planar shape and includes the four ground voltage connection pads 5b. The wiring 10b is connected to all of the four ground voltage connection pads 5b via the openings 7b, 9b of the passivation film 6 and the protective film 8.

The wirings indicated by the sign 10c are disposed in the right region of the silicon substrate 4. Each wiring 10c has a connection portion 10c-1 connected to the normal voltage connection pad 5c via the openings 7c, 9c of the passivation film 6 and the protective film 8, a connection pad portion 10c-2 having a circular planar shape, and an extension line 10c-3 extending between the connection portion 10c-1 and the connection pad portion 10c-2.

Columnar electrodes (common columnar electrodes, first columnar electrodes) 13a made of copper are provided at predetermined four points on the upper surface of the wiring indicated by the sign 10a and having a square planar shape. Columnar electrodes (common columnar electrodes, first columnar electrodes) 13b made of copper are provided at predetermined four points on the upper surface of the wiring indicated by the sign 10b and having a square planar shape. A columnar electrode (second columnar electrode) 13c made of copper is provided on the upper surface of the connection pad portion 10c-2 of the wiring indicated by the sign 10c. Here, as shown in FIG. 40, a total of 16 columnar electrodes 13a, 13b, 13c are arranged in matrix form.

A sealing film 14 made of, for example, an epoxy resin is provided around the columnar electrodes 13a, 13b, 13c on the upper surface of the protective film 8 including the wirings 10a, 10b, 10c. The columnar electrodes 13a, 13b, 13c are provided so that the upper surfaces thereof are flush with or several μm lower than the upper surface of the sealing film 14. The explanation of the structure of the semiconductor construct 2 is completed now.

An insulating layer 21 in a square frame shape is provided on the upper surface of the base plate 1 around the semiconductor construct 2. For example, the insulating layer 21 is made of a thermosetting resin such as an epoxy resin in which a reinforcer of an inorganic material such as silica fuller is dispersed. Alternatively, the insulating layer 21 is only made of a thermosetting resin such as an epoxy resin.

An upper insulating film 22 is provided on the upper surfaces of the semiconductor construct 2 and the insulating layer 21. The upper insulating film 22 is made of, for example, a base glass fabric impregnated with a thermosetting resin such as an epoxy resin. Alternatively, the upper insulating film 22 is only made of a thermosetting resin such as an epoxy resin. Openings 23a, 23b, 23c are provided in parts of the upper insulating film 22 that correspond to the centers of the upper surfaces of the columnar electrodes 13a, 13b, 13c of the semiconductor construct 2.

Upper wirings 24a, 24b, 24c are provided on the upper surface of the upper insulating film 22. The upper wirings 24a, 24b, 24c have a double-layer structure composed of foundation metal layers 25a, 25b, 25c and upper metal layers 26a, 26b, 26c. The foundation metal layers 25a, 25b, 25c are made of, for example, copper and provided on the upper surface of the upper insulating film 22. The upper metal layers 26a, 26b, 26c are made of copper and provided on the upper surfaces of the foundation metal layers 25a, 25b, 25c.

In this case, similarly to the wiring of the semiconductor construct 2 indicated by the sign 10c, each of the upper wirings 24a, 24b, 24c includes a connection portion, a connection pad portion, and an extension line extending therebetween. The connection portions of the upper wirings (common upper wirings, first upper wirings) 24a, 24b are connected to the upper surfaces of the columnar electrodes 13a, 13b of the semiconductor construct 2 via the openings 23a, 23b of the upper insulating film 22. The connection portion of the upper wiring (second upper wiring) 24c is connected to the upper surface of the columnar electrode 13c of the semiconductor construct 2 via the opening 23c of the upper insulating film 22.

An overcoat film 27 made of, for example, a solder resist is provided on the upper surface of the upper insulating film 22 including the upper wirings 24a, 24b, 24c. Openings 28a, 28b, 28c are provided in parts of the overcoat film 27 that correspond to the connection pad portions of the upper wirings 24a, 24b, 24c. Solder balls 29a, 29b, 29c are provided in and above the openings 28a, 28b, 28c so that these solder balls are connected to the connection pad portions of the upper wirings 24a, 24b, 24c. Here, as shown in FIG. 40, the connection pad portions of the upper wirings 24a, 24b, 24c and the solder balls 29a, 29b, 29c are only disposed around the semiconductor construct 2.

As described above, in this semiconductor device, the power supply voltage wiring 10a and the ground voltage wiring 10b of the semiconductor construct 2 are solidly formed in a square planar shape, and each connected to all of the four connection pads 5a, 5b. This allows the power supply voltage wiring 10a and the ground voltage wiring 10b not to be burned off even if an excessively high current runs through these wirings.

Here, the sizes of the parts of this semiconductor device are mentioned. The size of the base plate 1 is 3×3 mm. The size of the semiconductor construct 2 is 2×2 mm. The line width of the extension line 10c-3 of the wiring 10c of the semiconductor construct 2 is 20 μm. The diameter of the columnar electrode 13a, 13b, 13c of the semiconductor construct 2 is 0.2 mm. The pitch of the columnar electrode 13a, 13b, 13c is 0.4 mm. The diameter of the opening 23 of the upper insulating film 22 is 100 μm. The diameter of the connection pad portion of the upper wiring is 0.3 mm. The pitch of the connection pad portion of the upper wiring is 0.65 mm.

In the meantime, since the base plate 1 is greater in size than the semiconductor construct 2, even if the extension line 10c-3 of the normal voltage wiring 10c of the semiconductor construct 2 has a relatively small line width of 20 μm, the extension line of the upper wiring 24a, 24b, 24c can have a relatively great line width of about 100 μm. This makes it possible to prevent the power supply voltage upper wiring 24a and the ground voltage upper wiring 24b from being easily burned off even if an excessively high current runs through these upper wirings.

Now, one example of a method of manufacturing this semiconductor device is described. First, one example of a method of manufacturing the semiconductor construct 2 is described. In this case, the ground voltage connection pad 5b and associated parts are substantially similar to the power supply voltage connection pads 5a and associated parts, and are therefore not described.

Figure 42:
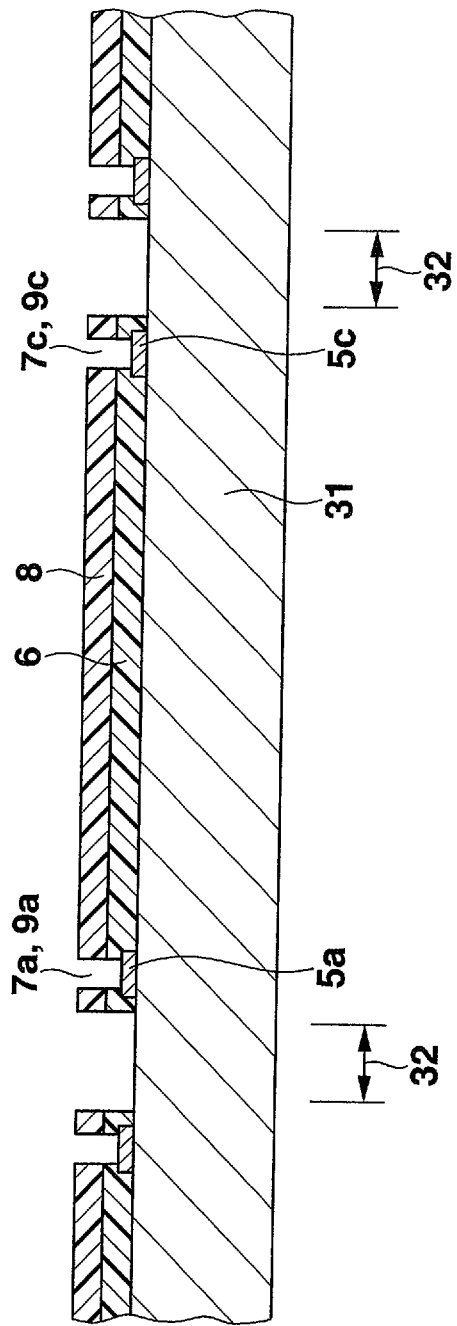
FIG. 42 is a sectional view of an initially prepared assembly in one example of a method of manufacturing the semiconductor device shown in FIG. 40 and FIG. 41.

First, as shown in FIG. 42, an assembly is prepared. In this assembly, connection pads 5a, 5c, a passivation film 6 and a protective film 8 are formed on the upper surface of a silicon substrate in a wafer state (hereinafter referred to as a semiconductor wafer 31). Further, the centers of the connection pads 5a, 5c are exposed through openings 7a, 7c of the passivation film 6 and through openings 9a, 9c of the protective film 8.

In this case, the thickness of the semiconductor wafer 31 is greater than the thickness of a silicon substrate 4 shown in FIG. 41. In FIG. 42, zones indicated by the sign 32 are dicing streets. The parts of the passivation film 6 and the protective film 8 corresponding to the dicing street 32 and both its sides are removed.

Figure 43:
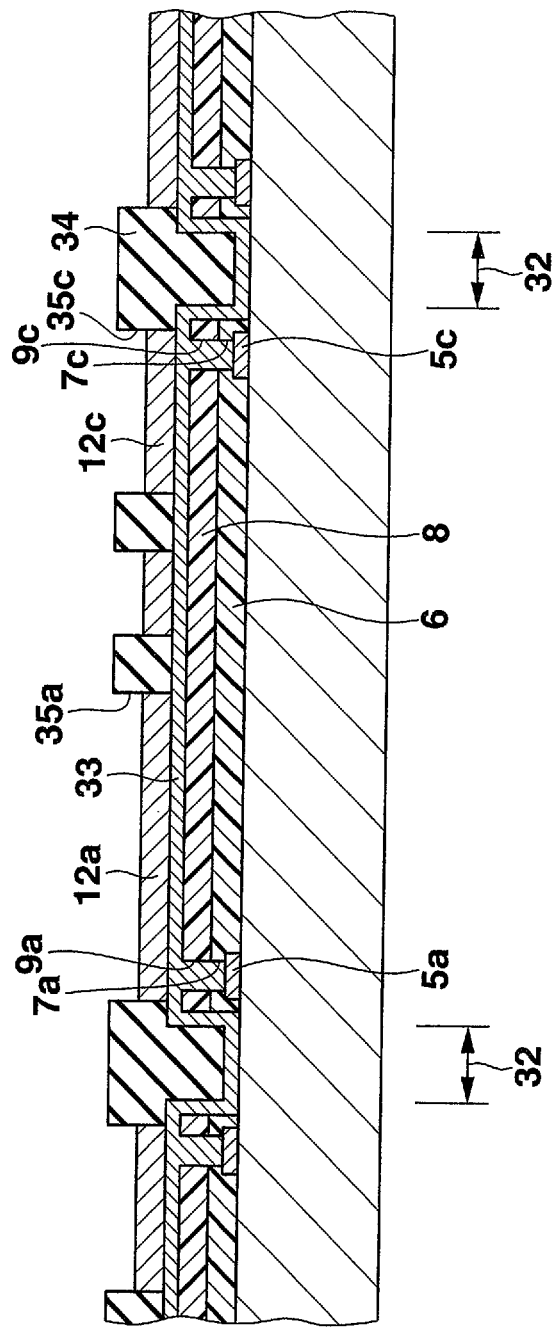
FIG. 43 is a sectional view of a step following FIG. 42.

Then, as shown in FIG. 43, a foundation metal layer 33 is formed on the entire upper surface of the protective film 8 including the upper surfaces of the connection pads 5a, 5c exposed through openings 7a, 7c of the passivation film 6 and through openings 9a, 9c of the protective film 8. In this case, the foundation metal layer 33 may only be a copper layer formed by electroless plating, may only be a copper layer formed by sputtering, or may be a copper layer formed by sputtering on a thin film layer of, for example, titanium formed by sputtering.

Then, a plating resist film 34 made of a positive liquid resist is patterned and formed on the upper surface of the foundation metal layer 33. In this case, openings 35a, 35c are formed in parts of the plating resist film 34 corresponding to regions where upper metal layers 12a, 12c are to be formed. Further, electrolytic plating with copper is carried out using the foundation metal layer 33 as a plating current path, thereby forming the upper metal layers 12a, 12c on the upper surface of the foundation metal layer 33 within the openings 35a, 35c in the plating resist film 34. Subsequently, the plating resist film 34 is released.

Figure 44:
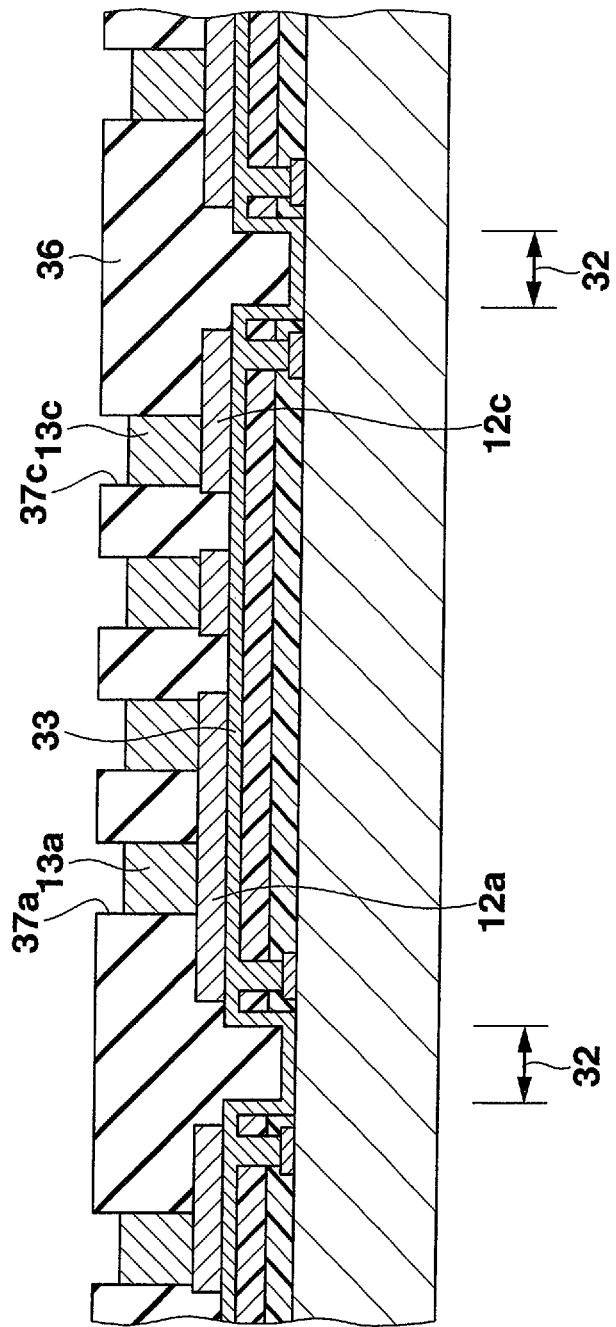
FIG. 44 is a sectional view of a step following FIG. 43.

Then, as shown in FIG. 44, a plating resist film 36 made of a negative dry film resist is patterned and formed on the upper surface of the foundation metal layer 33. In this case, openings 37a, 37c are formed in parts of the plating resist film 36 corresponding to predetermined four points of the upper metal layer 12a (a region where a columnar electrode 13a is to be formed) and corresponding to the connection pad portion of the upper metal layer 12c (a region where a columnar electrode 13c is to be formed).

Then, electrolytic plating with copper is carried out using the foundation metal layer 33 as a plating current path. As a result, the columnar electrodes 13a, 13c are formed on the upper surface of the upper metal layer 12a within the openings 37a in the plating resist film 36 and on the upper surface of the connection pad portion of the upper metal layer 12c within the openings 37c in the plating resist film 36. Subsequently, the plating resist film 36 is released.

Figure 45:
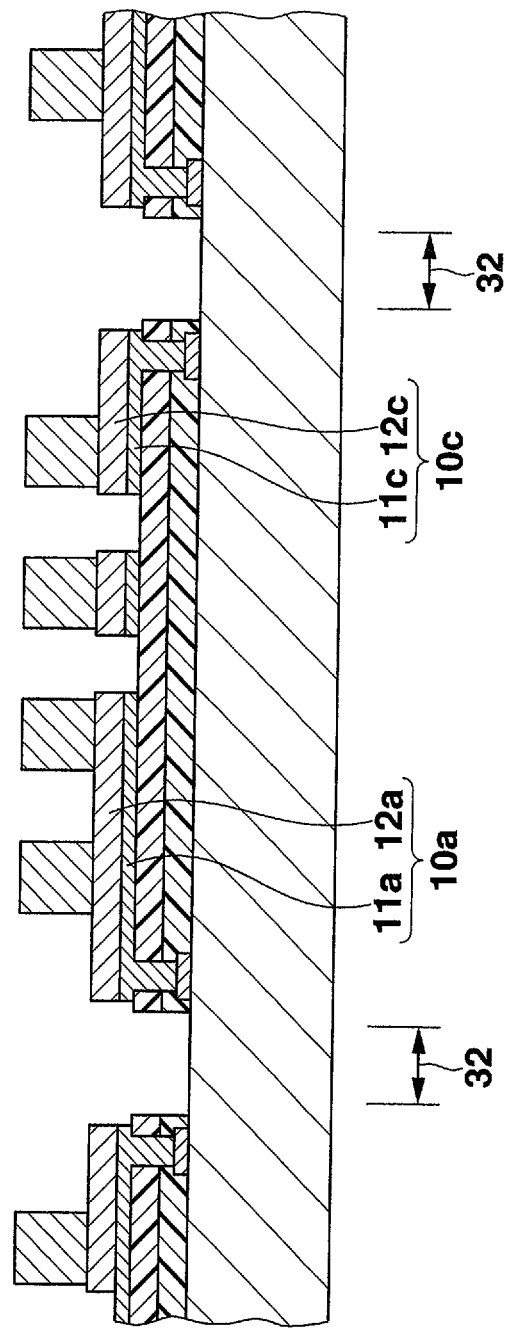
FIG. 45 is a sectional view of a step following FIG. 44.

Then, using the upper metal layers 12a, 12c as masks, the foundation metal layer 33 located in parts other than parts under the upper metal layers 12a, 12c is etched and removed. Thus, as shown in FIG. 45, foundation metal layers 11a, 11c remain under the upper metal layers 12a, 12c alone. In this state, wirings 10a, 10c having a double-layer structure are formed by the upper metal layers 12a, 12c and the foundation metal layers 11a, 11c remaining thereunder.

Figure 46:
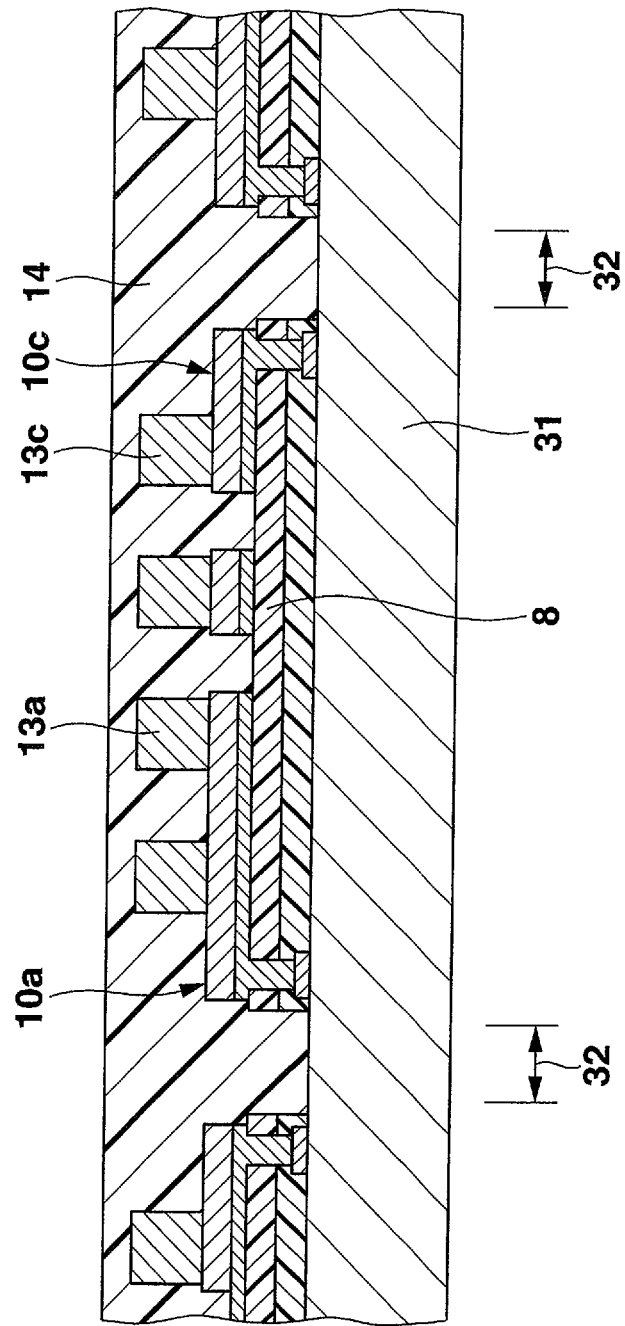
FIG. 46 is a sectional view of a step following FIG. 45.

Then, as shown in FIG. 46, a sealing film 14 made of, for example, an epoxy resin is formed by, for example, the spin coat method on the upper surface of the semiconductor wafer 31 corresponding to the dicing street 32 and both its sides and on the upper surface of the protective film 8 including the wirings 10a, 10c and the columnar electrodes 13a, 13c so that the thickness of this sealing film 14 is slightly greater than the height of the columnar electrodes 13a, 13c. Thus, in this state, the upper surfaces of the columnar electrodes 13a, 13c are covered with the sealing film 14.

Figure 47:
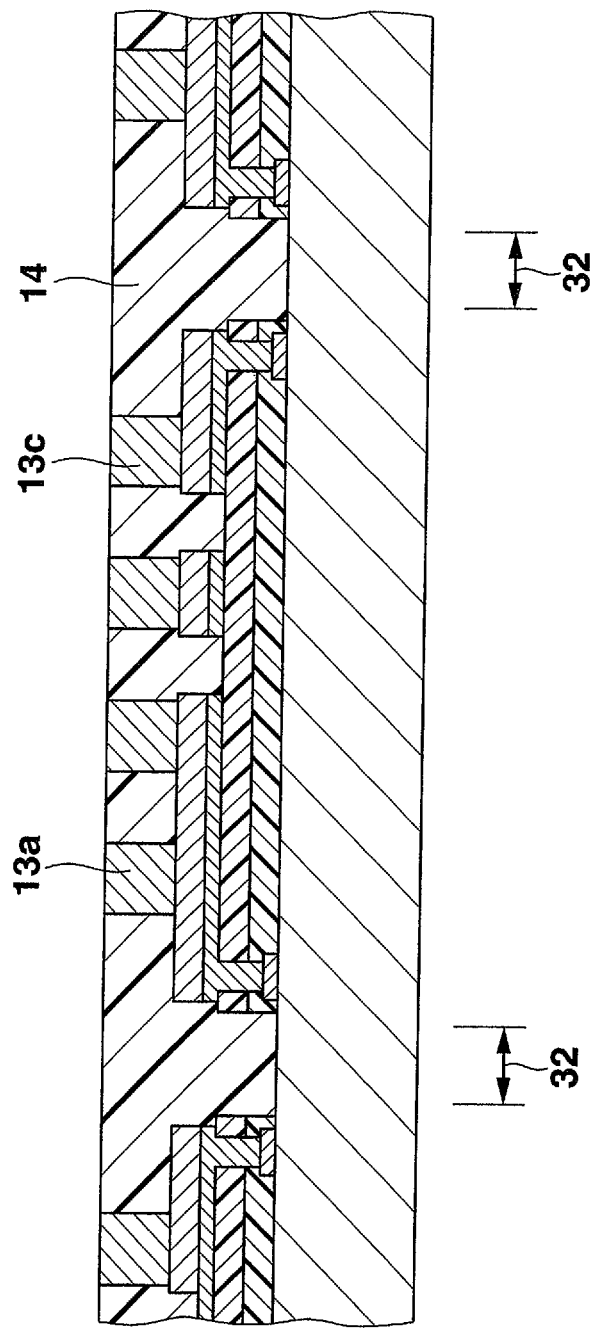
FIG. 47 is a sectional view of a step following FIG. 46.
Figure 48:
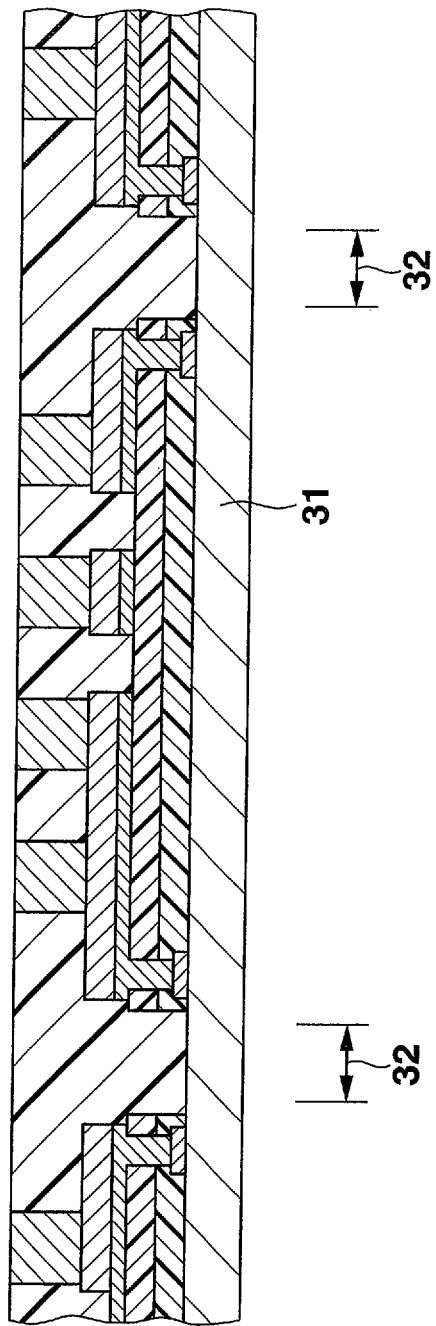
FIG. 48 is a sectional view of a step following FIG. 47.

Then, the upper side of the sealing film 14 is properly ground to expose the upper surfaces of the columnar electrodes 13a, 13c as shown in FIG. 47, and the upper surface of the sealing film 14 including the exposed upper surfaces of the columnar electrodes 13a, 13c is planarized. Further, as shown in FIG. 48, the lower side of the semiconductor wafer 31 is properly ground to reduce the thickness of the semiconductor wafer 31.

Figure 49:
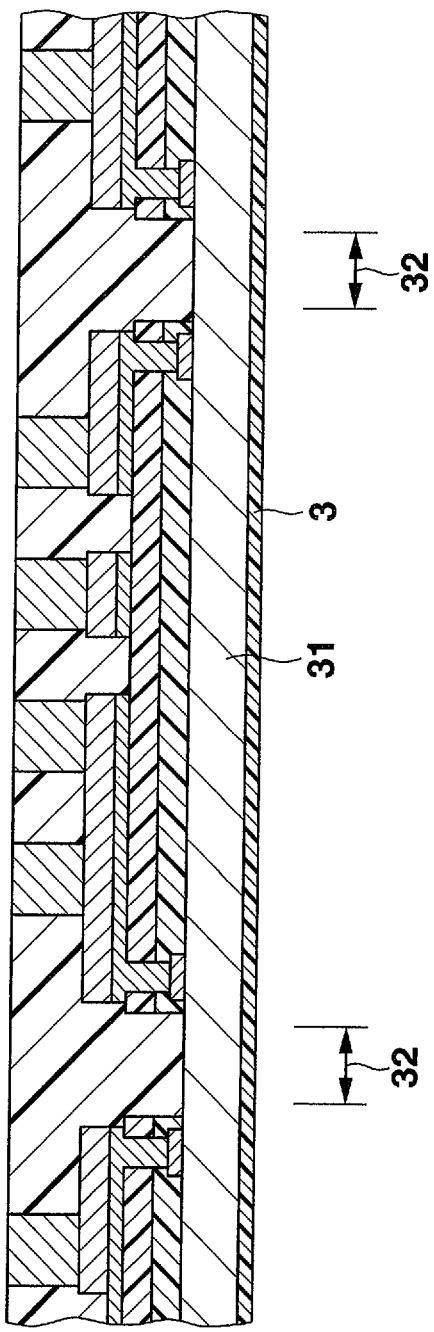
FIG. 49 is a sectional view of a step following FIG. 48.

Then, as shown in FIG. 49, a bonding layer 3 is bonded to the lower surface of the semiconductor wafer 31. The bonding layer 3 is made of a die bond material such as an epoxy resin, and is fixedly attached in a semi-cured state by heating and pressurization to the lower surface of the semiconductor wafer 31. Further, as shown in FIG. 50, the sealing film 14, the semiconductor wafer 31 and the bonding layer 3 are cut along the dicing streets 32, thereby obtaining semiconductor constructs 2 having the bonding layers 3 on the lower surface.

Figure 50:
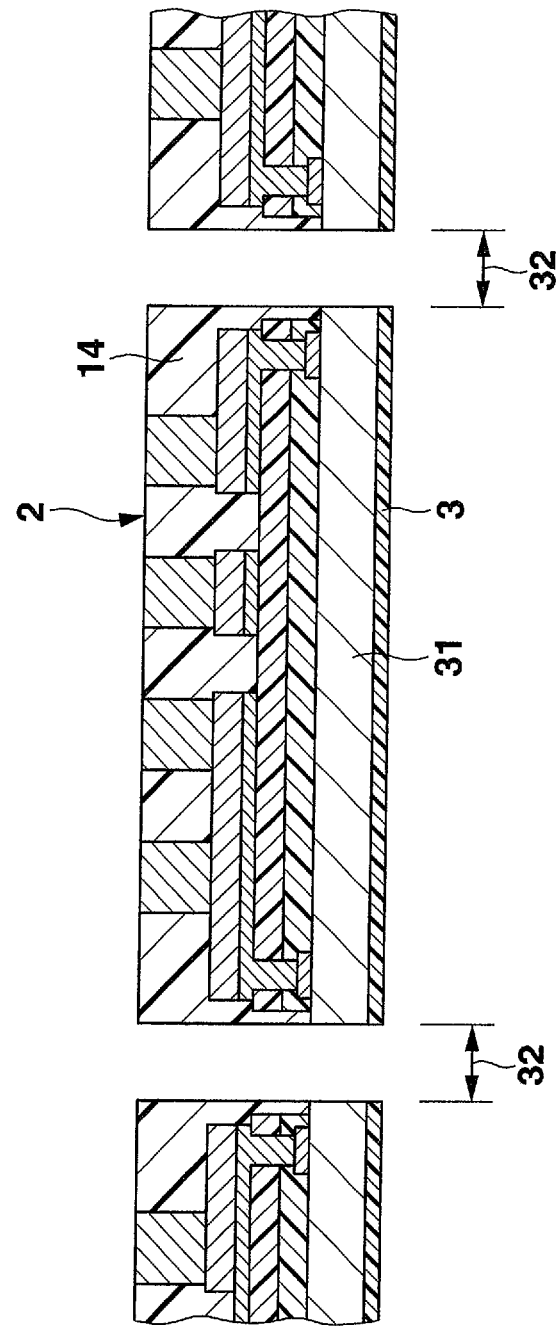
FIG. 50 is a sectional view of a step following FIG. 49.

Now, one example of how to manufacture the semiconductor device shown in FIG. 41 using the semiconductor construct 2 shown in FIG. 50 is described. In this case as well, parts associated with the ground voltage connection pad 5b are substantially similar to parts associated with the power supply voltage connection pads 5a, and are therefore not described.

Figure 51:
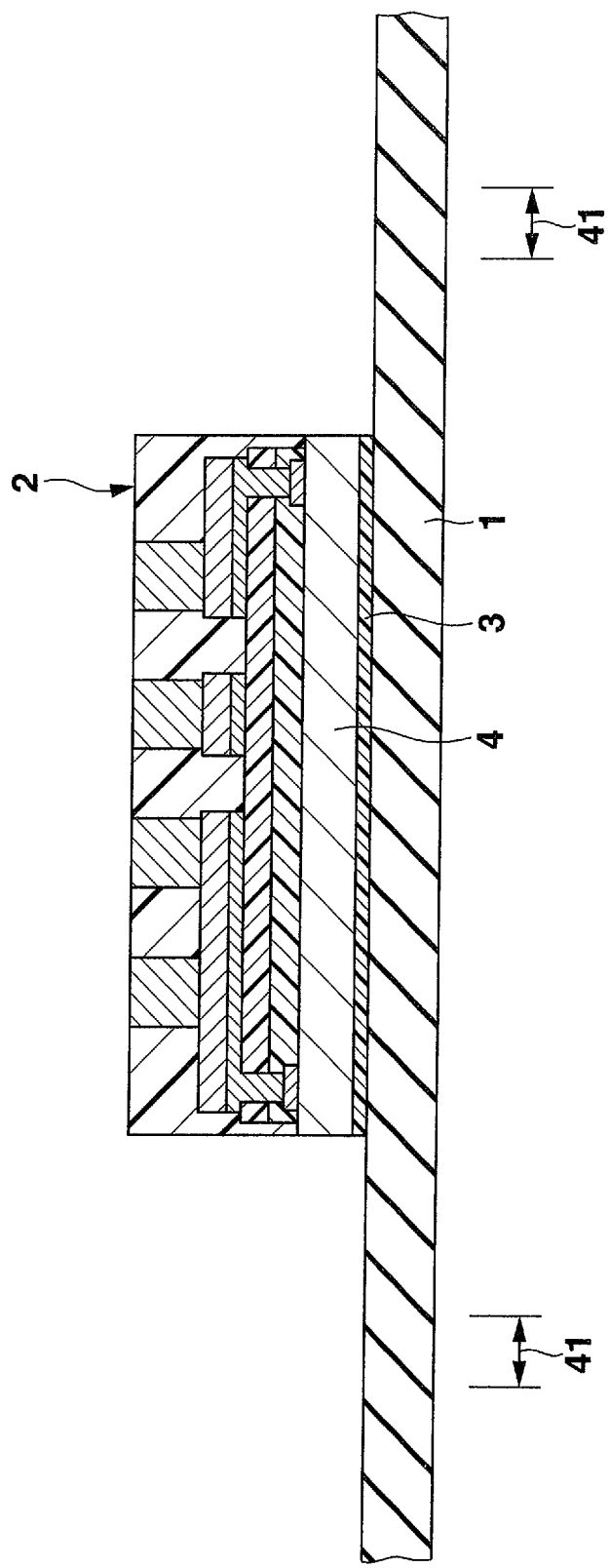
FIG. 51 is a sectional view of a step following FIG. 50.

First, as shown in FIG. 51, a base plate 1 is prepared. This base plate 1 is made of, for example, an epoxy resin containing glass fabric as a base material, and has an area that allows the completed semiconductor devices shown in FIG. 41 to be formed thereon. For example, the base plate 1 has, but not exclusively, a square planar shape. In addition, zones indicated by the sign 41 in FIG. 51 correspond to cut lines for division.

Then, the bonding layers 3 fixedly attached to the lower surfaces of the silicon substrates 4 of the semiconductor constructs 2 are bonded to semiconductor construct placement regions on the upper surface of the base plate 1 to leave space in between. In this bonding, the bonding layers 3 are fully cured by heating and pressurization.

Figure 52:
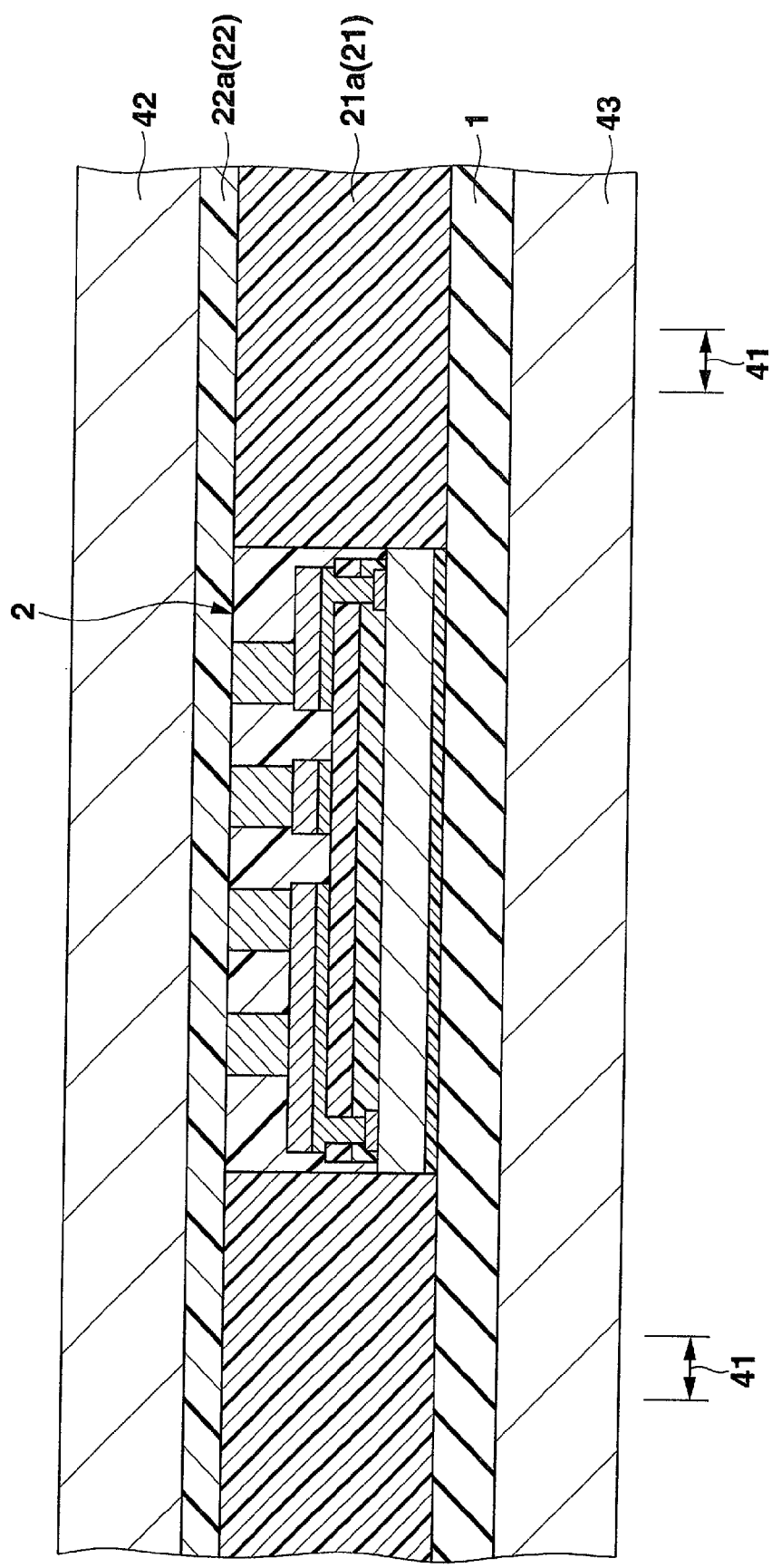
FIG. 52 is a sectional view of a step following FIG. 51.

Then, as shown in FIG. 52, a lattice-shaped insulating layer formation sheet 21a is positioned by, for example, pins and thus disposed on the upper surface of the base plate 1 around the semiconductor construct 2. The lattice-shaped insulating layer formation sheet 21a is prepared by dispersing a reinforcer in a thermosetting resin such as an epoxy resin, semi-curing the thermosetting resin into a sheet form, and forming square holes in the sheet by, for example, punching.

Then, an upper insulating film formation sheet 22a is disposed on the upper surfaces of the semiconductor construct 2 and the insulating layer formation sheet 21a. The upper insulating film formation sheet 22a is prepared by impregnating, for example, glass fabric with a thermosetting resin such as an epoxy resin, and semi-curing the thermosetting resin into a sheet form.

Then, the insulating layer formation sheet 21a and the upper insulating film formation sheet 22a are heated and pressurized from the top and bottom using a pair of heating/pressurization plates 42, 43. By subsequent cooling, an insulating layer 21 in a square frame shape is formed on the upper surface of the base plate 1 around the semiconductor construct 2, and an upper insulating film 22 is formed on the upper surfaces of the semiconductor construct 2 and the insulating layer 21. In this case, the upper surface of the upper insulating film 22 is pressed by the lower surface of the upper heating/pressurization plate 42, and is therefore a flat surface.

Figure 53:
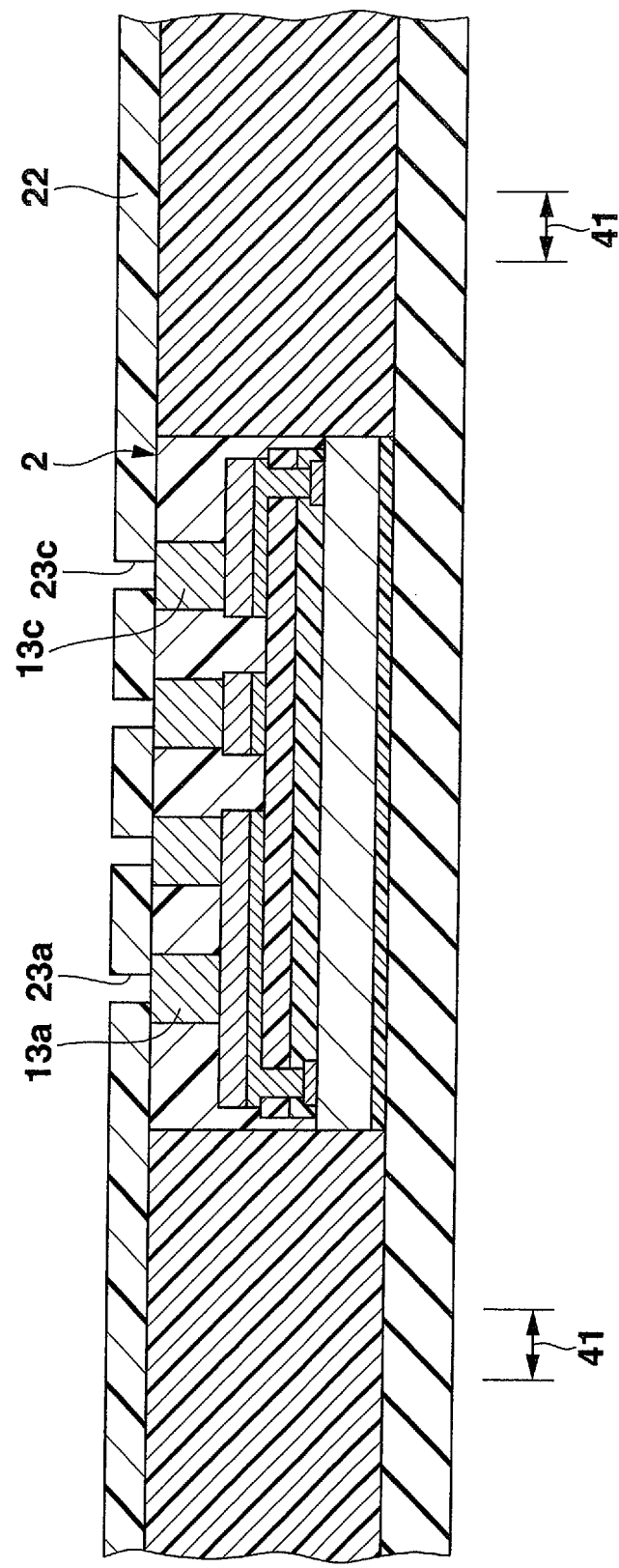
FIG. 53 is a sectional view of a step following FIG. 52.

Then, as shown in FIG. 53, by laser processing to radiate a laser beam, openings 23a, 23c are formed in parts of the upper insulating film 22 that correspond to the centers of the upper surfaces of the columnar electrodes 13a, 13c of the semiconductor construct 2.

Figure 54:
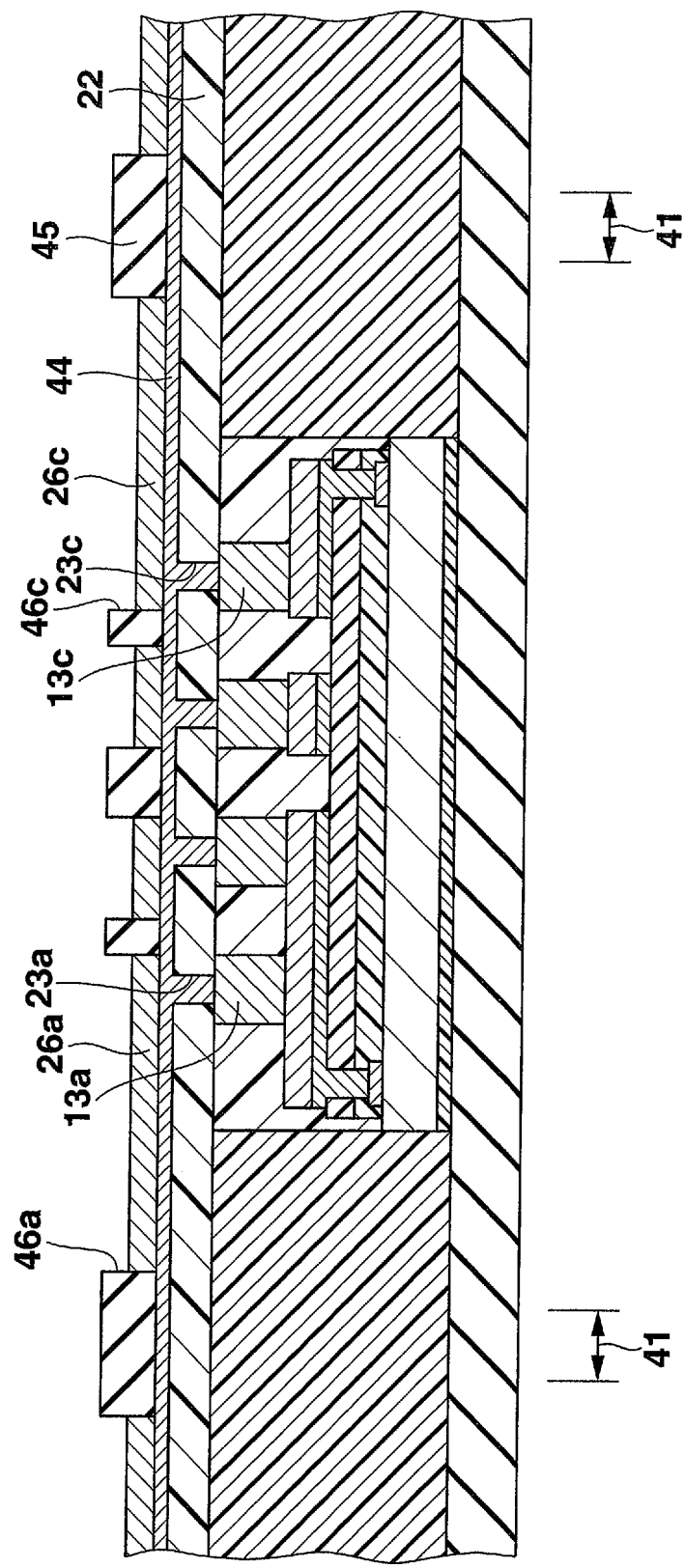
FIG. 54 is a sectional view of a step following FIG. 53.

Then, as shown in FIG. 54, a foundation metal layer 44 is formed on the entire upper surface of the upper insulating film 22 including the upper surfaces of the columnar electrodes 13a, 13c of the semiconductor construct 2 that are exposed through the openings 23a, 23c of the upper insulating film 22. In this case as well, the foundation metal layer 44 may only be a copper layer formed by electroless plating, may only be a copper layer formed by sputtering, or may be a copper layer formed by sputtering on a thin film layer of, for example, titanium formed by sputtering.

Then, a plating resist film 45 is patterned and formed on the upper surface of the foundation metal layer 44. In this case, openings 46a, 46c are formed in parts of the plating resist film 45 corresponding to regions where upper metal layers 26a, 26c are to be formed. Further, electrolytic plating with copper is carried out using the foundation metal layer 44 as a plating current path, thereby forming the upper metal layers 26a, 26c on the upper surface of the foundation metal layer 44 within the openings 46a, 46c in the plating resist film 45.

Figure 55:
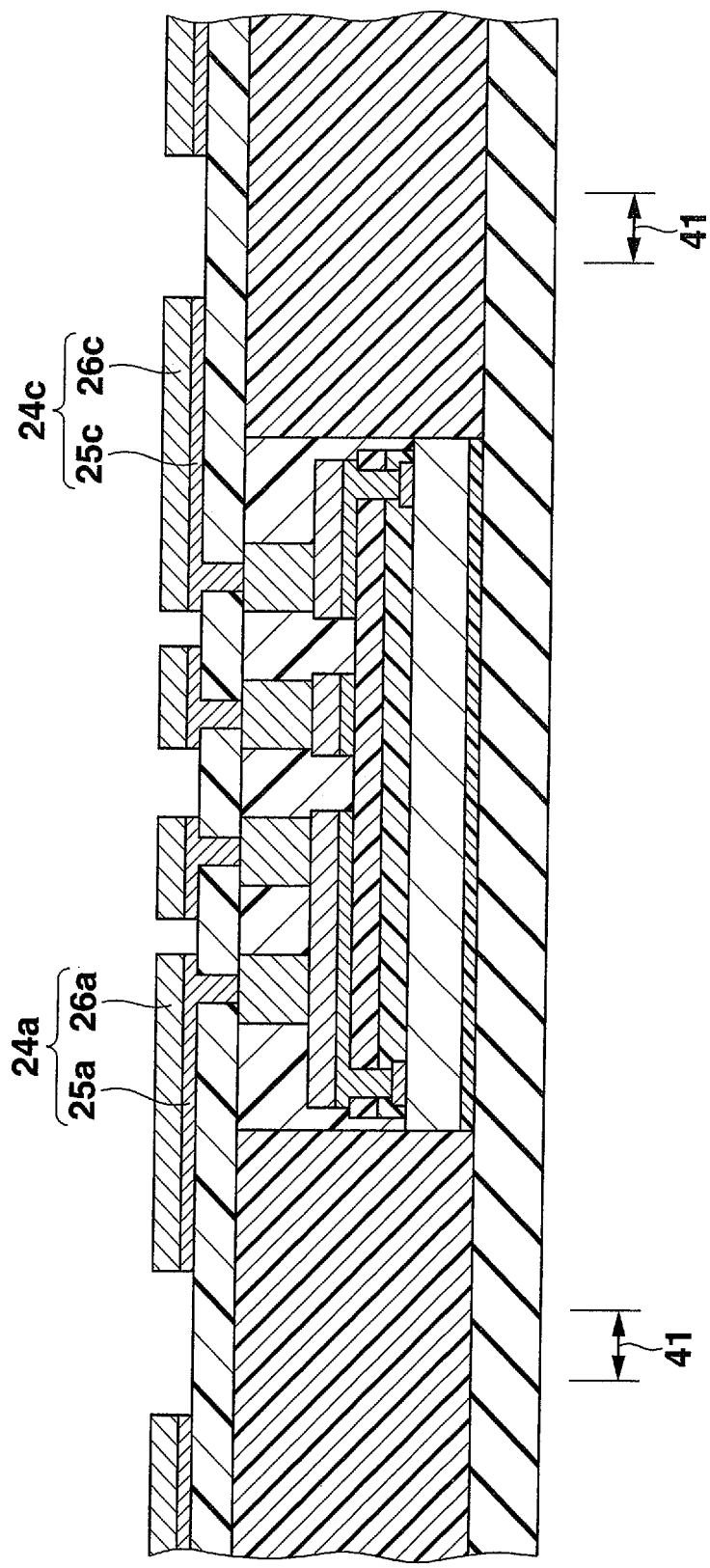
FIG. 55 is a sectional view of a step following FIG. 54.

Then, the plating resist film 45 is released. Further, using the upper metal layers 26a, 26c as masks, the foundation metal layer 44 located in parts other than parts under the upper metal layers 26a, 26c is etched and removed. Thus, as shown in FIG. 55, foundation metal layers 25a, 25c remain under the upper metal layers 26a, 26c alone. In this state, upper wirings 24a, 24b are formed by the upper metal layers 26a, 26c and the foundation metal layers 25a, 25c remaining thereunder.

Figure 56:
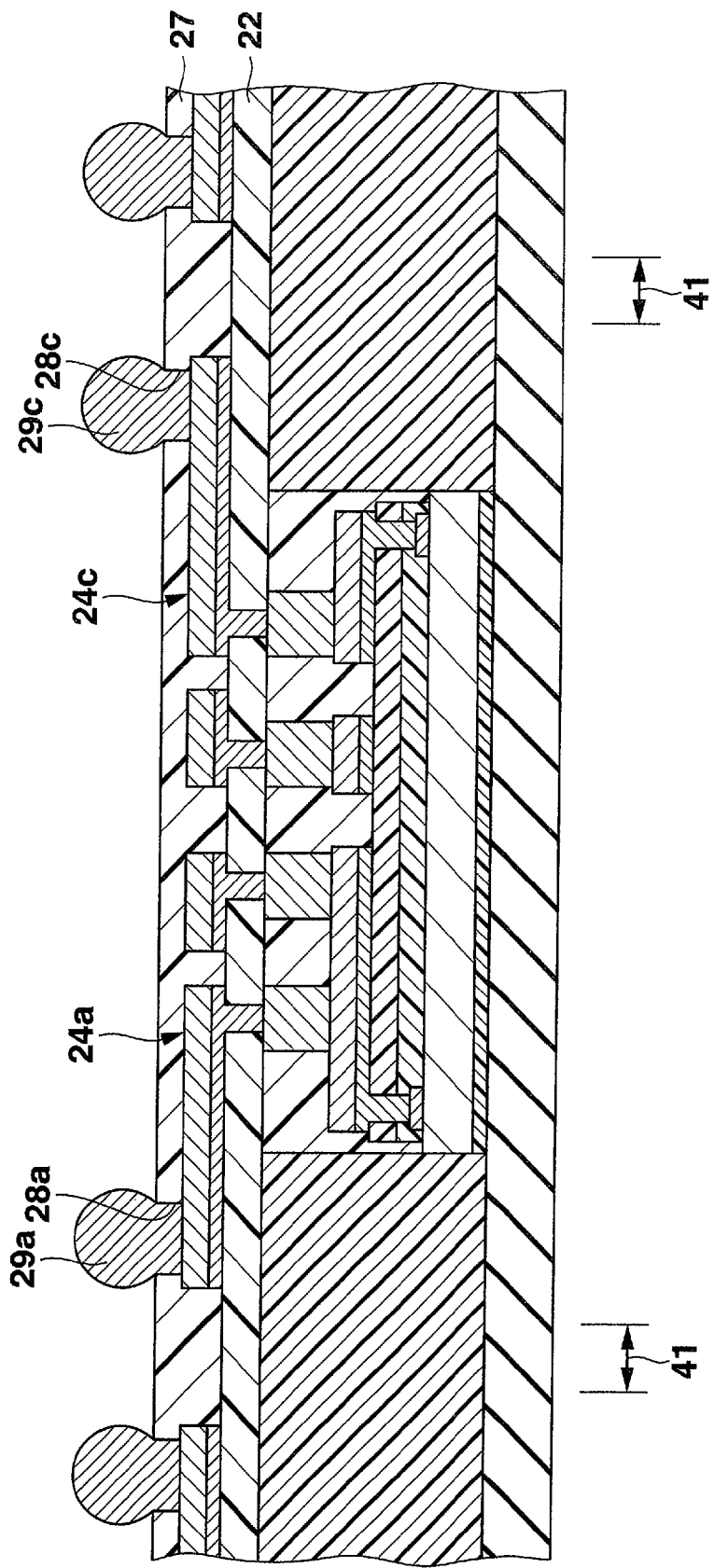
FIG. 56 is a sectional view of a step following FIG. 55.

Then, as shown in FIG. 56, an overcoat film 27 made of, for example, a solder resist is formed by, for example, the screen printing method or spin coat method on the upper surface of the upper insulating film 22 including the upper wirings 24a, 24c. In this case, openings 28a, 28c are formed in parts of the overcoat film 27 that correspond to the connection pad portions of the upper wirings 24a, 24c.

Figure 57:
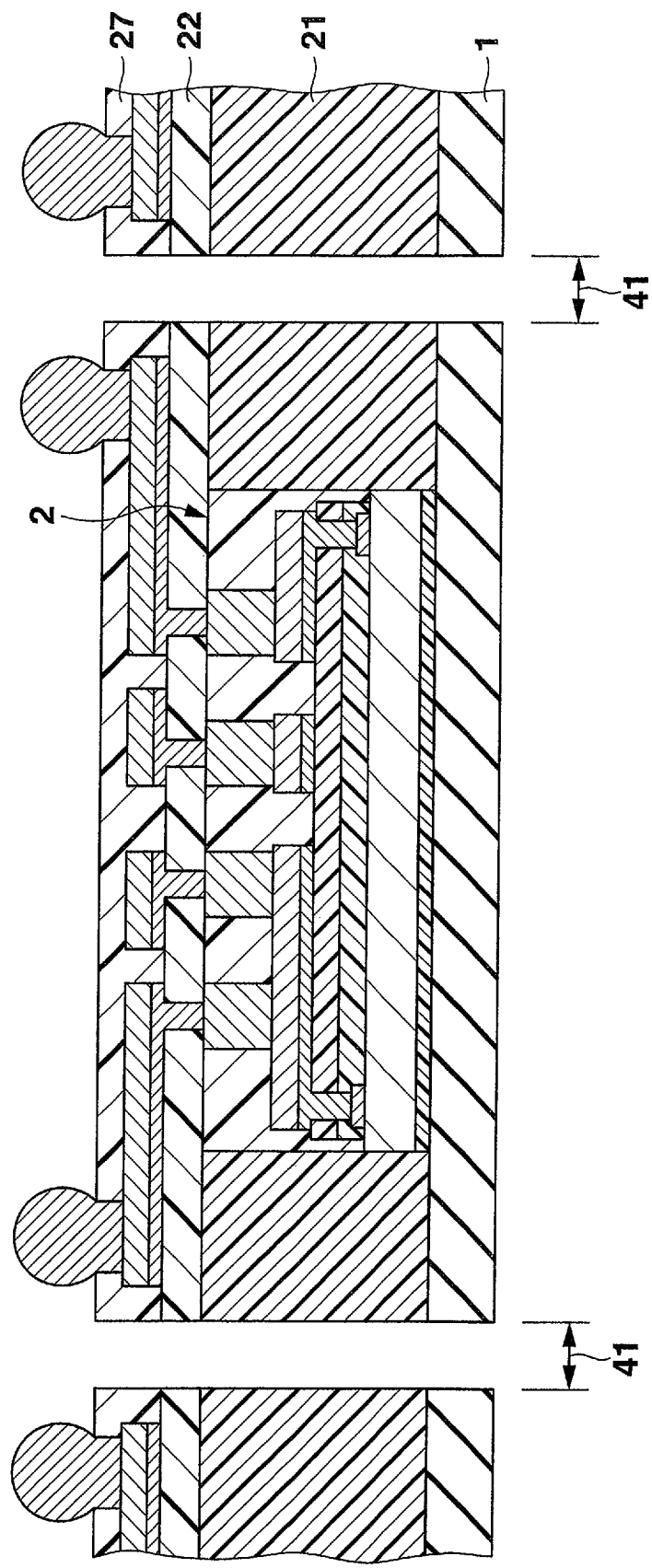
FIG. 57 is a sectional view of a step following FIG. 56.

Then, solder balls 29a, 29c are formed in and above the openings 28a, 28c of the overcoat film 27 so that these solder balls are connected to the connection pad portions of the upper wirings 24a, 24c. Further, as shown in FIG. 57, the overcoat film 27, the upper insulating film 22, the insulating layer 21 and the base plate 1 are cut along the cut lines 41 between adjacent semiconductor constructs 2, thereby obtaining semiconductor devices shown in FIG. 41.

Fifth Embodiment

Figure 58:
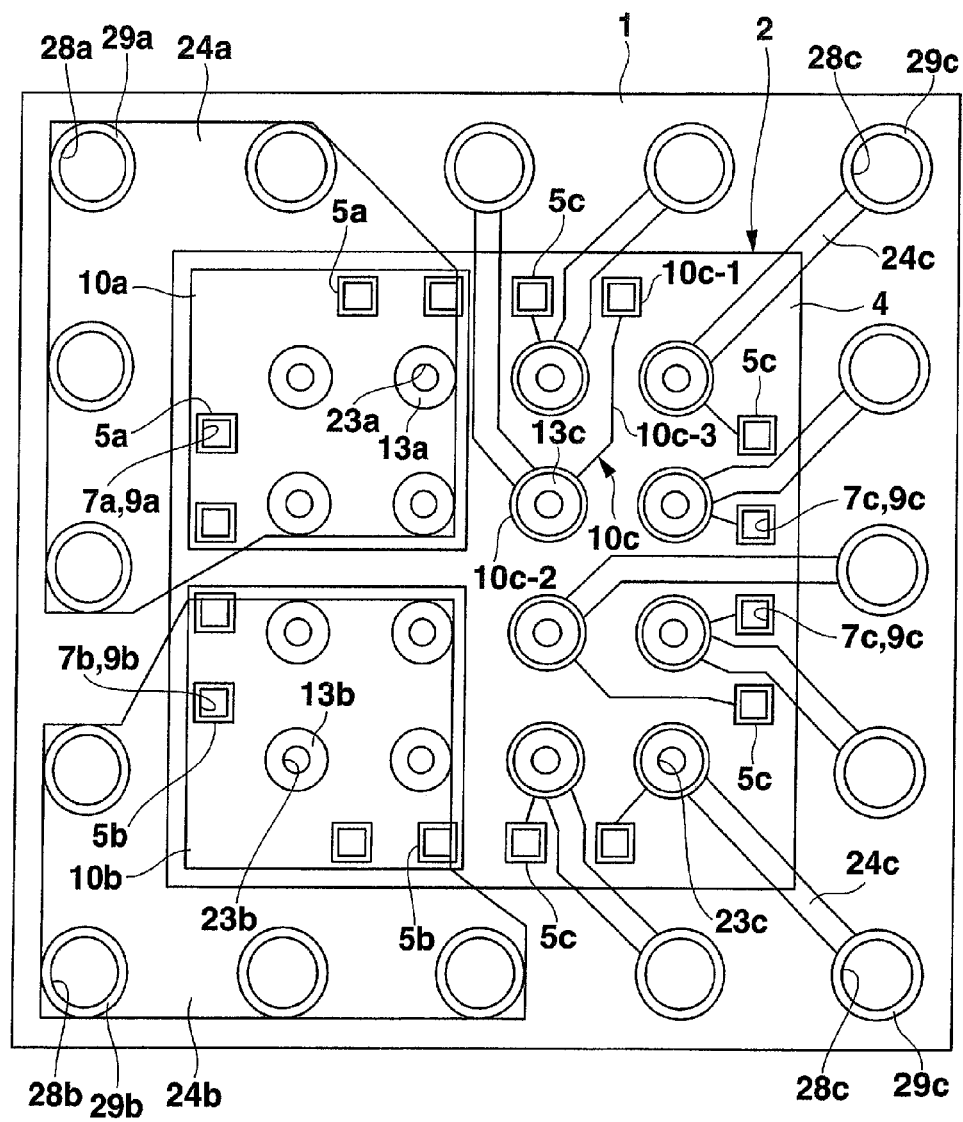
FIG. 58 is a transmitted plan view of a semiconductor device according to a fifth embodiment of the invention.
Figure 59:
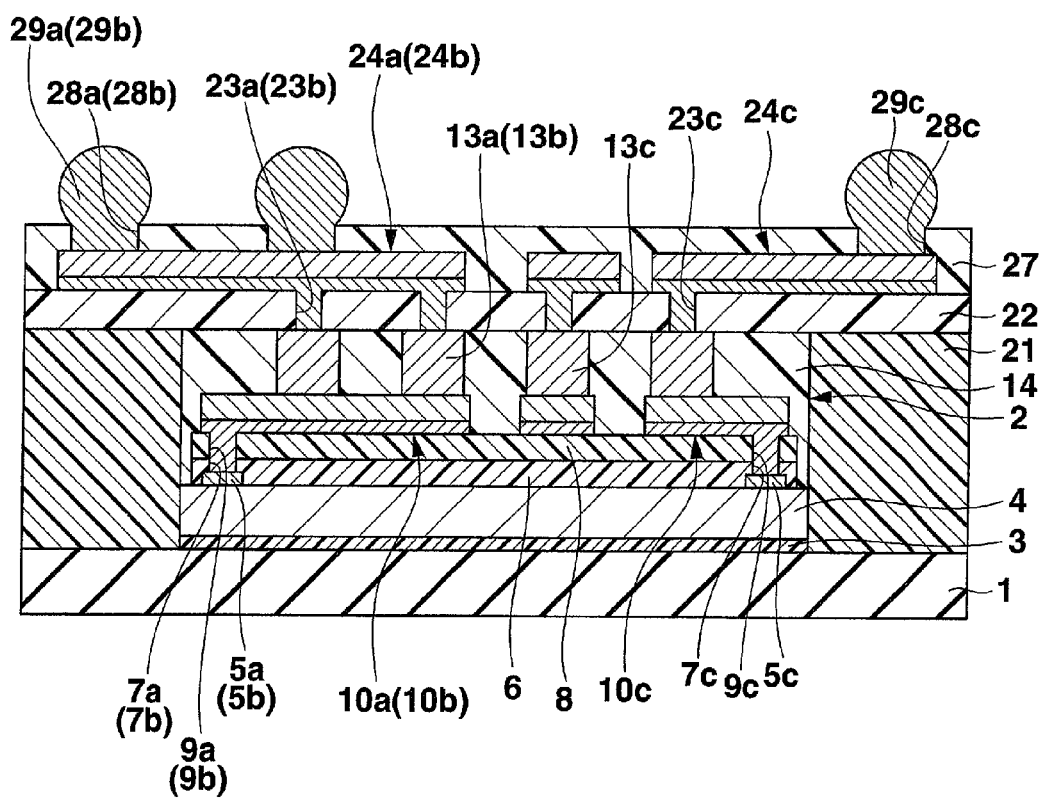
FIG. 59 is a sectional view of a proper part of the semiconductor device shown in FIG. 58.

FIG. 58 shows a transmitted plan view of a semiconductor device according to a fifth embodiment of the invention. FIG. 59 shows a sectional view of a proper part of the semiconductor device shown in FIG. 58. This semiconductor device is different from the semiconductor device shown in FIG. 40 and FIG. 41 in that a solidly-formed power supply voltage upper wiring 24a and a solidly-formed ground voltage upper wiring 24b are provided instead of the above-mentioned power supply voltage upper wiring 24a and the ground voltage upper wiring 24b. The power supply voltage upper wiring 24a is provided in a region that includes four power supply voltage columnar electrodes 13a and includes places where four power supply voltage solder balls 29a are arranged. The ground voltage upper wiring 24b is provided in a region that includes four ground voltage columnar electrodes 13b and includes places where four ground voltage solder balls 29b are arranged.

As described above, since the power supply voltage upper wiring 24a and the ground voltage upper wiring 24b are solidly formed in this semiconductor device, the upper wirings 24a, 24b can be reduced in resistance, and current capacity can thus be improved, as compared with the semiconductor device shown in FIG. 40 and FIG. 41.

Sixth Embodiment

Figure 60:
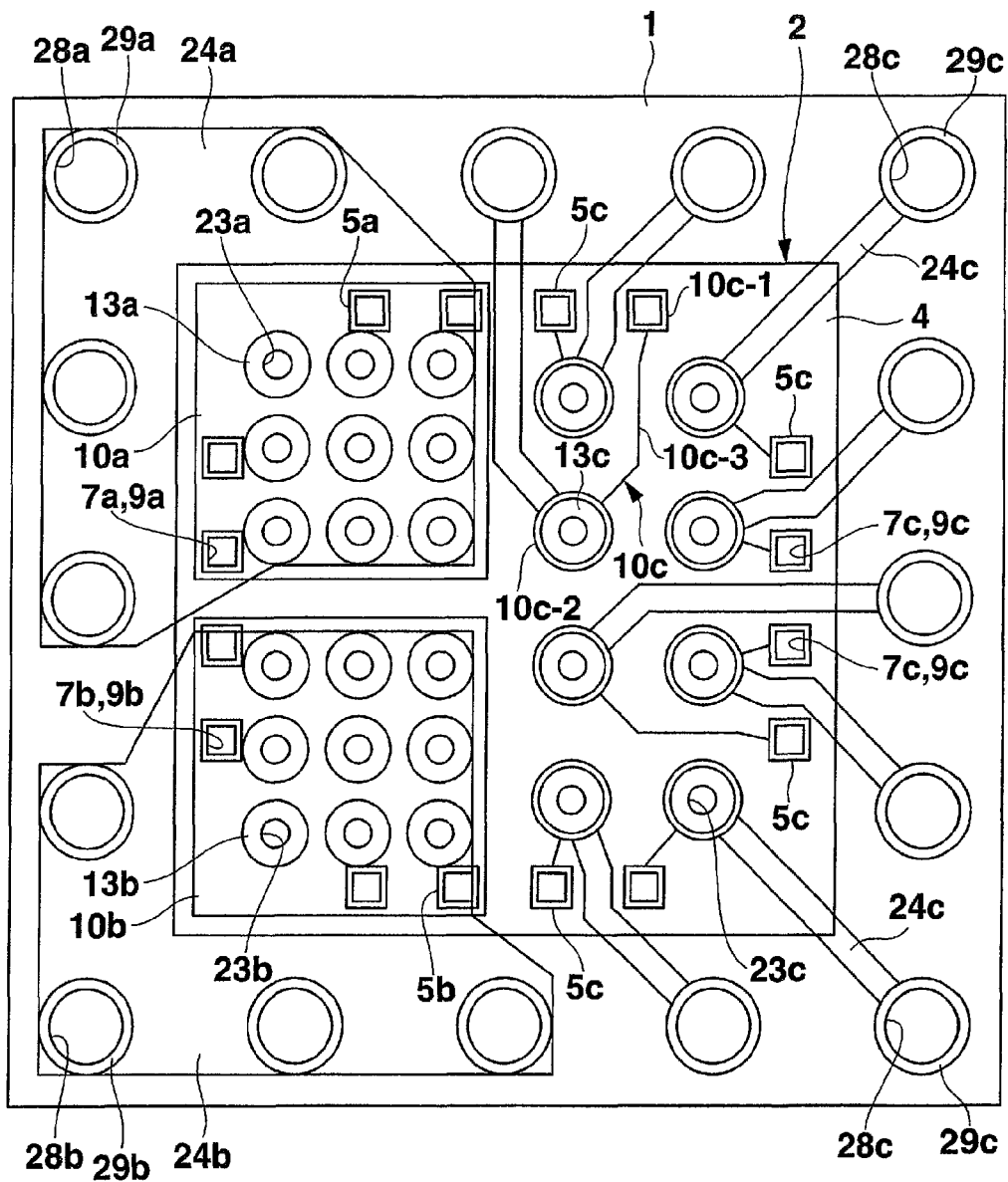
FIG. 60 is a transmitted plan view of a semiconductor device according to a sixth embodiment of the invention.

FIG. 60 shows a transmitted plan view of a semiconductor device according to a sixth embodiment of the invention. This semiconductor device is different from the semiconductor device shown in FIG. 58 in that nine power supply voltage columnar electrodes 13a are provided in matrix form on the upper surface of a solidly-formed power supply voltage upper wiring 24a and in that nine ground voltage columnar electrodes 13b are provided in matrix form on the upper surface of a solidly-formed ground voltage upper wiring 24b.

Thus, since this semiconductor device has nine power supply voltage columnar electrodes 13a and nine ground voltage columnar electrodes 13b, the parts corresponding to the columnar electrodes 13a, 13b can be reduced in resistance as a whole, and current capacity can thus be improved, as compared with the semiconductor device shown in FIG. 58 and FIG. 59. In this case, the pitch of the columnar electrodes 13a, 13b is, by way of example, 0.25.

Seventh Embodiment

Figure 61:
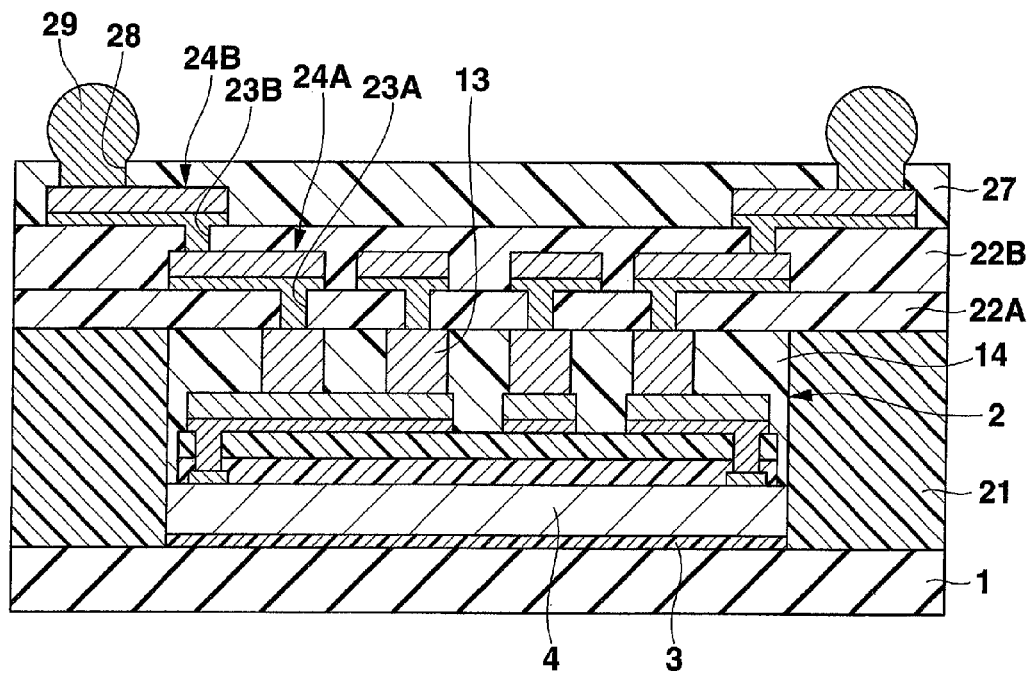
FIG. 61 is a sectional view of a semiconductor device according to a seventh embodiment of the invention.

FIG. 61 shows a sectional view of a semiconductor device according to a seventh embodiment of the invention. This semiconductor device is greatly different from the semiconductor device shown in FIG. 41 in that two upper insulating films and two upper wirings are provided. That is, on the upper surface of a first upper insulating film 22A including a first upper wiring 24A, a second upper insulating film 22B made of the same material as the first upper insulating film 22A is provided. On the upper surface of the second upper insulating film 22B, a second upper insulating film 24B similar in structure to the first upper wiring 24A is provided.

One end of the first upper wiring 24A is connected to a columnar electrode 13 via an opening 23A of the first upper insulating film 22A. One end of the second upper insulating film 24B is connected to the connection pad portion of the first upper wiring 24A via an opening 23B of the second upper insulating film 22B. A solder ball 29 is connected to the connection pad portion of the second upper insulating film 24B via an opening 28 of an overcoat film 27. In addition, three or more upper insulating films and three or more upper wirings may be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:
  preparing a semiconductor wafer, wherein (i) integrated circuits are formed on an upper surface of the semiconductor wafer, (ii) connection pads which are connected to the integrated circuits are provided on the semiconductor wafer, the connection pads comprising common power supply voltage connection pads, common ground voltage connection pads, and normal voltage connection pads, (iii) a passivation film is formed on the upper surface of the semiconductor wafer, the passivation film having openings in regions corresponding to the connection pads, (iv) and a protection film is formed directly on an upper surface of the passivation film, the protection film having openings in regions corresponding to the connection pads;
  forming at least one first common wiring serving for a power supply voltage and provided solidly and directly on an upper surface of the protection film so as to be connected to the common power supply voltage connection pads via corresponding openings in the protection film and the passivation film;
  forming at least one second common wiring serving for a ground voltage and provided solidly and directly on the upper surface of the protection film so as to be connected to the common ground voltage connection pads via corresponding openings in the protection film and the passivation film;
  forming at least two normal wirings each provided directly on the upper surface of the protection film so as to be connected to a normal voltage connection pad among the normal voltage connection pads via a corresponding opening in the protection film and the passivation film; and
  cutting the semiconductor wafer along dicing streets, thereby obtaining a plurality of semiconductor devices.

2. The semiconductor device manufacturing method according to claim 1, further comprising:
  forming (i) at least one first electrode on the at least one first common wiring; (ii) at least one second electrode on the at least one second common wiring; and (iii) at least two third electrodes each provided on connection pad portions of the at least two normal wirings, respectively,
  wherein the first, second, and third electrodes have a substantially same shape.

3. The semiconductor device manufacturing method according to claim 2, wherein at least one of:
  (i) forming the at least one first electrode comprises forming at least two first electrodes, and a distance between the first electrodes is smaller than a distance between any two adjacent third electrodes, and
  (ii) forming the at least one second electrode comprises forming at least two second electrodes, and a distance between the second electrodes is smaller than the distance between any two adjacent third electrodes.

4. The semiconductor device manufacturing method according to claim 2, wherein a total number of the common power supply voltage connection pads and the common ground voltage connection pads is not less than a total number of the normal voltage connection pads, and
  wherein a total number of the first and second electrodes provided on the first and second common wirings is more than a total number of the third electrodes provided on the normal wirings.

5. The semiconductor device manufacturing method according to claim 2, further comprising:
  forming an upper insulating film having at least one first opening in a part corresponding to the first electrode, at least one second opening in a part corresponding to the second electrode, and at least two third openings in parts corresponding to the third electrodes; and
  forming at least one first upper wiring provided to be connected to the first electrode via the first opening, at least one second upper wiring provided to be connected to the second electrode via the second opening, and at least two third upper wirings provided to be connected to the third electrodes via the third openings.

6. The semiconductor device manufacturing method according to claim 5, wherein at least one of the first upper wiring serving for a power supply voltage and the second upper wiring serving for ground voltage is solidly formed.

7. The semiconductor device manufacturing method according to claim 5, wherein a total number of the first and second electrodes provided on the first and second common wirings is more than a total number of the third electrodes provided on the normal wirings.

8. The semiconductor device manufacturing method according to claim 5, wherein the at least two normal wirings are formed to have a line width of 20 μm or less; and
  wherein the first, second, and third upper wirings are formed to have a relatively greater line width than the at least two normal wirings.

9. The semiconductor device manufacturing method according to claim 5, wherein forming the first upper wiring, the second upper wiring, and the third upper wirings includes:
  forming a foundation metal layer on an entire upper surface of the upper insulating film by at least one of electroless plating and sputtering;
  forming a patterned plating resist film on an upper surface of the foundation metal layer;
  forming upper metal layers on the upper surface of the foundation metal layer within openings in the plating resist by electrolytic plating with copper using the foundation metal layer as a plating path;
  releasing the plating resist film; and
  etching and removing the foundation metal layer located in parts other than parts under the upper metal layers using the upper metal layers as masks.

10. The semiconductor device manufacturing method according to claim 1, further comprising:
  forming (i) at least one first electrode on the at least one first common wiring; (ii) at least one second electrode on the at least one second common wiring; and (iii) at least two third electrodes each provided on connection pad portions of the at least two normal wirings, respectively,
  wherein at least one of the first electrode and the second electrode is solidly formed on the corresponding one of the at least one first common wiring and the at least one second common wiring.

11. The semiconductor device manufacturing method according to claim 1, wherein the at least two normal wirings are formed to have a line width of 20 μm or less.

12. The semiconductor device manufacturing method according to claim 1, wherein at least one of:
  (i) at least a part of the at least one first common wiring is formed in a square planar shape; and
  (ii) at least a part of the at least one second common wiring is formed in a square planar shape.

13. The semiconductor device manufacturing method according to claim 1,
  wherein forming the at least one first common wiring, forming the at least one second common wiring, and forming the at least two normal wirings comprises:
  forming a foundation metal layer on the entire upper surface of the protective film by at least one of electroless plating and sputtering;
  forming a patterned plating resist film on an upper surface of the foundation metal layer;
  forming upper metal layers of the first common wiring, the second common wiring and the normal wirings on the upper surface of the foundation metal layer within openings in the plating resist film by electrolytic plating using the foundation metal layer as a plating current path,
  releasing the plating resist film, and
  etching and removing the foundation metal layer located in parts other than parts under the upper metal layers using the upper metal layers as masks.

14. A semiconductor device manufacturing method comprising:
  arranging semiconductor constructs apart from each other, each of which includes: (i) a semiconductor substrate; (ii) integrated circuits formed on an upper surface of the semiconductor substrate; (iii) connection pads which are connected to the integrated circuits provided on the semiconductor substrate, the connection pads comprising common power supply voltage connection pads, common ground voltage connection pads, and normal voltage connection pads; and (iv) an insulating film formed on the semiconductor substrate;
  forming an insulating layer around the semiconductor constructs;
  forming an upper insulating film on upper surfaces of the semiconductor constructs and the insulating layer;
  forming at least one first common wiring serving for a power supply voltage and provided solidly and directly on an upper surface of the upper insulating film so as to be connected to the common power supply voltage connection pads via corresponding openings in the upper insulating film and the insulating film;
  forming at least one second common wiring serving for a ground voltage and provided solidly and directly on the upper surface of the upper insulating film so as to be connected to the common ground voltage connection pads via corresponding openings in the upper insulating film and the insulating film;
  forming at least two normal wirings each provided directly on the upper surface of the upper insulating film so as to be connected to a normal voltage connection pad among the normal voltage connection pads via a corresponding opening in the upper insulating film and the insulating film; and
  cutting along cut lines between adjacent ones of semiconductor constructs, thereby obtaining a plurality of semiconductor devices.

15. The semiconductor device manufacturing method according to claim 14, further comprising:
  forming an overcoat film on the upper surface of the upper insulating film including the first common wiring, the second common wiring, and the two normal wirings, the overcoat film having openings which are formed in parts corresponding to predetermined points;
  wherein at least one of the openings in the overcoat film is formed over the insulating layer formed around the semiconductor construct at a portion which corresponds to the connection pad portion of at least one of the first common wiring, the second common wiring, and one of the two normal wirings.

16. The semiconductor device manufacturing method according to claim 14, further comprising:
  forming an overcoat film on the upper surface of the upper insulating film including the first common wiring, the second common wiring, and the two normal wirings, the overcoat film having openings which are formed in parts corresponding to predetermined points; and
  forming solder balls above the openings of the overcoat film,
  wherein a total number of the common power supply voltage connection pads and the common ground voltage connection pads is not less than a total number of the normal voltage connection pads, and wherein the solder balls are provided on the first common wiring, the second common wiring, and the normal common wirings, and a total number of the solder balls provided on the first and second common wirings is not less than a total number of the solder balls provided on the normal wirings.

17. The semiconductor device manufacturing method according to claim 14, wherein forming the first common wiring, forming the second common wiring, and forming the normal wirings includes:

forming a foundation metal layer on the entire upper surface of the upper insulating film by at least one of electroless plating and sputtering;

forming a patterned plating resist film on the upper surface of the foundation metal layer;

forming upper metal layers on the upper surface of the foundation metal layer within openings in the plating resist film by electrolytic plating with copper using the foundation metal layer as a plating path;

releasing the plating resist film, and etching and removing the foundation metal layer located in parts other than parts under the upper metal layers using the upper metal layer as masks.

* * * * *